US011950414B2

(12) United States Patent
Uchimura et al.

(10) Patent No.: US 11,950,414 B2
(45) Date of Patent: Apr. 2, 2024

(54) MEMORY DEVICE

(71) Applicant: Kioxia Corporation, Tokyo (JP)

(72) Inventors: Yasuhiro Uchimura, Yokkaichi (JP);
Tatsufumi Hamada, Nagoya (JP);
Shinichi Sotome, Yokkaichi (JP);
Tomohiro Kuki, Yokkaichi (JP);
Yasunori Oshima, Yokkaichi (JP);
Osamu Arisumi, Kuwana (JP)

(73) Assignee: Kioxia Corporation, Tokyo (JP)

( * ) Notice: Subject to any disclaimer, the term of this patent is extended or adjusted under 35 U.S.C. 154(b) by 682 days.

(21) Appl. No.: 17/106,667

(22) Filed: Nov. 30, 2020

(65) Prior Publication Data

US 2021/0082940 A1 Mar. 18, 2021

Related U.S. Application Data

(63) Continuation of application No. PCT/JP2018/044241, filed on Nov. 30, 2018.

(30) Foreign Application Priority Data

Jun. 19, 2018 (JP) .................................. 2018-116376

(51) Int. Cl.
*H10B 43/10* (2023.01)
*G11C 11/56* (2006.01)
(Continued)

(52) U.S. Cl.
CPC .......... *H10B 43/10* (2023.02); *G11C 11/5642* (2013.01); *G11C 16/08* (2013.01);
(Continued)

(58) Field of Classification Search
CPC ........ H10B 43/10; H10B 43/35; H10B 43/27; G11C 11/5642; G11C 16/08; G11C 16/24
(Continued)

(56) References Cited

U.S. PATENT DOCUMENTS 8,748,300 B2 6/2014 Ishiduki et al.
2009/0267128 A1 10/2009 Maejima
(Continued)

FOREIGN PATENT DOCUMENTS

JP 2010-010596 A 1/2010
JP 2010-045314 A 2/2010
(Continued)

OTHER PUBLICATIONS

International Search Report dated Feb. 19, 2019 in PCT/JP2018/044241 filed on Nov. 30, 2018, 2 pages.

*Primary Examiner* — Igwe U Anya
(74) *Attorney, Agent, or Firm* — Oblon, McClelland, Maier & Neustadt, L.L.P.

(57) ABSTRACT

According to one embodiment, a memory device includes a substrate; a structure including a plurality of conductive layers stacked on the substrate; and a pillar arranged inside the structure and including a semiconductor layer that extends in a direction perpendicular to a surface of the substrate. The semiconductor layer includes a first portion on a side of an upper portion of the structure, and a second portion between the first portion and the substrate. The first portion has a thickness larger than a thickness of the second portion.

19 Claims, 42 Drawing Sheets

(51) Int. Cl.
*G11C 16/08* (2006.01)
*G11C 16/24* (2006.01)
*H10B 43/27* (2023.01)
*H10B 43/35* (2023.01)

(52) U.S. Cl.
CPC ............ *G11C 16/24* (2013.01); *H10B 43/27* (2023.02); *H10B 43/35* (2023.02)

(58) Field of Classification Search
USPC ........................................................ 257/432
See application file for complete search history.

(56) References Cited

U.S. PATENT DOCUMENTS

| | | |
|---|---|---|
| 2009/0268522 A1 | 10/2009 | Maejima |
| 2009/0321813 A1 | 12/2009 | Kidoh et al. |
| 2010/0038699 A1* | 2/2010 | Katsumata .......... H01L 29/7926 257/E21.409 |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0235221 A1 | 9/2012 | Ishiduki et al. |
| 2012/0307557 A1 | 12/2012 | Itagaki |
| 2014/0001544 A1 | 1/2014 | Sato et al. |
| 2014/0284693 A1* | 9/2014 | Sato .................... H01L 29/7926 438/287 |
| 2015/0249094 A1 | 9/2015 | Sato et al. |
| 2015/0270280 A1 | 9/2015 | Simsek-Ege et al. |
| 2017/0062459 A1 | 3/2017 | Yoshimizu et al. |
| 2017/0271345 A1 | 9/2017 | Shimura |
| 2017/0271349 A1 | 9/2017 | Miyagawa et al. |
| 2020/0098780 A1* | 3/2020 | Cui .................... H01L 29/4234 |

FOREIGN PATENT DOCUMENTS

| | | |
|---|---|---|
| JP | 2012-195424 A | 10/2012 |
| JP | 2014-011389 A | 1/2014 |
| JP | 2014-183304 A | 9/2014 |
| KR | 10-2017-0042453 A | 4/2017 |

* cited by examiner

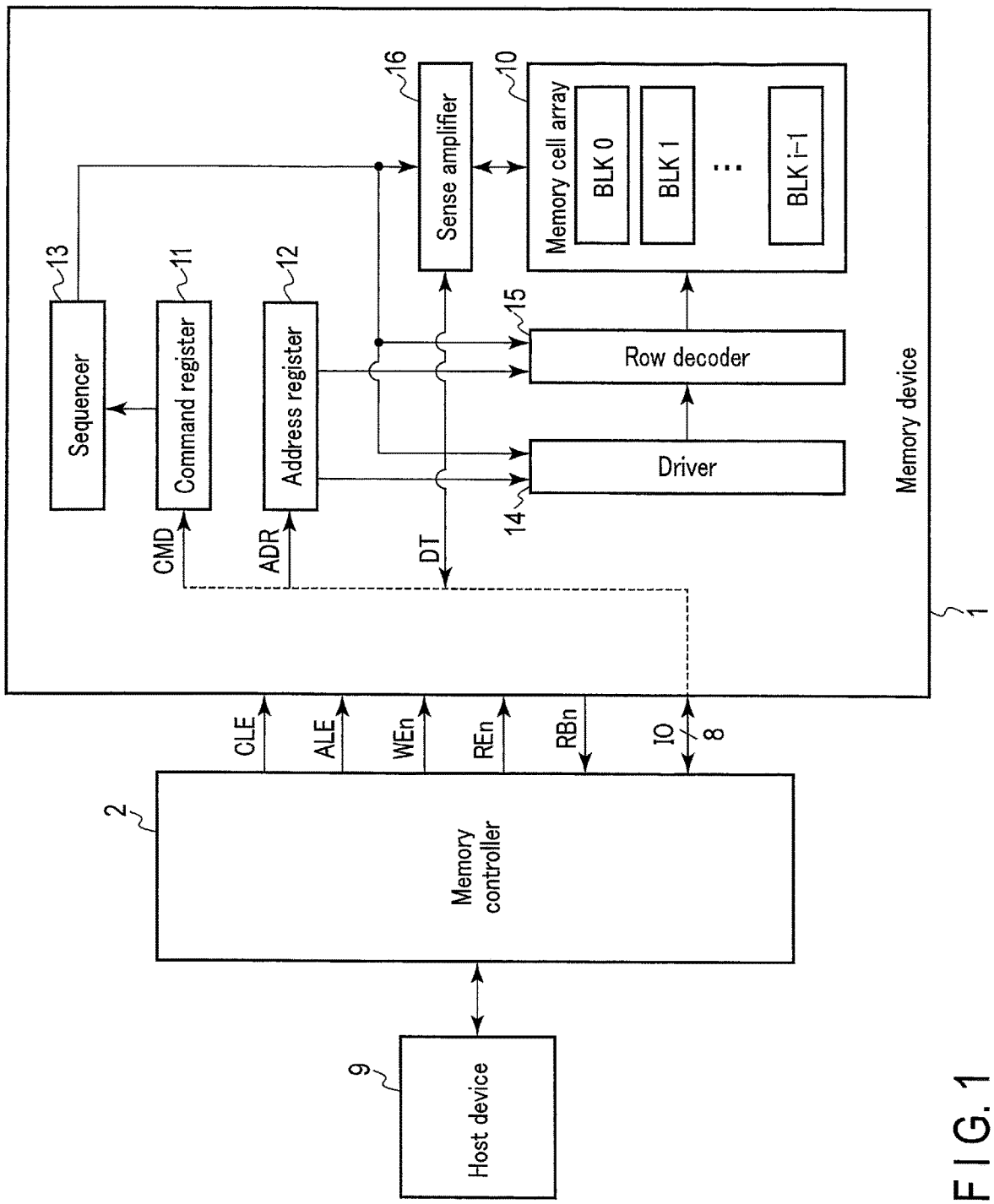
F I G. 1

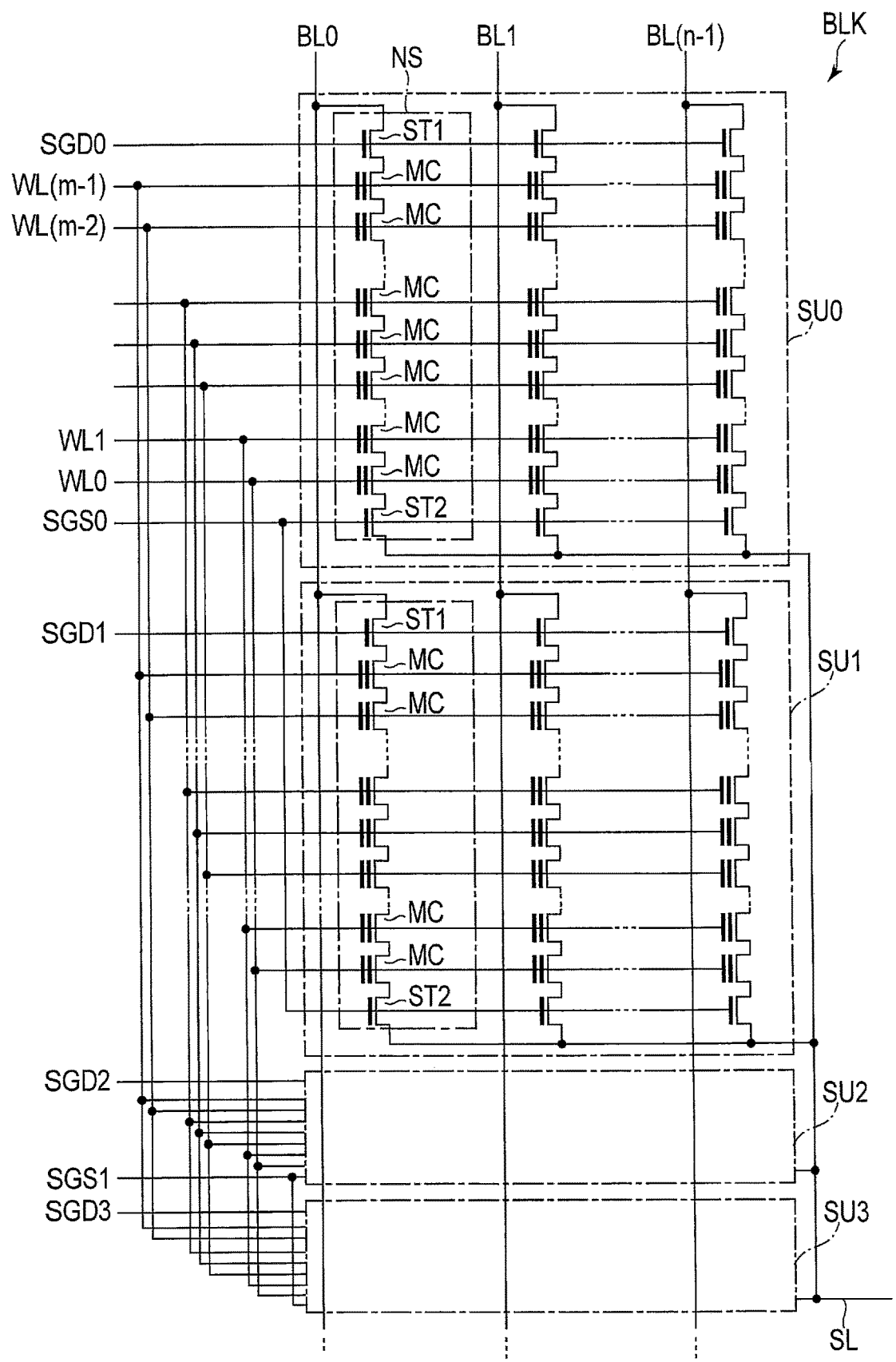
F I G. 2

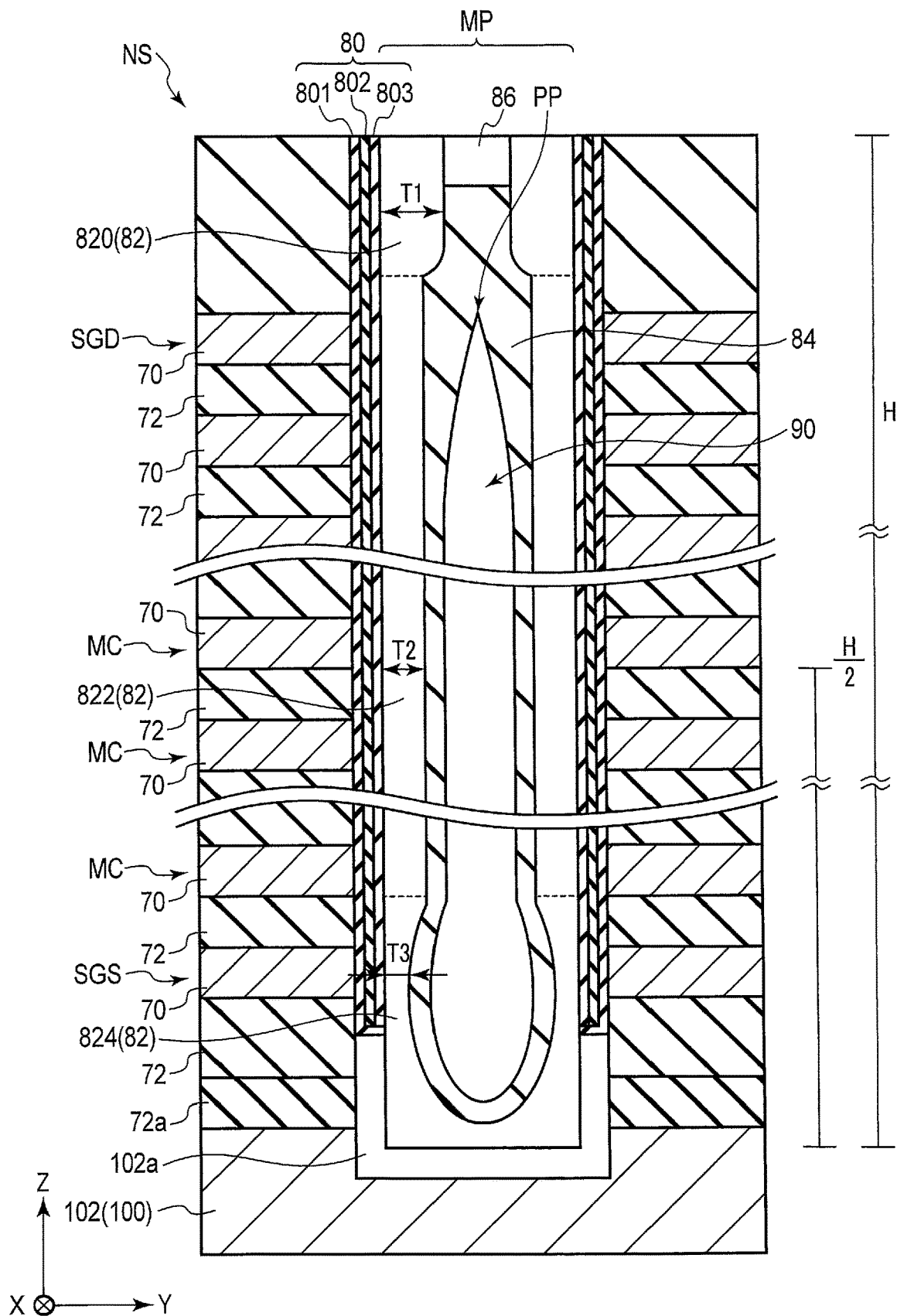
F I G. 6

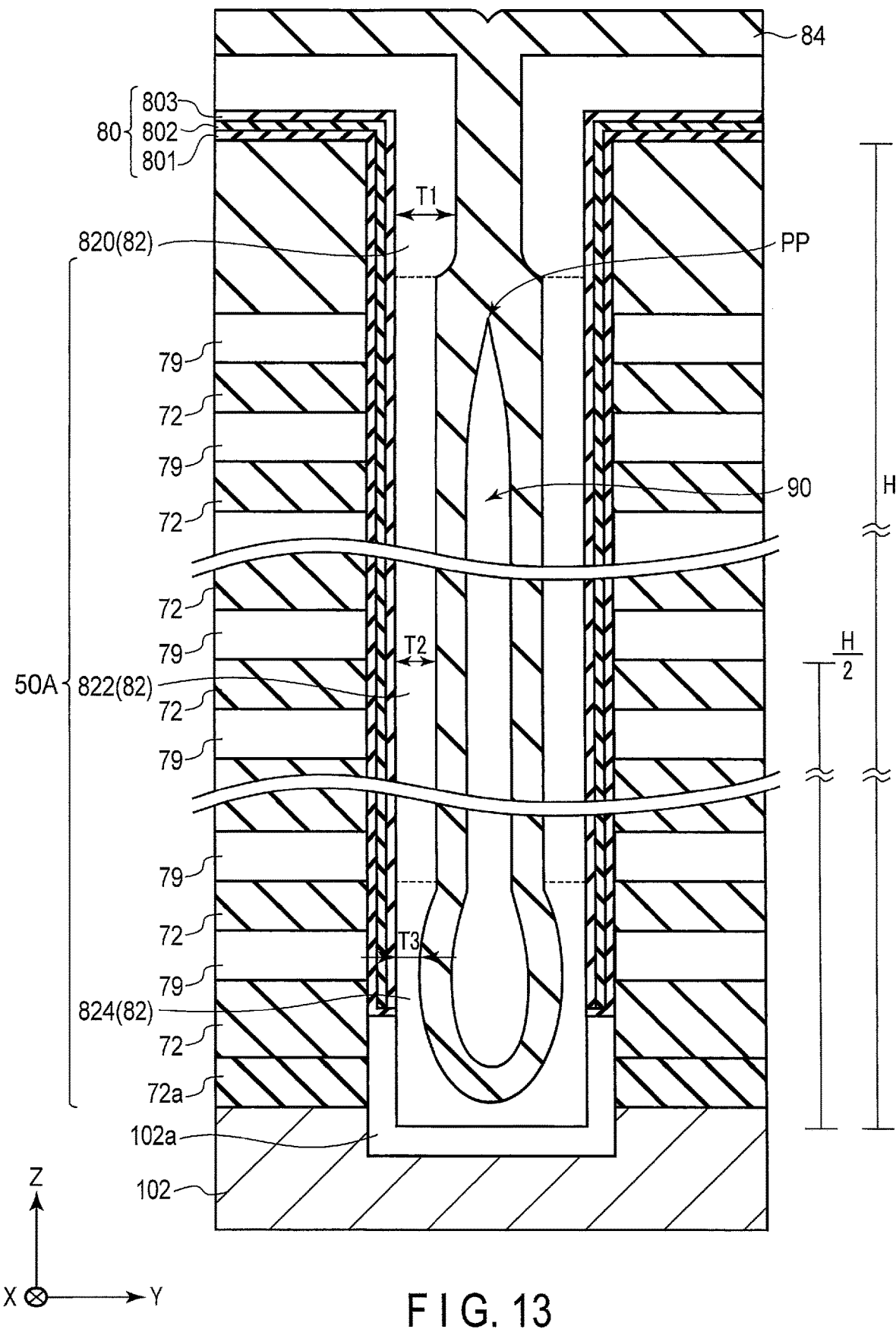
F I G. 13

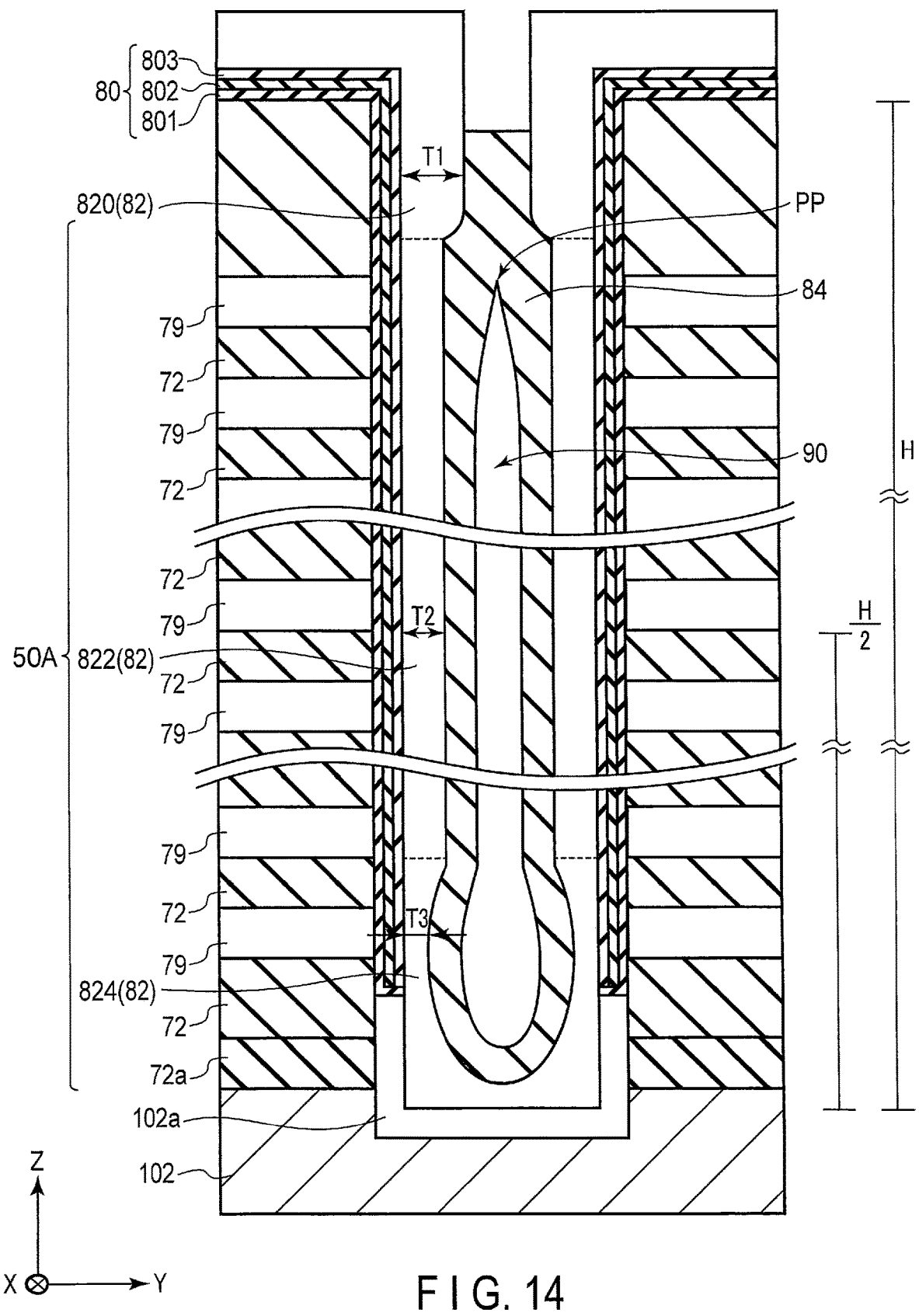
F I G. 14

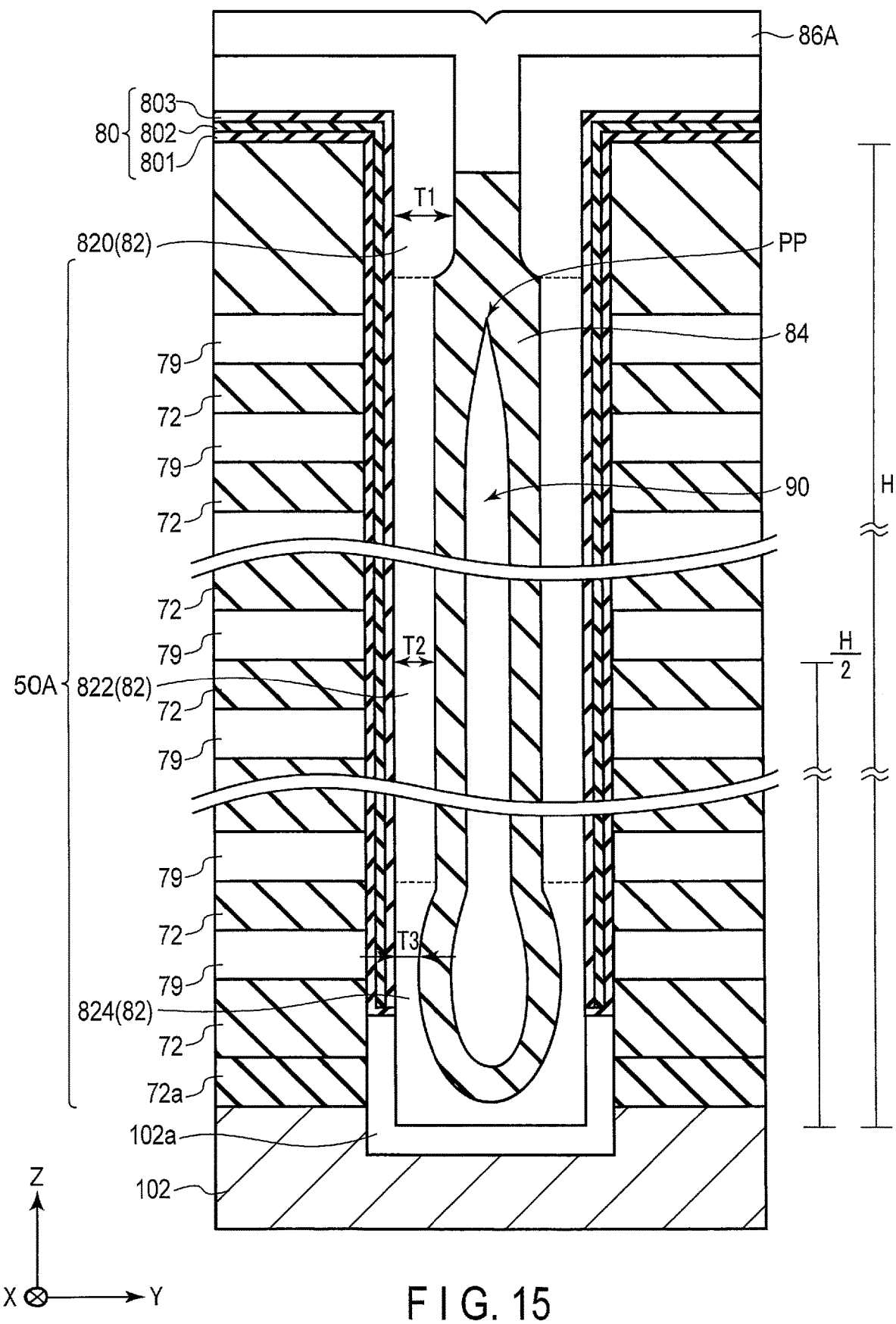
F I G. 15

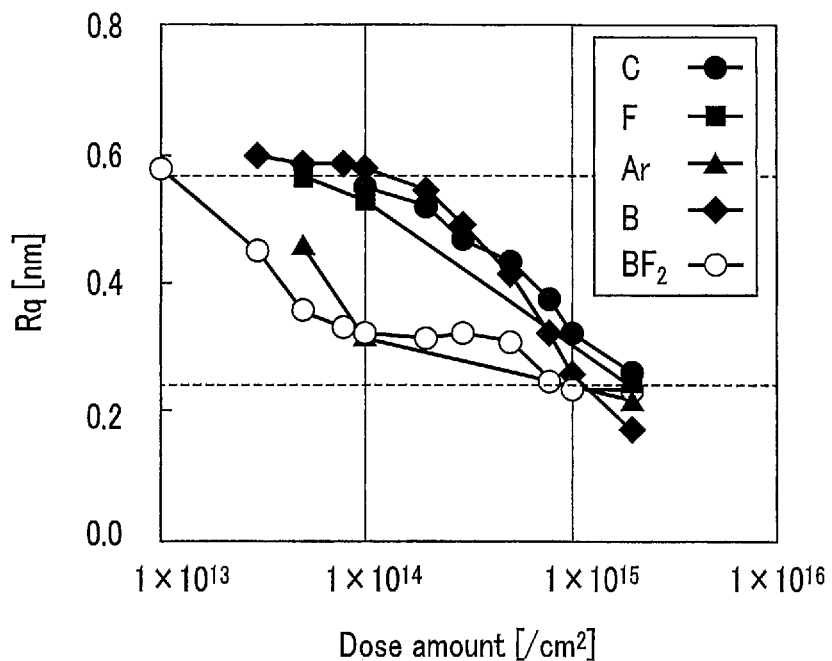
F I G. 17
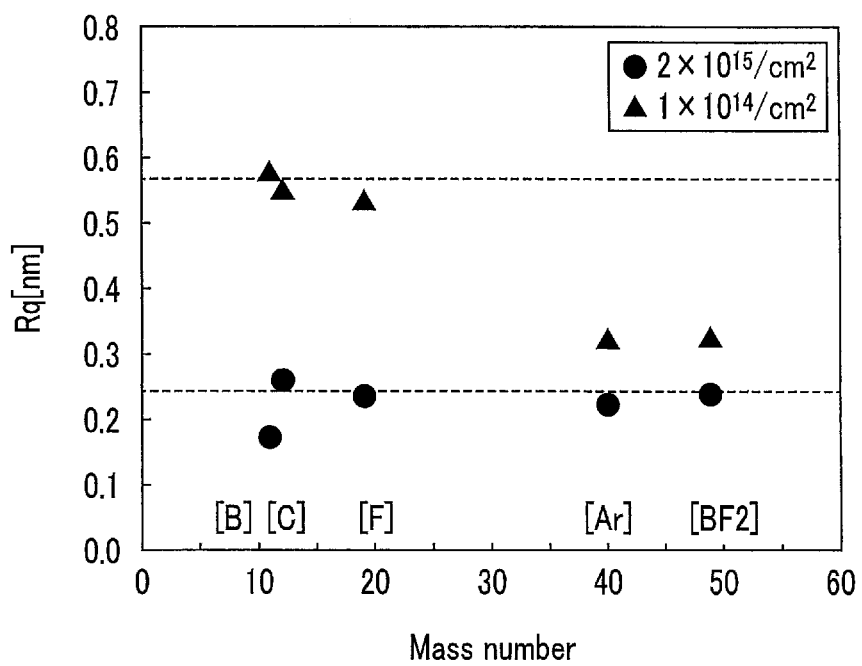
F I G. 18

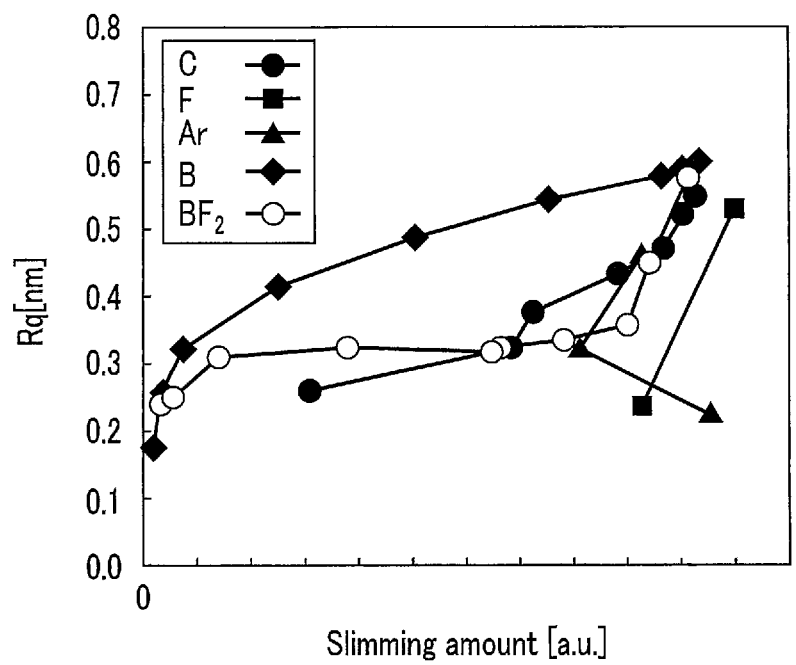
F I G. 19
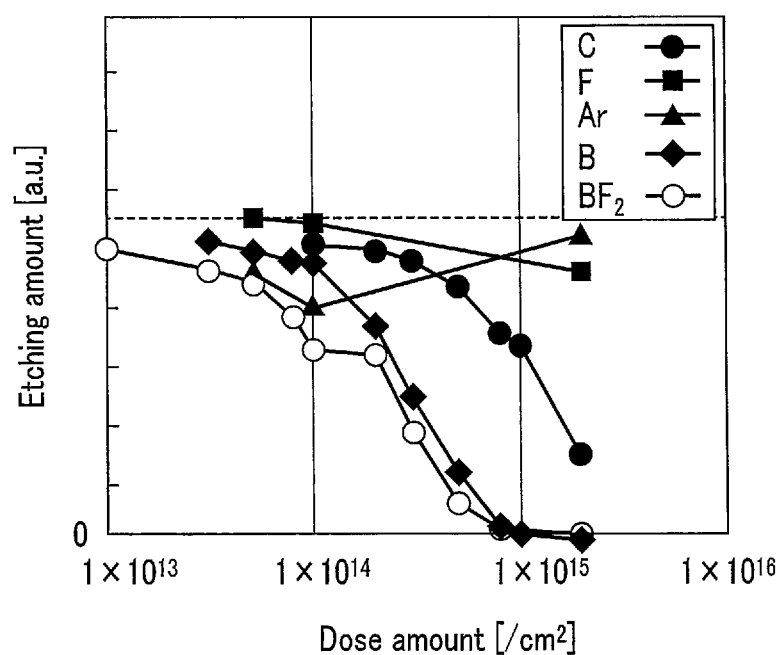
F I G. 20

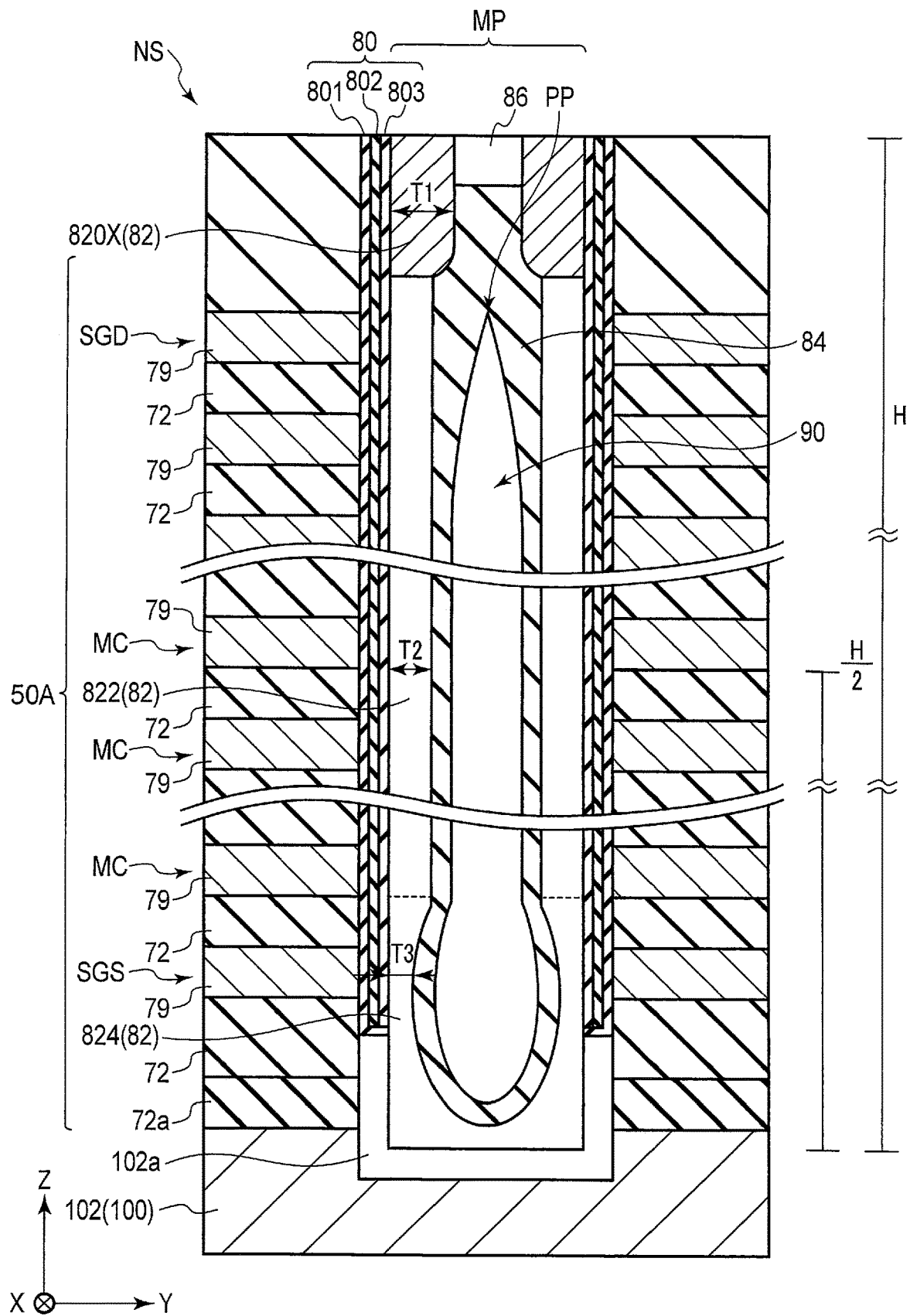
F I G. 21

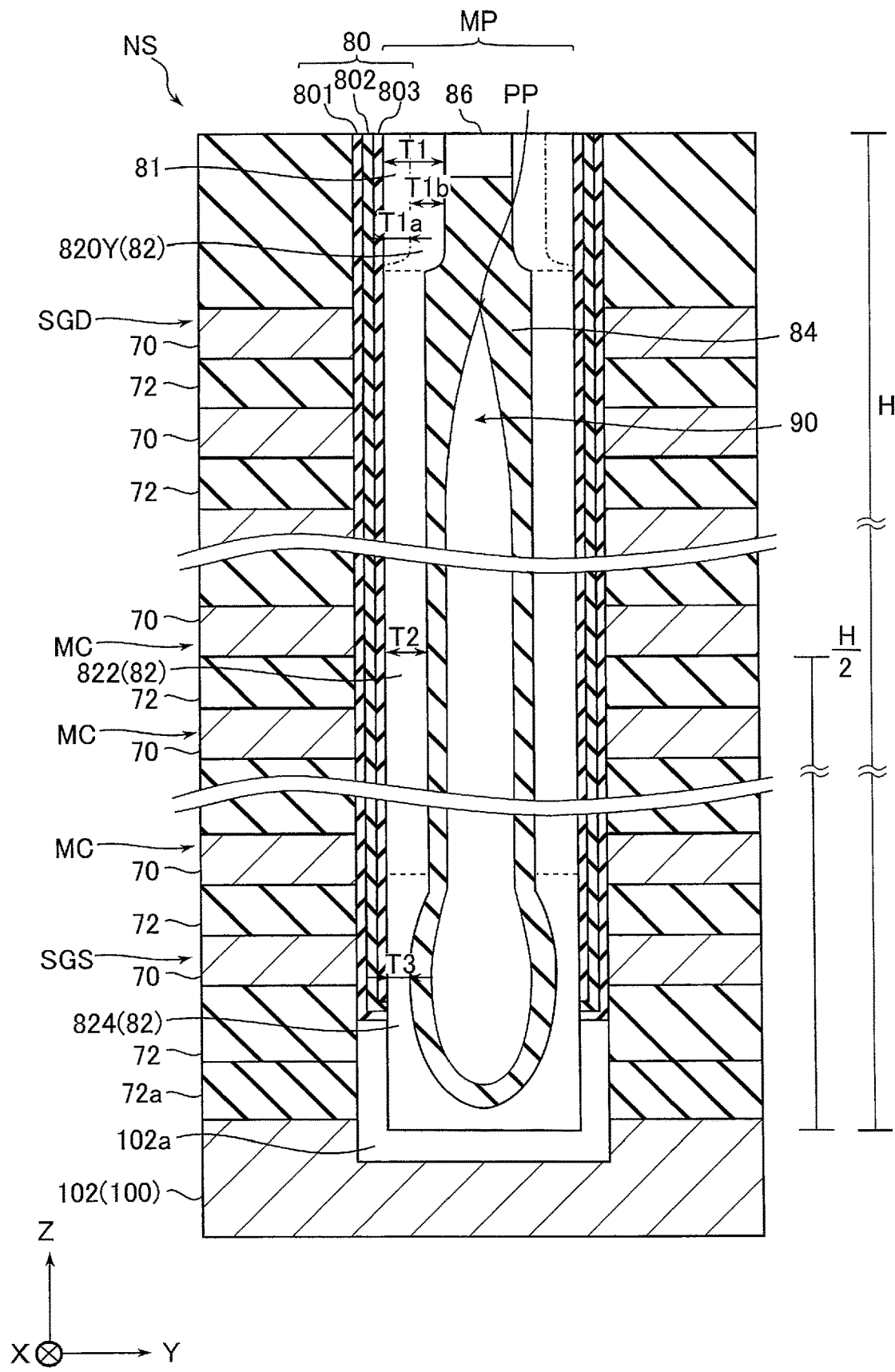
F I G. 26

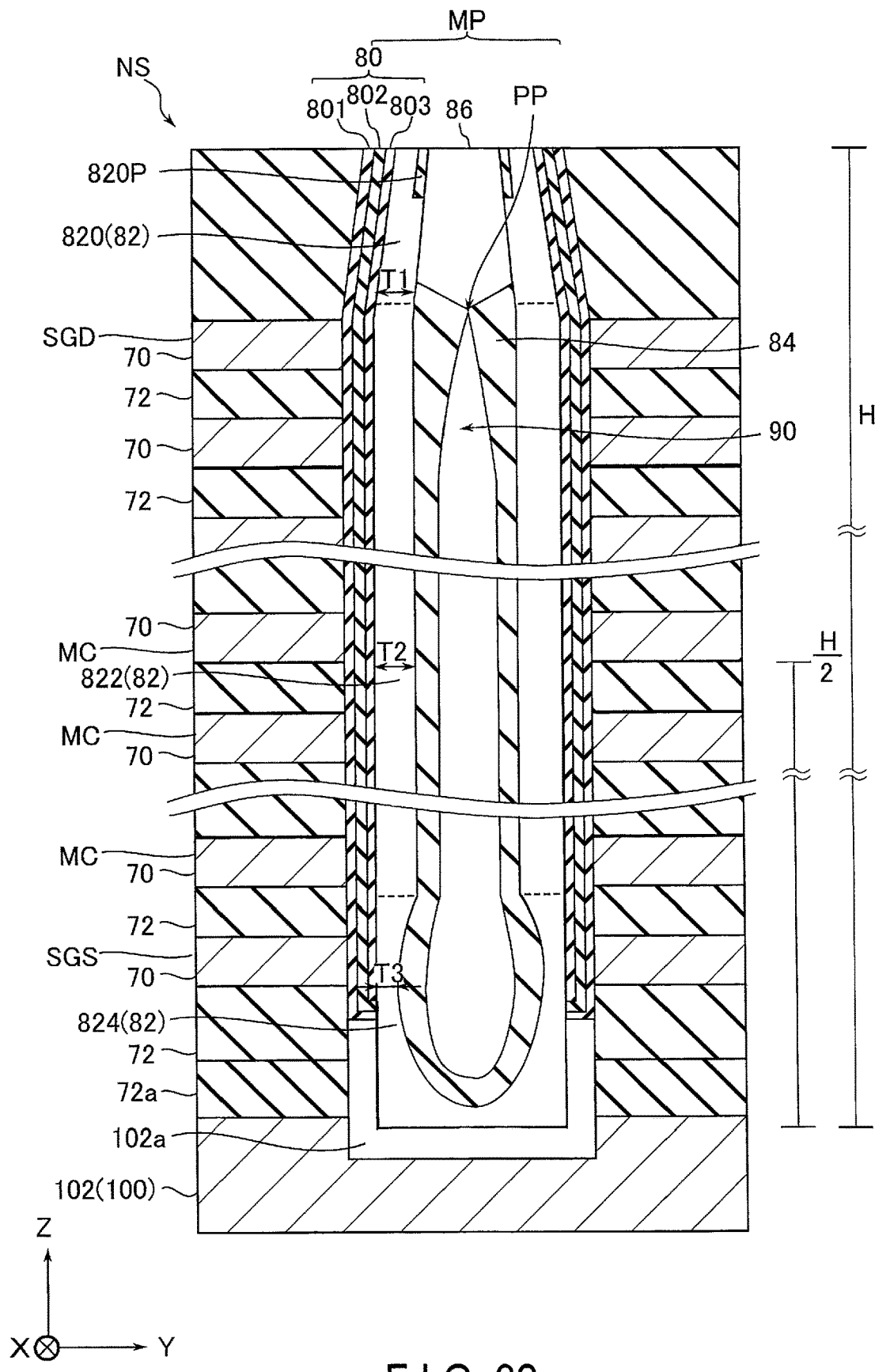
F I G. 32

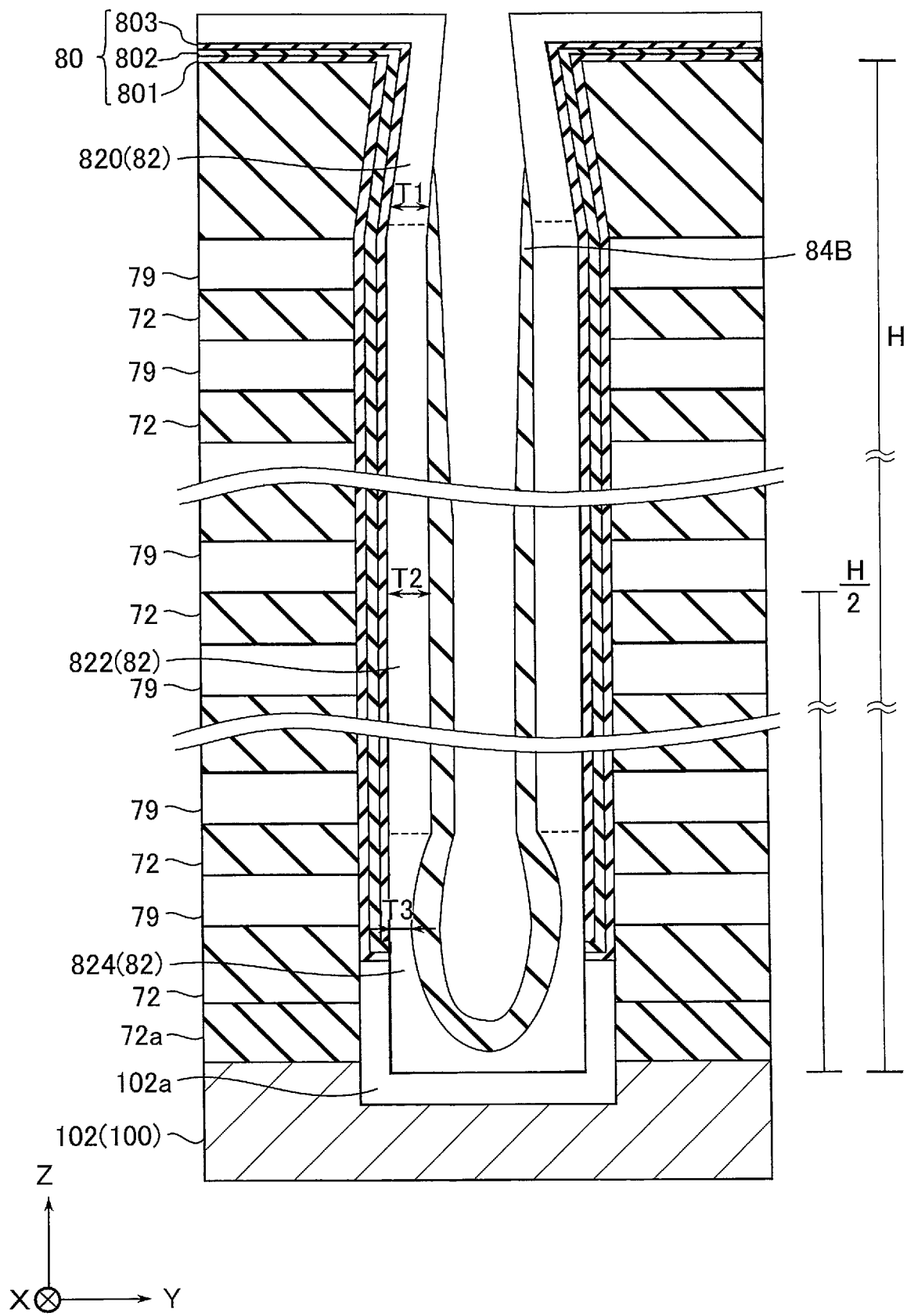
F I G. 34

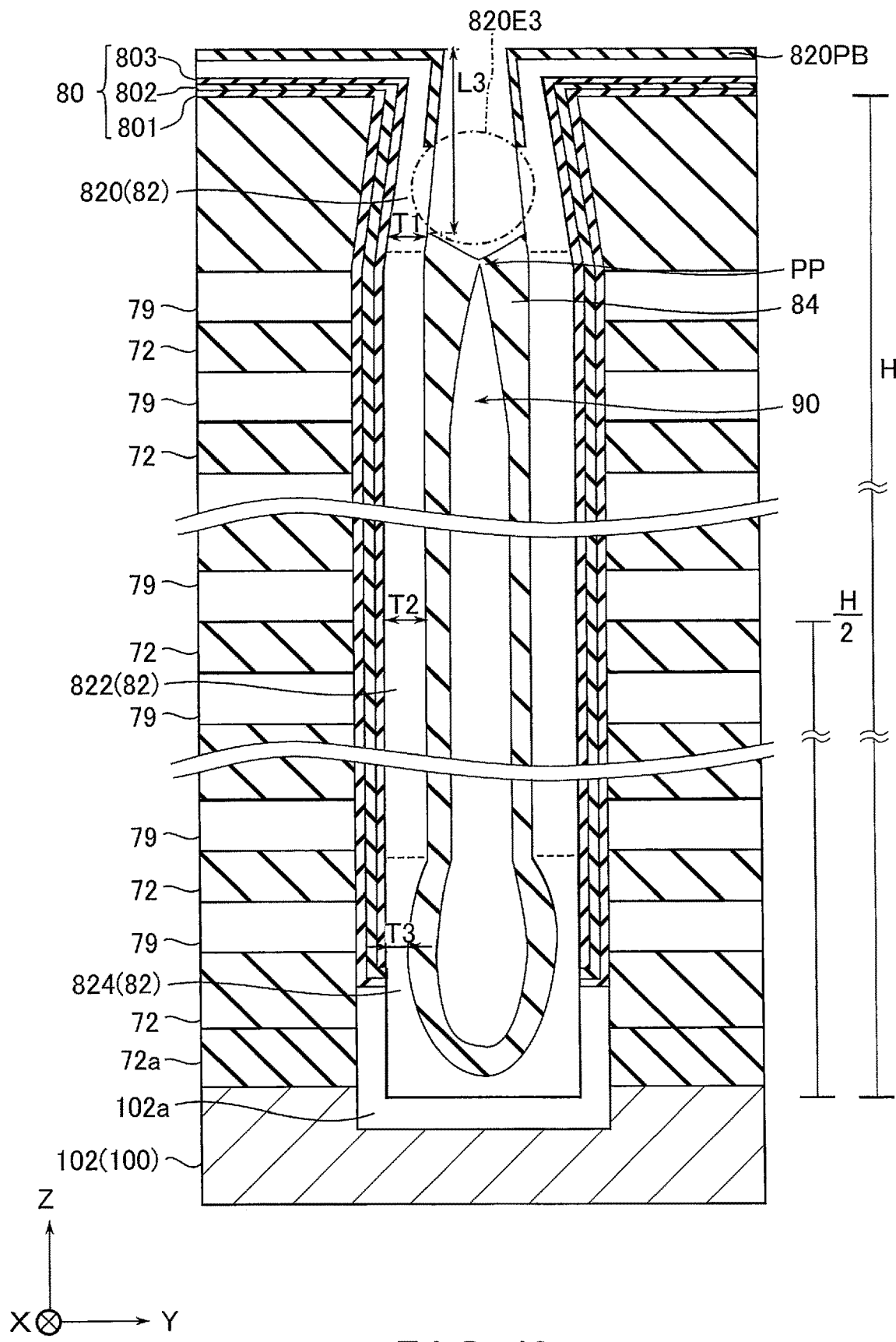
F I G. 40

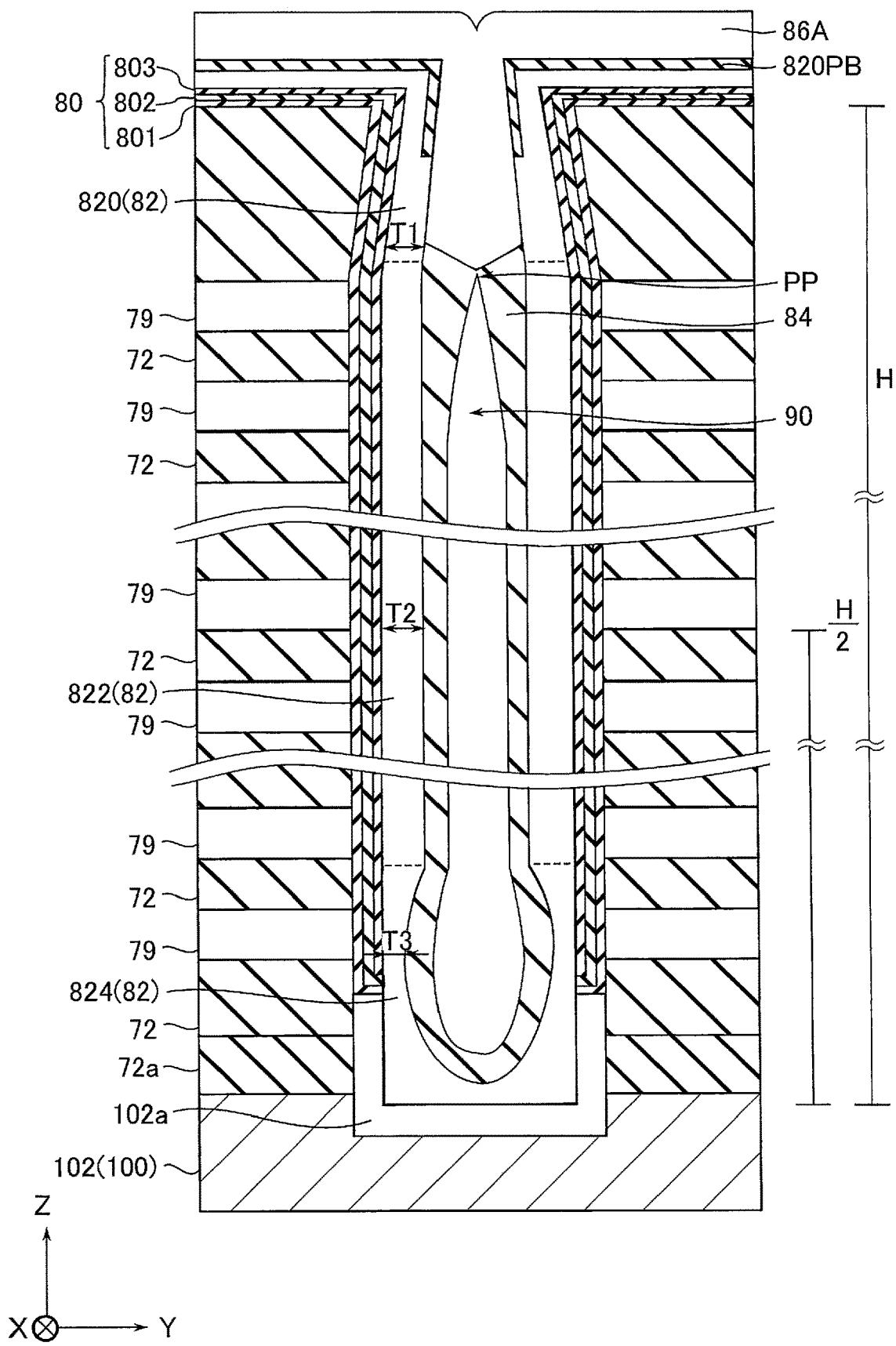
F I G. 41

MEMORY DEVICE

CROSS-REFERENCE TO RELATED APPLICATIONS

This application is a Continuation Application of PCT Application No. PCT/JP2018/044241, filed Nov. 30, 2018 and based upon and claiming the benefit of priority from Japanese Patent Application No. 2018-116376, filed Jun. 19, 2018, the entire contents of all of which are incorporated herein by reference.

FIELD

Embodiments described herein relate generally to a memory device.

BACKGROUND

NAND flash memories having a three-dimensional structure have been developed.

BRIEF DESCRIPTION OF THE DRAWINGS

FIG. 1 is a schematic diagram of an exemplary structure of a semiconductor device according to a first embodiment.

FIG. 2 is a plan view of an exemplary structure of the semiconductor device according to the first embodiment.

FIG. 6 is a cross-sectional process diagram showing a step of a method for manufacturing the semiconductor device according to the first embodiment.

FIG. 13 is a cross-sectional process diagram showing a step of the method for manufacturing the memory device according to the first embodiment.

FIG. 14 is a cross-sectional process diagram showing a step of the method for manufacturing the memory device according to the first embodiment.

FIG. 15 is a cross-sectional process diagram showing a step of the method for manufacturing the memory device according to the first embodiment.

FIG. 17 is a diagram showing a result of experiments conducted upon the memory device according to the first embodiment.

FIG. 18 is a diagram showing a result of experiments conducted upon the memory device according to the first embodiment.

FIG. 19 is a diagram showing a result of experiments conducted upon the memory device according to the first embodiment.

FIG. 20 is a diagram showing a result of experiments conducted upon the memory device according to the first embodiment.

FIG. 21 is a cross-sectional view of an exemplary structure of a memory device according to a second embodiment.

FIG. 26 is a cross-sectional view of an exemplary structure of a memory device according to a third embodiment.

FIG. 32 is a cross-sectional view of an exemplary structure of a memory device according to a fourth embodiment.

FIG. 34 is a cross-sectional process diagram showing a step of the method for manufacturing the memory device according to the fourth embodiment.

FIG. 40 is a cross-sectional process diagram showing a step of the method for manufacturing the memory device according to the fourth embodiment.

FIG. 41 is a cross-sectional process diagram showing a step of the method for manufacturing the memory device according to the fourth embodiment.

DETAILED DESCRIPTION

Figure 3:
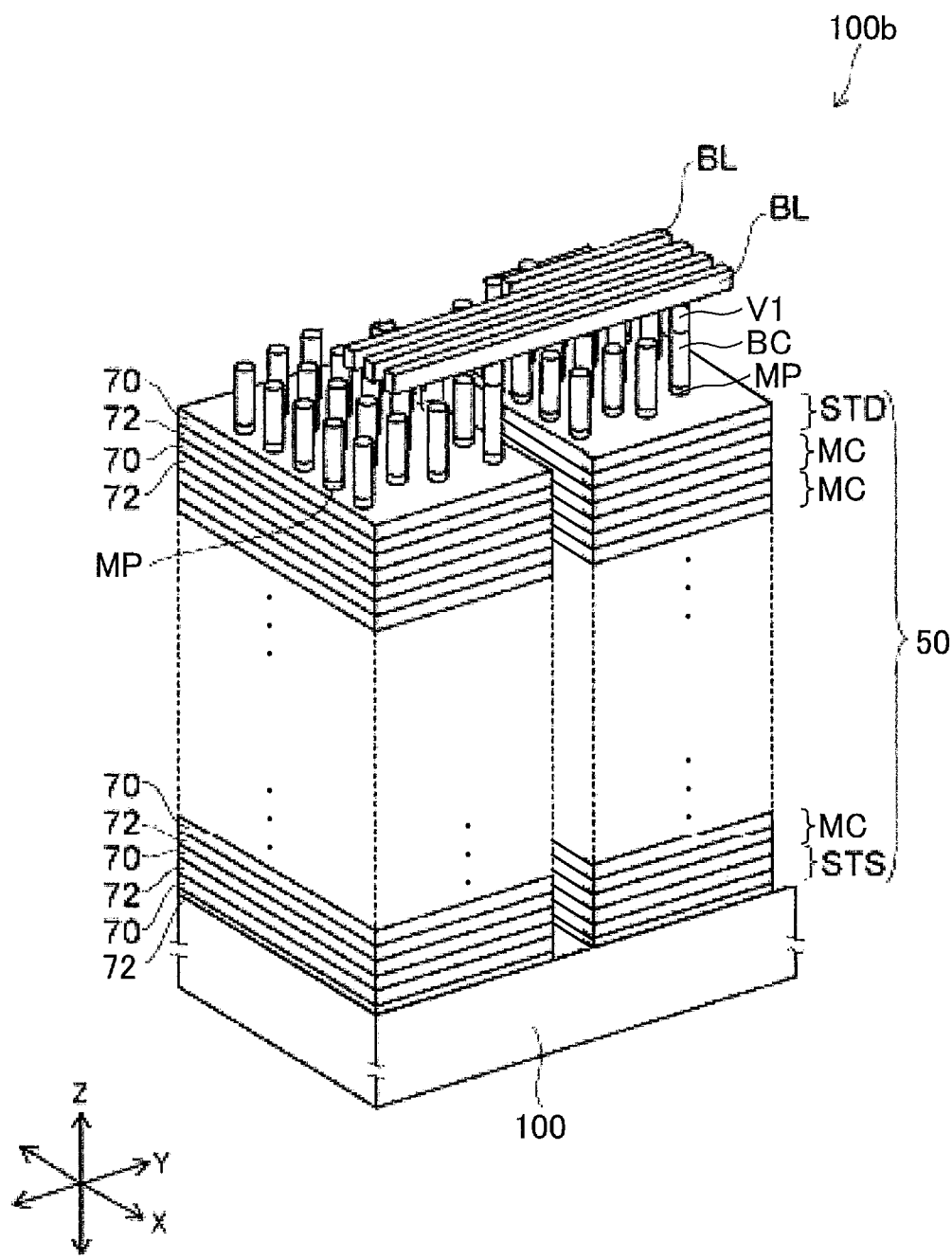
FIG. 3 is a bird's-eye view of an exemplary structure of the semiconductor device according to the first embodiment.

In general, according to one embodiment, a memory device includes a substrate; a structure including a plurality of conductive layers stacked on the substrate; and a pillar arranged inside the structure and including a semiconductor layer that extends in a direction perpendicular to a surface of the substrate. The semiconductor layer includes a first portion on a side of an upper portion of the structure, and a second portion between the first portion and the substrate. The first portion of the semiconductor layer has a thickness larger than a thickness of the second portion of the semiconductor layer.

A memory device and a method for manufacturing such a memory device according to present embodiments will be explained with reference to FIGS. 1 to 25.

The present embodiments will be described in detail below with reference to the drawings. In the following description, components having the same functions and structures will be referred to by the same reference numerals. Furthermore, in each of the embodiments, structural components (e.g., word lines WL, bit lines BL, voltages and signals of various kinds) may be given a reference sign accompanied by a numeral or alphabetical character at its end for differentiation. If these components do not need to be differentiated from each other, a description (reference sign) without the trailing numeral or character will be adopted.

(1) First Embodiment

A memory device and a method for manufacturing such a memory device according to the first embodiment will be explained with reference to FIGS. 1 to 20.

(a) Exemplary Configuration

FIG. 1 is a block diagram showing a configuration of the memory device according to the present embodiment.

A memory device (semiconductor memory) 1 of FIG. 1 may be controlled by an externally provided memory controller 2. The memory controller 2 executes, upon various kinds of requests from a host device (e.g., processor) 9, various types of processing to control the operations of the memory device 1.

The memory device 1 may be a NAND flash memory. The NAND flash memory 1 is configured to store data in a nonvolatile manner.

As illustrated in FIG. 1, the NAND flash memory (hereinafter it may be simply referred to as "flash memory") 1 may include a memory cell array 10, a command register 11, an address register 12, a sequencer 13, a driver 14, a row decoder 15, and a sense amplifier 16.

The memory cell array 10 includes a plurality of blocks BLK0 to BLKn (where n is an integer larger than or equal to 1). A plurality of bit lines and a plurality of word lines are provided in the memory cell array 10. A block BLK is a set of nonvolatile memory cells. A block BLK is used as a data erasable unit. Each memory cell is associated with one bit line and one word line. The structure of the memory cell array 10 will be discussed later in detail.

The command register 11 stores commands CMD that the flash memory 1 receives from the memory controller 2. A command CMD may include an instruction that causes the sequencer 13 to execute a read operation, write operation, erase operation and the like.

The address register 12 stores address information ADR that the flash memory 1 receives from the memory controller 2. The address information ADR may include a block address BA, a page address PA, and a column address CA. The block address BA, page address PA, and column address CA are used for selection of a block BLK, a word line, and a bit line, respectively.

The sequencer 13 controls the entire operation of the flash memory 1. The sequencer 13 may control the operations of the driver 14, row decoder 15, and sense amplifier 16 based on a command CMD stored in the command register 11. In this manner, a read operation, write operation, erase operation and the like are executed upon the memory cell array 10.

The driver (voltage generation circuit) 14 generates voltages that are to be used for the read operation, write operation, erase operation and the like. The driver 14 may apply the generated voltages to a signal line corresponding to the selected word line and signal lines corresponding to non-selected word lines based on the page address PA stored in the address register 12.

The row decoder 15 selects a block BLK based on the block address BA stored in the address register 12. The row decoder 15 may transfer a voltage applied to the signal lines corresponding to the selected word line and non-selected word lines, to the respective selected word line and non-selected word lines of the selected block BLK.

In a write operation, the sense amplifier 16 applies a desired voltage to the respective bit lines in accordance with the write data DT received from the memory controller 2. In a read operation, the sense amplifier 16 determines the data stored in the memory cells, based on the voltages of the bit lines (or based on whether or not a current is generated in the bit lines). The sense amplifier 16 transfers the determination result to the memory controller 2 as read data DT.

Communications may be implemented between the NAND flash memory 1 and the memory controller 2, in accordance with the NAND interface standard. If this is the case, the communications between the NAND flash memory 1 and memory controller 2 utilize a command latch enable signal CLE, an address latch enable signal ALE, a write enable signal WEn, a read enable signal REn, a ready/busy signal RBn, and an input/output signal I/O.

The command latch enable signal CLE is a signal indicating that the input/output signal I/O is a command CMD. The address latch enable signal ALE is a signal indicating that the input/output signal I/O is address information ADR. The write enable signal WEn is a signal that instructs the flash memory 1 to input an input/output signal I/O. The read enable signal REn is a signal that instructs the flash memory 1 to output an input/output signal I/O.

The ready/busy signal RBn is a signal that informs the memory controller 2 as to whether the flash memory 1 is in a ready state of being ready to receive a command from the memory controller 2 or in a busy state of being unready to receive a command. The input/output signal I/O may be an 8-bit width signal, which may include a command CMD, address information ADR, data DT or the like.

The above flash memory 1 and memory controller 2 may constitute a storage device. The storage device may be a memory card such as an SD™ card, or a solid state drive (SSD). In addition to the flash memory 1 and memory controller 2, the host device 9 may be included as a structural component of the storage device.

<Circuit Configuration of Memory Cell Array>

FIG. 2 is an equivalent circuit diagram for explaining an exemplary memory cell array of the NAND flash memory according to the present embodiment.

As illustrated in FIG. 2, a block BLK may include four string units SU (SU0 to SU3). Each string unit SU includes a plurality of NAND strings NS. Each NAND string NS may include a plurality (e.g., the number m−1) of memory cells MC and two select transistors ST1 and ST2. The number of select transistors ST1 and ST2 in a NAND string NS can be freely determined, as long as one transistor ST1 and one transistor ST2 are included. The number m is an integer larger than or equal to 2.

A memory cell MC includes a control gate and a memory layer. The memory cell MC thereby stores data in a non-volatile manner. The memory cell MC may be of a MONOS type adopting an insulating layer (e.g., silicon nitride film) for the charge storage layer of the memory layer, or of a floating-gate type adopting a conductive layer (e.g., silicon film) for the charge storage layer.

The memory cells MC are coupled in series between the source of the select transistor ST1 and the drain of the select transistor ST2. The current path of the memory cells MC is formed by coupling the memory cells MC in series between the two select transistors ST1 and ST2. The terminal (e.g., drain) of the current path of the memory cell MC closest to the drain of the NAND string NS is coupled to the source of the select transistor ST1. The terminal (e.g., source) of the current path of the memory cell MC closest to the source of the NAND string NS is coupled to the drain of the select transistor ST2.

In each of the string units SU0 to SU3, the gate of the select transistor ST1 is coupled to the corresponding one of the drain-side select gate lines SGD0 to SGD3. In each of the string units SU0 to SU3, the gate of the select transistor ST2 is coupled to the corresponding one of the source-side select gate lines SGS0 to SGS3. In the following description, if the select gate lines SGD0 to SGD3 do not need to be distinguished from each other, the select gate lines SGD0 to SGD3 will be referred to as select gate lines SGD. If the select gate lines SGS0 to SGS3 do not need to be distinguished from each other, the select gate lines SGS0 to SGS3 will be referred to as select gate lines SGS. The string units SU may be commonly coupled to a single select gate line SGS.

The control gate of each memory cell MC in a block ELK is coupled to the corresponding one of the word lines WL0 to WL(m−1), where the number m is an integer larger than or equal to 2. In the following description, if the word lines WL0 to WL(m−1) do not need to be distinguished from each other, the word lines WL0 to WL(m−1) will be simply referred to as word lines WL.

In a string unit SU, the drain of the select transistor ST1 of each NAND string NS is coupled to a corresponding one of the bit lines BL0 to BL(n−1), where n is an integer larger than or equal to 2. In the following description, if the bit lines BL0 to BL(n−1) do not need to be distinguished from each other, the bit lines BL0 to BL(n−1) will be simply referred to as bit lines BL. A bit line BL is commonly coupled to a certain NAND string NS in each of the string units SU among the blocks BLK.

The sources of the select transistors ST2 are commonly coupled to a source line SL. For instance, the string units SU in a block BLK are commonly coupled to a source line SL.

A string unit SU is a set of NAND strings NS coupled to different bit lines BL and commonly to the same select gate lines SGD and SGS. A block BLK is a set of string units SU that share the word lines WL. A memory cell array 10 is as set of blocks BLK that share bit lines BL.

Data write and read operations are implemented upon the memory cells MC coupled to one of the word lines WL in a selected one of the string units SU, in a batch. Hereinafter, a group of memory cells MC selected in a batch in data write and read operations will be referred to as a memory cell group. One-bit data items to be written into a memory cell group or to be read from a memory cell group will be referred to as a page. For instance, one page or more will be assigned to one memory cell group.

A data erase operation may be executed in units of blocks BLK or in units smaller than blocks BLK. The data erase scheme is described, for example, in U.S. patent application Ser. No. 13/235,389 filed on Sep. 18, 2011, entitled "NON-VOLATILE SEMICONDUCTOR MEMORY DEVICE". The data erase scheme is further described in U.S. patent application Ser. No. 12/694,690 filed on Jan. 27, 2010, entitled "NON-VOLATILE SEMICONDUCTOR STORAGE DEVICE". The method for erasing data is also described in U.S. patent application Ser. No. 13/483,610 filed on May 30, 2012, entitled "NONVOLATILE SEMICONDUCTOR MEMORY DEVICE AND DATA ERASE METHOD THEREOF". These patent applications are used as references throughout the specification of the present application.

The configuration of the memory cell array 18 may not be the same as the above. The configuration of the memory cell array 18 is described, for example, in U.S. patent application Ser. No. 12/407,403 filed on Mar. 19, 2009, entitled "THREE DIMENSIONAL STACKED NONVOLATILE SEMICONDUCTOR MEMORY". The configuration of the memory cell array 18 is also described in U.S. patent application Ser. No. 12/406,524 filed on Mar. 18, 2009, entitled "THREE DIMENSIONAL STACKED NON-VOLATILE SEMICONDUCTOR MEMORY"; in U.S. patent application Ser. No. 12/679,991 filed on Mar. 25, 2010, entitled "NON-VOLATILE SEMICONDUCTOR STORAGE DEVICE AND METHOD OF MANUFACTURING THE SAME"; and in U.S. patent application Ser. No. 12/532,030 filed on Mar. 23, 2009, entitled "SEMICONDUCTOR MEMORY AND METHOD FOR MANUFACTURING SAME". These patent applications are used as references throughout the specification of the present application.

<Exemplary Structure of Memory Cell Array>

FIG. 3 is a bird's-eye view illustrating a structure of a memory cell array in the NAND flash memory according to the present embodiment.

As illustrated in FIG. 3, the NAND flash memory according to the present embodiment has a memory cell array having a three-dimensional structure.

The memory cell array 10 having a three-dimensional structure includes a plurality of interconnects BL, a plurality of pillars MP, and a layer stack (structure) 50 provided above the substrate 100.

The layer stack 50 includes a plurality of conductive layers 70 and a plurality of insulating layers 72. The conductive layers 70 and insulating layers 72 are alternately deposited in the Z direction in the layer stack 50, where the Z direction is approximately perpendicular to the surface of the substrate 100. One layer stack 50 corresponds to one block BLK or one string unit SU.

Pillars MP are provided in the structure 50 to extend in the Z direction in the structure 50. A pillar MP has a columnar structure. The layer stack 50 is provided with a plurality of holes (through holes) for the arrangement of the pillars MP. Hereinafter, pillars will be referred to as memory pillars. The holes in which the memory pillars are provided will be referred to as memory holes.

The layout of the pillars MP on the two-dimensional plane (X-Y plane) along the X direction and Y direction is a staggered arrangement. Alternatively, the layout of the pillars MP may be a square lattice arrangement on the X-Y plane.

A plurality of bit lines BL are provided above the layer stack 50. The bit lines BL may be metal layers. The bit lines BL extend in the Y direction, and are arranged in the X direction.

The upper end portion of the semiconductor layer in a memory pillar MP is coupled to a bit line BL by way of the bit line contact BC and via plug V1. A plurality of pillars MP are commonly coupled to a single bit line BL. One pillar MP may be selected from a layer stack 50 so that the selected pillars MP of different layer stacks 50 may be coupled to the common bit line BL.

In the drawings discussed below, the X direction corresponds to the extending direction (longitudinal direction) of the word lines WL, and the Y direction corresponds to the extending direction of the bit lines BL. In the cross-sectional views discussed below, structural components of a NAND flash memory according to the present embodiment such as insulating layers (inter-layer insulating films), interconnects, and contacts are suitably omitted.

Figure 4:
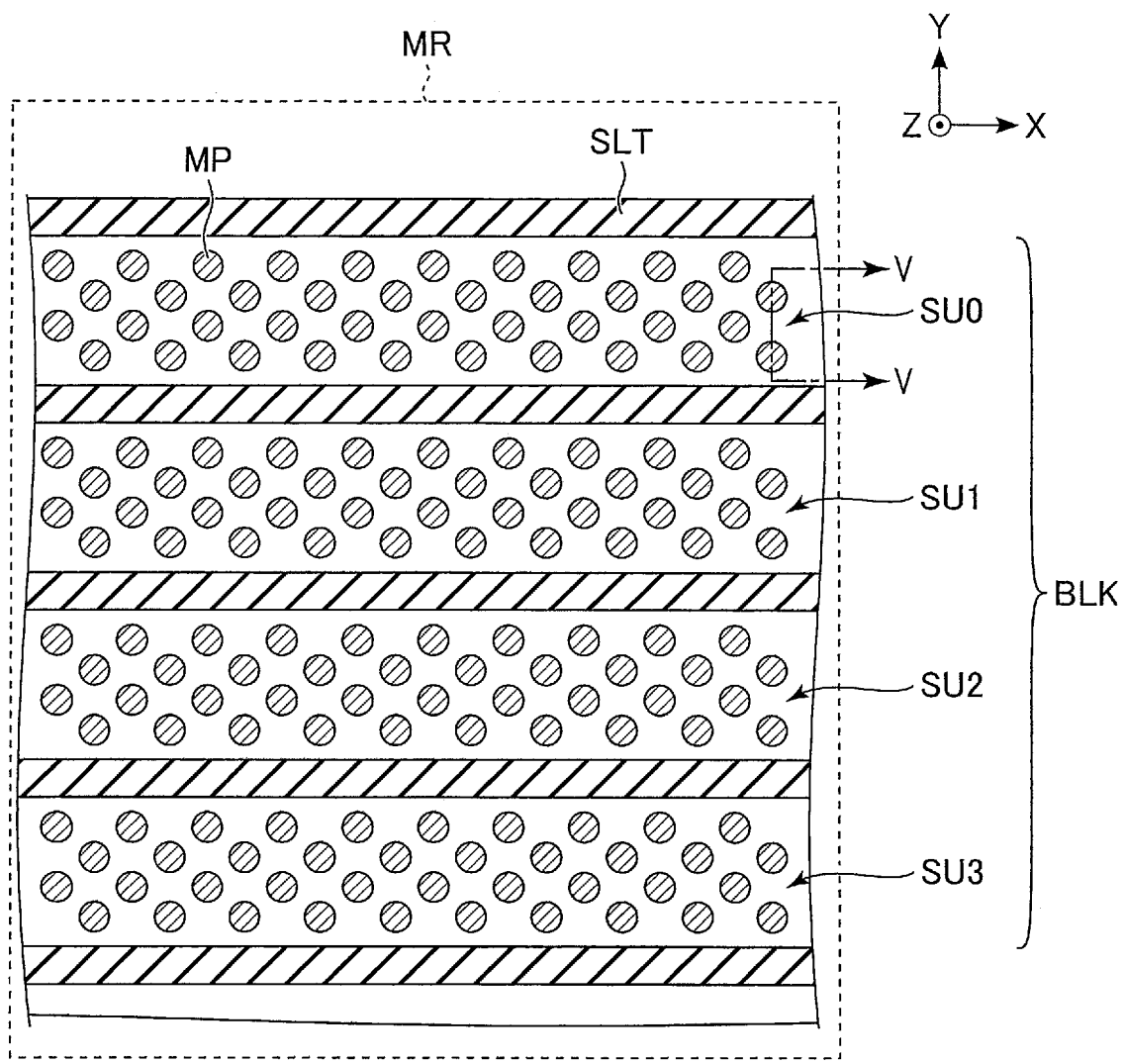
FIG. 4 is a cross-sectional view of an exemplary structure of the semiconductor device according to the first embodiment.

FIG. 4 is a diagram showing an exemplary planar layout of the memory cell array 10 in a flash memory according to the present embodiment. In FIG. 4, the structure of one of the blocks BLK arranged in the Y direction is focused on.

As illustrated in FIG. 4, layer stacks 50 are provided on the substrate in such a manner as to correspond to the string units SU0 to SU3 of the block BLK. The layer stacks 50 extend in the X direction, and are arranged in the Y direction.

The layer stacks 50 corresponding to the string units SU0 to SU3 are separated from each other by slits SLT. A slit SLT extending in the X direction is provided between any two layer stacks 50 that are adjacent to each other in the Y direction. The two slits SLT extending in the X direction are adjacent in the Y direction.

In this example, a structure 50 between two slits SLT adjacent in the Y direction corresponds to a string unit SU. A plurality of string units SU may be arranged in a region surrounded by the slits SLT.

The memory region MR of string units SU has a structure as indicated below. A memory region MR is a region that substantially stores data. In the memory region MR, a plurality of memory pillars MP are arranged in a staggered pattern. Each memory pillar MP may be arranged to correspond to one NAND string NS.

The memory pillars MP are schematically illustrated in FIG. 4, and therefore the number of memory pillars MP should not be limited to the illustrated number.

Figure 5:
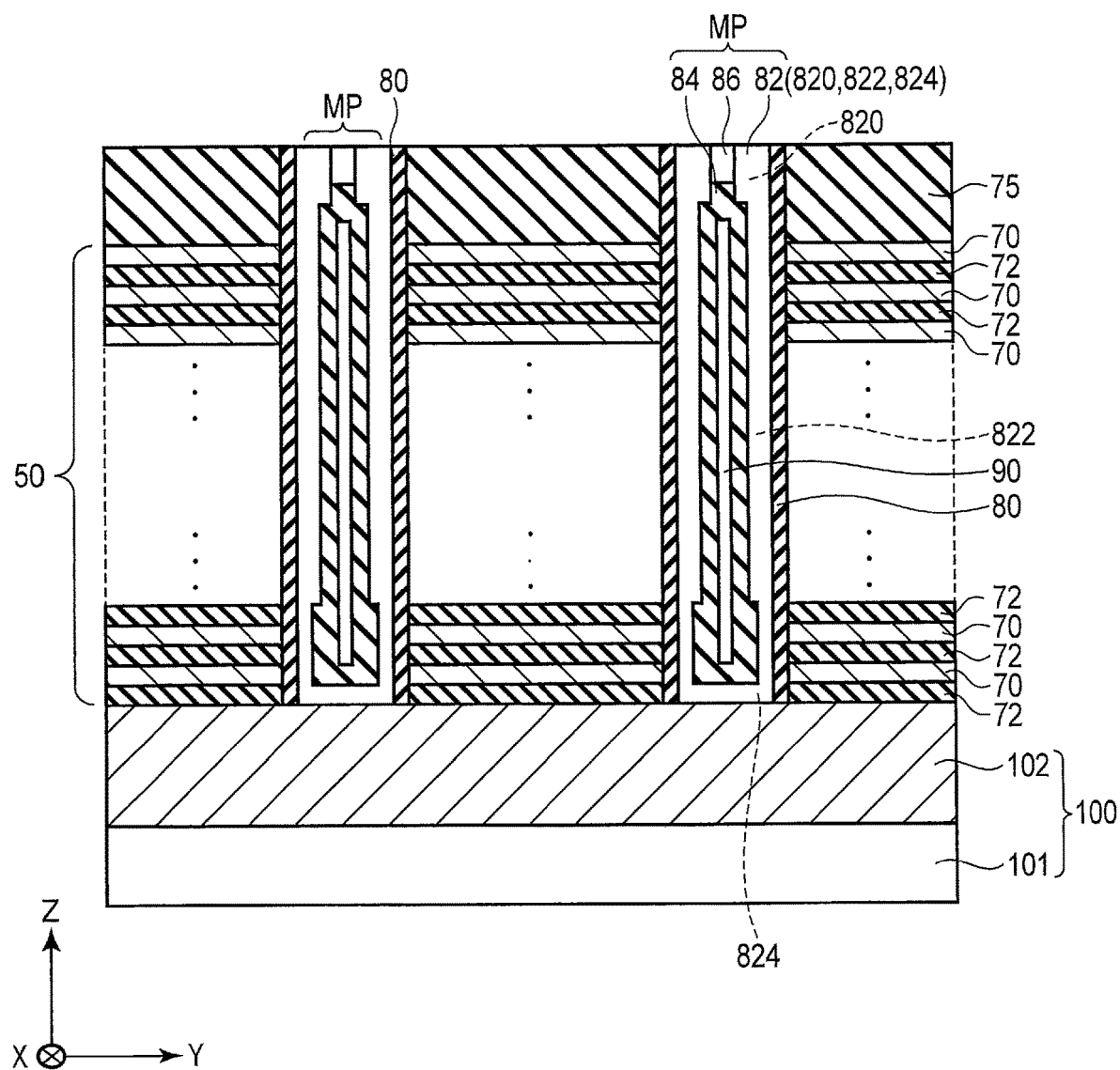
FIG. 5 is a cross-sectional view of an exemplary structure of the semiconductor device according to the first embodiment.

FIG. 5 is a cross-sectional view of the structure of FIG. 4, taken along line V-V. FIG. 5 shows an exemplary cross-sectional structure of a memory cell array 10 (memory region MR) according to the present embodiment.

As illustrated in FIG. 5, in the structure (string unit) of the memory region MR, a NAND string NS is provided on the substrate 100.

The substrate 100 includes a semiconductor layer 101 and a semiconductor layer 102. The semiconductor layer 101 may be a single crystalline layer (bulk single crystal substrate) or an epitaxial layer. The semiconductor layer 102 is provided on the semiconductor layer 101. The semiconductor layer 102 may be a polycrystalline silicon layer (polysilicon layer) or an epitaxial layer. The semiconductor layer 102 may function as a source line SL.

A NAND string NS may include a plurality of conductive layers 70, a plurality of insulating layers 72 and 75, a memory layer 80, and a memory pillar MP.

A drain-side select transistor ST1 is provided at a position of the uppermost one (on the side of the insulating layer 75) of the conductive layers 70 in the layer stack 50. A drain-side select transistor ST1 may be formed using the upper four conductive layers 70. One or more conductive layers 70 corresponding to the position of the select transistor ST1 function as a drain-side select gate line SGD.

A source-side select transistor ST2 is provided at a position of the lowermost one (on the substrate side) of the conductive layers 70 in the layer stack 50. A source-side select transistor ST2 may be formed using the lower four conductive layers 70. One or more conductive layers 70 corresponding to the position of the select transistor ST2 functions as a source-side select gate line SGS.

Each of the conductive layers 70, except for the conductive layers 70 functioning as select gate lines SGD and SGS, functions as word lines. Memory cells MC are provided at positions of the conductive layers 70 that function as word lines WL. One or more conductive layers 70 that function as the word lines WL may be used as dummy word lines.

Each of the conductive layers 70 has a plate-like structure expanding in the X-Y plane. The conductive layers 70 may contain tungsten (W).

Each of the insulating layers 72 is provided between the conductive layers 70 adjacent to each other in the Z direction. The conductive layers 70 stacked in the Z direction are separated by an insulating layer 72. The insulating layers 72 may contain silicon oxide.

A memory layer 80 is arranged on the periphery (side surface) of the memory pillar MP. The memory layer 80 extends in the Z direction along the side surface of the layer stack 50. The memory layer 80 is provided between the memory pillar MP and the conductive layers 70 and between the memory pillar MP and the insulating layers 72. The memory layer 80 is a layer-stacked film including a charge storage layer.

One end of the memory pillar MP is coupled to a bit line (not shown), while the other end of the memory pillar MP is coupled to a source line (semiconductor layer) 101. In the description below, a portion of the memory pillar MP on the bit line side of a NAND string NS will be referred to as the upper portion of the memory pillar MP. A portion of the memory pillar on the source line side of the NAND string will be referred to as the lower portion (or bottom portion) of the memory pillar MP.

The memory pillar MP includes a semiconductor layer 82, a core layer 84, and a cap layer (conductive layer) 86. The memory pillar MP penetrates through a plurality of conductive layers 70 and a plurality of insulating layers 72.

The core layer 84 has a columnar structure extending in the Z direction. The core layer 84 may contain an insulator such as silicon dioxide ($SiO_2$). An air gap 90 may be provided inside the core layer 84.

The semiconductor layer 82 surrounds the side surface and bottom surface of the core layer 84. The semiconductor layer 82 is coupled to the substrate 100 at the bottom end of the memory pillar MP. The semiconductor layer 82 may be provided between the bottom surface of the core layer 84 and the top surface of the substrate 100. The semiconductor layer 82 is in direct contact with the semiconductor layer 102.

The semiconductor layer 82 may be a silicon (Si) layer. Hereinafter, the semiconductor layer 82 will be referred to as a silicon layer.

The silicon layer 82 includes a portion 820, which is an upper portion of the memory pillar MP with respect to the Z direction, a portion 824, which is a lower portion of the memory pillar MP with respect to the Z direction, and a portion 822 between the portion 820 and the portion 824. The portion 820 has a thickness larger than that of the portion 822. The portion 824 has a thickness smaller than that of the portion 822. The thickness of the semiconductor layer 82 is a dimension thereof with respect to a direction parallel to the surface of the substrate 100. The thickness of the lower portion 824 of the silicon layer 82 in the memory hole may be defined as a smaller one of the dimension thereof with respect to a direction perpendicular to the surface of the substrate 100 and a dimension thereof with respect to a direction parallel to the surface of the substrate 100.

Hereinafter, the portion 820 will be referred to as an upper silicon layer 820, the portion 824 will be referred to as a lower silicon layer 824, and the portion 822 will be referred to as a middle silicon layer 822.

The cap layer 86 is provided on the core layer 84 on the upper side of the memory pillar MP. The cap layer 86 may be a silicon layer or a conductive layer.

The structure of the NAND flash memory according to the present embodiment will be described in further detail with reference to FIG. 6.

FIG. 6 is a schematic view specifically indicating the structure of a NAND string of the NAND flash memory according to the present embodiment.

As illustrated in FIG. 6, the memory layer 80 includes an insulating layer 801, a charge storage layer 802, and an insulating layer 803. The charge storage layer 802 is provided between the insulating layer 801 and insulating layer 803. The layers 801, 802 and 803 are continuously arranged along the side surface of the layer stack 50 (inner wall of the memory hole) from the upper portion to the lower portion of the memory pillar MP.

The charge storage layer 802 stores a charge that is supplied from the silicon layer 82 through the tunneling effect. The charge in the charge storage layer 802 is released to the silicon layer 82 through the tunneling effect, or electrically canceled by the positive hole supplied with the tunneling effect. The threshold voltage (ON voltage) of the memory cell MC varies in accordance with the amount of charge in the charge storage layer 802. The memory cell MC of the NAND flash memory 1 can store data of 1 bit or more based on the association of the data with the threshold voltages of the memory cell MC (on/off of the memory cell).

The insulating layer 801 is provided between the conductive layers 70 and the charge storage layer 802. The insulating layer 801 is a block insulating layer 801. The block insulating layer 801 is configured to prevent a charge from moving between the conductive layers 70 and charge storage layer 802.

The insulating layer 803 is provided between the semiconductor layer (silicon layer) 82 and the charge storage layer 802. The insulating layer 803 is a tunnel insulating layer 803. The tunnel insulating layer 803 functions as a tunnel barrier (potential barrier) between the charge storage layer 802 and silicon layer 82.

The silicon layer 82 of the memory pillar MP extends in the Z direction between the source line side (source side) and the bit line side (drain side) of the NAND string NS.

The semiconductor layer 102a is provided between the silicon layer 82 and the semiconductor layer 102. An insulating layer (silicon oxide layer) 72a may be provided between the insulating layer 72 and the semiconductor layer 102.

The semiconductor layer 102a is in direct contact with the silicon layer 82. The semiconductor layer 102a may be a crystalline silicon layer. The semiconductor layer 102a is formed using the semiconductor layer 102 as a base material. The semiconductor layer 102a is formed continuously to the semiconductor layer 102. The upper end of the semiconductor layer 102a is arranged on the side surface of the lowermost insulating layer 72. The lower end of the semiconductor layer 102a is positioned on the bottom side of the substrate 100 in the Z direction with reference to the border region between the semiconductor layer 102a and the insulating layer 72a.

According to the present embodiment, the thickness T1 of the portion (upper silicon layer) 820 of the silicon layer 82 on the upper side of the memory pillar MP is larger than the thickness T2 of the portion (middle silicon layer) 822 of the silicon layer 82 in the middle portion of the memory pillar MP. The thickness T3 of the portion (lower silicon layer) 824 of the silicon layer 82 on the bottom side of the memory pillar MP is smaller than the thickness T2 of the portion 822. The middle portion of the memory pillar MP may correspond to a portion around a position of one half the dimension (height) H of the memory pillar MP in a direction perpendicular to the surface of the substrate 100.

The crystallization (crystalline form) of the upper silicon layer 820 may include, entirely or mostly, crystals of a small grain size, in comparison with the crystallization of the middle silicon layer 822 and lower silicon layer 824. The upper silicon layer 820 may be an amorphous silicon layer or microcrystalline silicon layer. Hereinafter, a portion (upper silicon layer) 820 of the silicon layer 82 may be referred to as an amorphous silicon layer (or microcrystalline silicon layer) 820. Micro-crystallite is a crystal having a grain size of 200 nanometers or smaller, for example around 50 to 100 nanometers. A microcrystalline layer is a layer of crystals of 200 nanometers or smaller. A polysilicon layer (polysilicon region) may be formed in part of the upper silicon layer 820. If this is the case, the upper silicon layer 820 includes an amorphous silicon region (and/or microcrystalline silicon region) and a polysilicon region.

In the silicon layer 82, the portions (such as the middle silicon layer and lower silicon layer) 822 and 824 below the upper silicon layer 820 are polysilicon layers.

The amorphous silicon layer 820 contains at least one impurity selected from molecules related to boron (B), carbon (C), germanium (Ge), fluorine (F), argon (Ar), xenon (Xe), and $BF_2$. These impurities are ion species that are used for ion injection to change a polysilicon layer to an amorphous silicon layer.

The concentration of the selected impurity in the amorphous silicon layer 820 is higher than that of the selected impurity in the polysilicon layers 822 and 824. The impurity concentration in the amorphous silicon layer 820 can be substantially equal to the impurity concentration in the polysilicon layers 822 and 824. When the amorphous silicon layer 820 contains boron, the amorphous silicon layer 820 may contain fluorine in addition to boron. Argon and xenon may be desorbed from the silicon layer.

An air gap 90 may be produced inside the memory pillar MP. The air gap 90 is a region (space or air layer) inside the memory pillar MP, surrounded by the core layer (silicon oxide layer) 84.

The top end PP of the air gap 90 is preferably positioned on the side of the substrate 100 with respect to the lower end of the amorphous silicon layer 820. The lower end of the amorphous silicon layer 820 may correspond to a position around the border region of the amorphous silicon layer 820 and polysilicon layer 822 in the silicon layer 82. The top end PP of the air gap 90 may be positioned on the side of the substrate 100 with respect to the lower end (bottom surface) of the insulating layer 75.

The maximum dimension of the air gap 90 on the bottom side in a direction parallel to the surface of the substrate 100 is larger than the maximum dimension of the air gap 90 on the upper portion side with respect to a direction parallel to the surface of the substrate 100.

The lower portion (polysilicon layer) 824 of the silicon layer 82 on the side of the core layer 84 has a curved surface. The surface of the lower silicon layer 824 that is in contact with the core layer 84 is U-shaped (C-shaped).

In accordance with the shape of the lower portion 824 of the silicon layer 82, the lower portion of the core layer 84 has a horseshoe-shaped (or U-shaped/C-shaped) cross section. The lower portion of the air gap 90 has a circular or ellipsoidal cross section on the Y-Z plane (or X-Z plane). The upper portion of the air gap 90 has a triangular cross section on the Y-Z plane (or X-Z plane). The portion of the air gap 90 between its lower and upper portions (i.e., middle portion) has a quadrangular cross section on the Y-Z plane (X-Z plane).

According to the present embodiment, when the silicon layer 82 on the upper side of the memory pillar MP is amorphous, the flatness of the amorphous silicon layer 820 can be improved. As a result, according to the present embodiment, defects that tend to be produced in the layer stack or NAND strings at the time of etching the core layer can be suppressed.

(b) Manufacturing Method

The method for manufacturing the memory device according to the present embodiment will be explained with reference to FIGS. 7 to 16.

FIGS. 7 to 16 are cross-sectional views showing the steps of the method for manufacturing the memory device according to the present embodiment.

Figure 7:
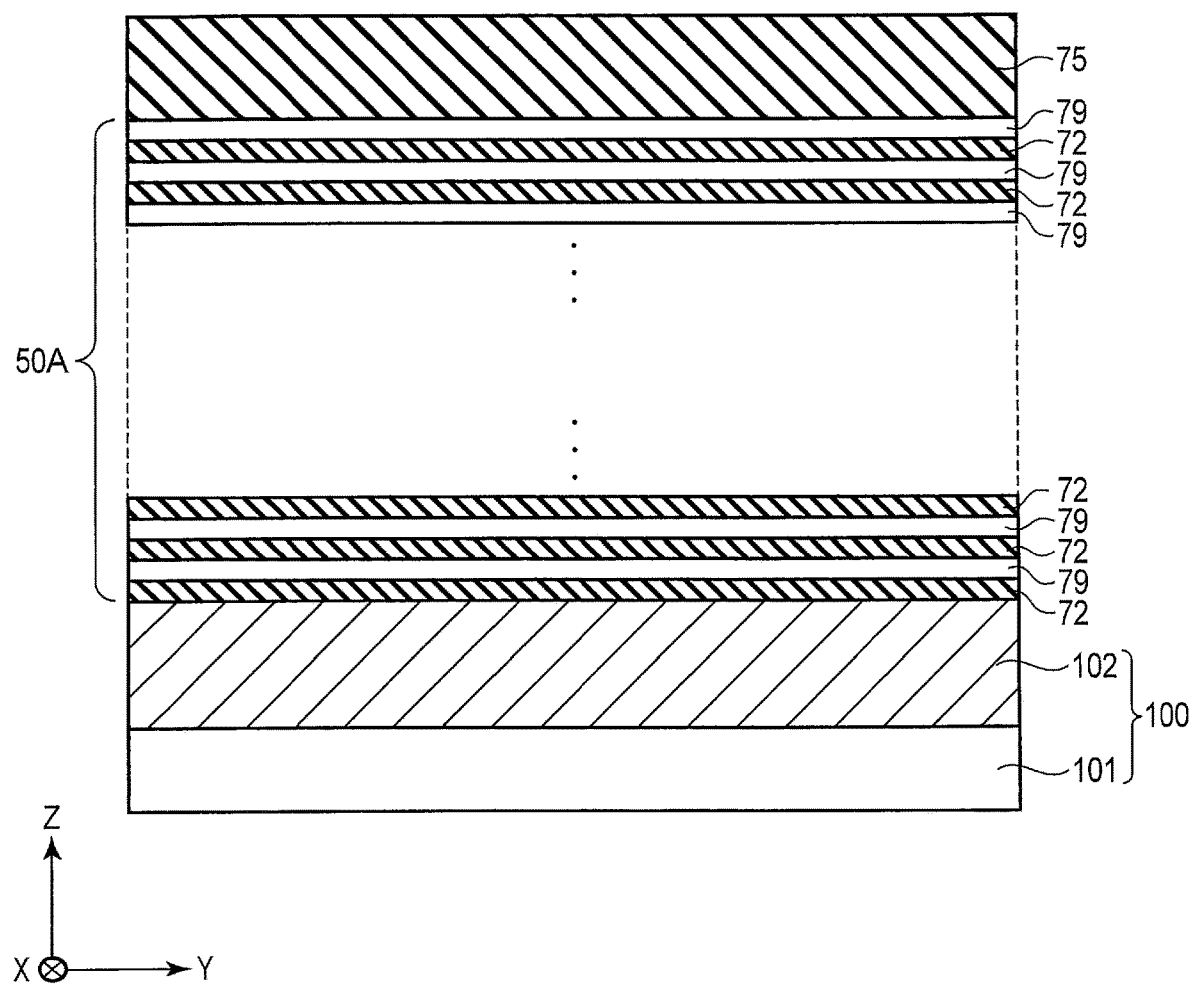
FIG. 7 is a cross-sectional process diagram showing a step of the method for manufacturing the semiconductor device according to the first embodiment.

As illustrated in FIG. 7, an insulating layer 72 may be formed on the semiconductor layer 101 of the substrate 100 by chemical vapor deposition (CVD). A sacrificial layer 79 may be formed on this insulating layer 72 by CVD (or sputtering). Another insulating layer 72 is formed on the sacrificial layer 79. In this manner, insulating layers 72 and sacrificial layers 79 are alternately formed.

An insulating layer 75 is formed on the uppermost sacrificial layer 79. The top surface of the insulating layer 75 may be planarized by chemical mechanical polishing (CMP).

As a result, a layer stack 50A is formed on the substrate 100.

The number of sacrificial layers 79 in the layer stack 50A corresponds to the number of word lines WL and select gate lines SGD and SGS in a string unit (NAND string).

The materials for the sacrificial layers 79 and insulating layers 72 should be selected so as to demonstrate a high etching selectivity between the sacrificial layers 79 and insulating layers 72. For instance, when the material of the insulating layers 72 is silicon oxide, the material of the sacrificial layers may be silicon germanium or silicon nitride.

Prior to the formation of the layer stack 50A, transistors (not shown) and interconnects (not shown) may be formed within a region (not shown) below the semiconductor layer 101. In this manner, a peripheral circuit of the NAND flash memory can be prepared.

Figure 8:
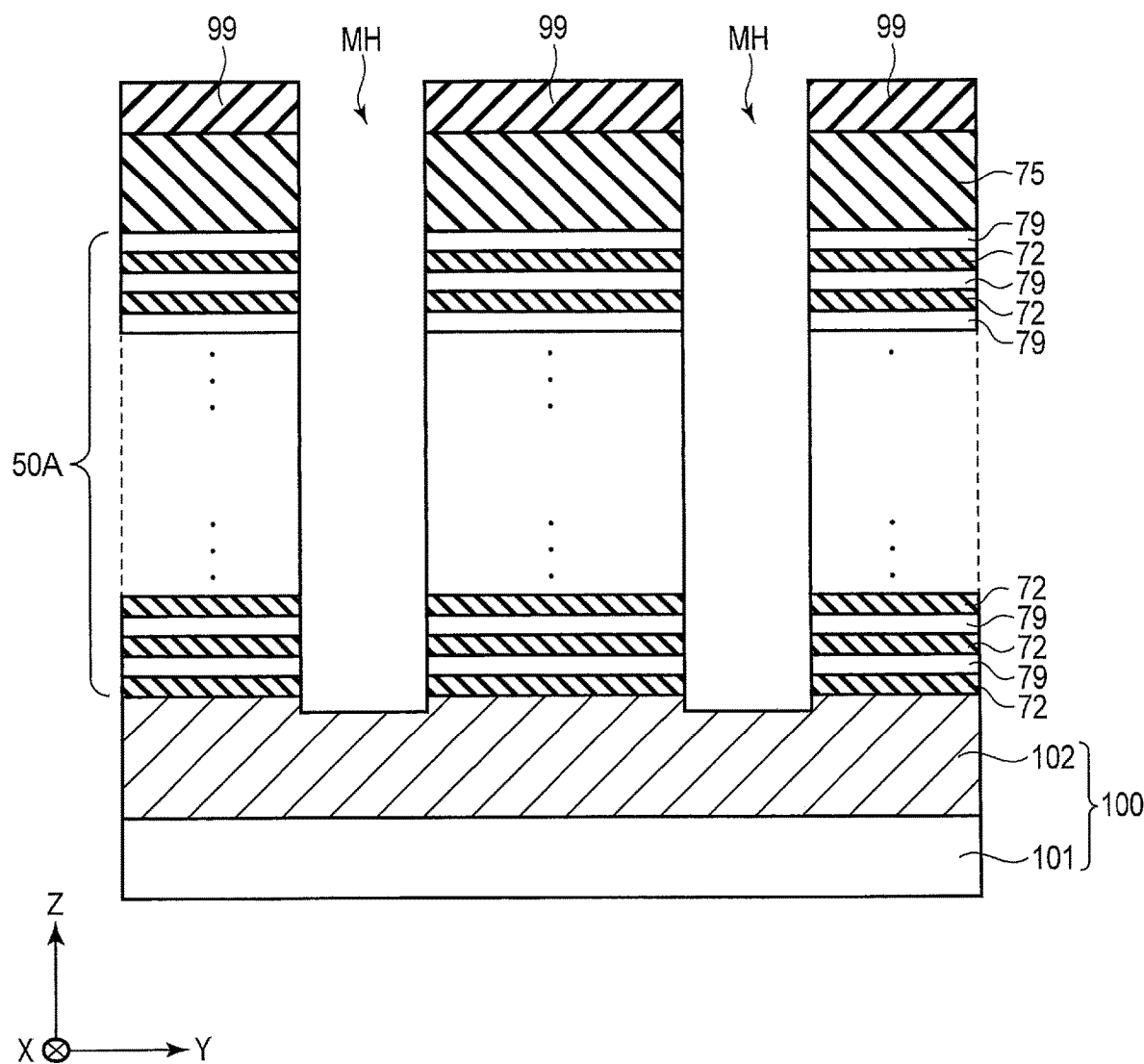
FIG. 8 is a cross-sectional process diagram showing a step of the method for manufacturing the semiconductor device according to the first embodiment.

As illustrated in FIG. 8, memory holes MH are formed in the regions of the layer stack 50A in which memory pillars are to be formed.

For instance, a mask layer 99 is formed on the insulating layer 75. In the regions where the memory pillars are to be formed, openings are formed in the mask layer 99 by photolithography and etching. An etching process is executed upon the layer stack 50A based on the mask layer 99 having openings. Anisotropic etching such as reactive ion etching (RIE) can be used for formation of the memory holes MH.

In this manner, memory holes MH are provided in the layer stack 50A.

The memory holes MH penetrate the insulating layers 72 and 75 and the sacrificial layers 79, and reach the semiconductor layer 101.

After the formation of the memory holes MH, a crystalline layer (not shown) may be formed on the surface (exposed surface) of the semiconductor layer 101 by metal induced lateral crystallization (MILC).

Figure 9:
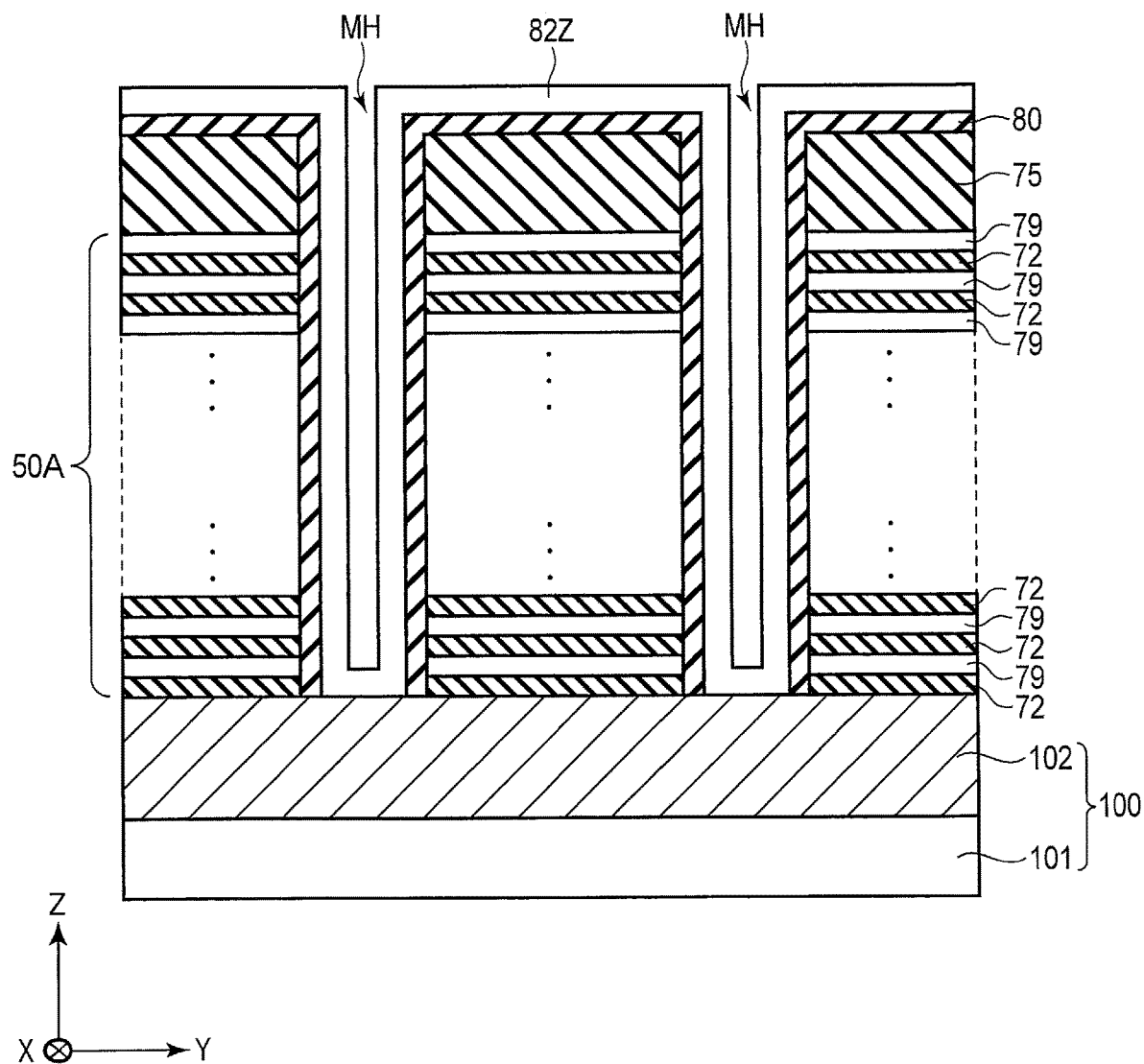
FIG. 9 is a cross-sectional process diagram showing a step of the method for manufacturing the semiconductor device according to the first embodiment.

As illustrated in FIG. 9, after the mask layer is removed, a memory layer 80 is formed on the upper surface of the layer stack 50A and the side surface of the layer stack 50A (inner walls of the memory holes MH) in the memory holes MH.

After the memory layer is removed from the semiconductor layer 102 (bottom portion of the memory holes), a silicon layer (semiconductor layer) 82 is formed on the memory layer 80. The silicon layer 82Z may be a polysilicon layer. The thickness of the polysilicon layer 82Z (e.g., the time period of the formation of the polysilicon layer) is controlled so as to protect the memory holes MH from being filled by the polysilicon layer 82Z. Prior to the removal of the memory layer, a protective layer (e.g., silicon layer) may be formed on the memory layer so that the memory layer on the inner wall (side surface) of the memory holes MH will not be removed (or will not be degraded) at the time of removing the memory layer from the bottom portion of the memory holes MH.

Figure 10:
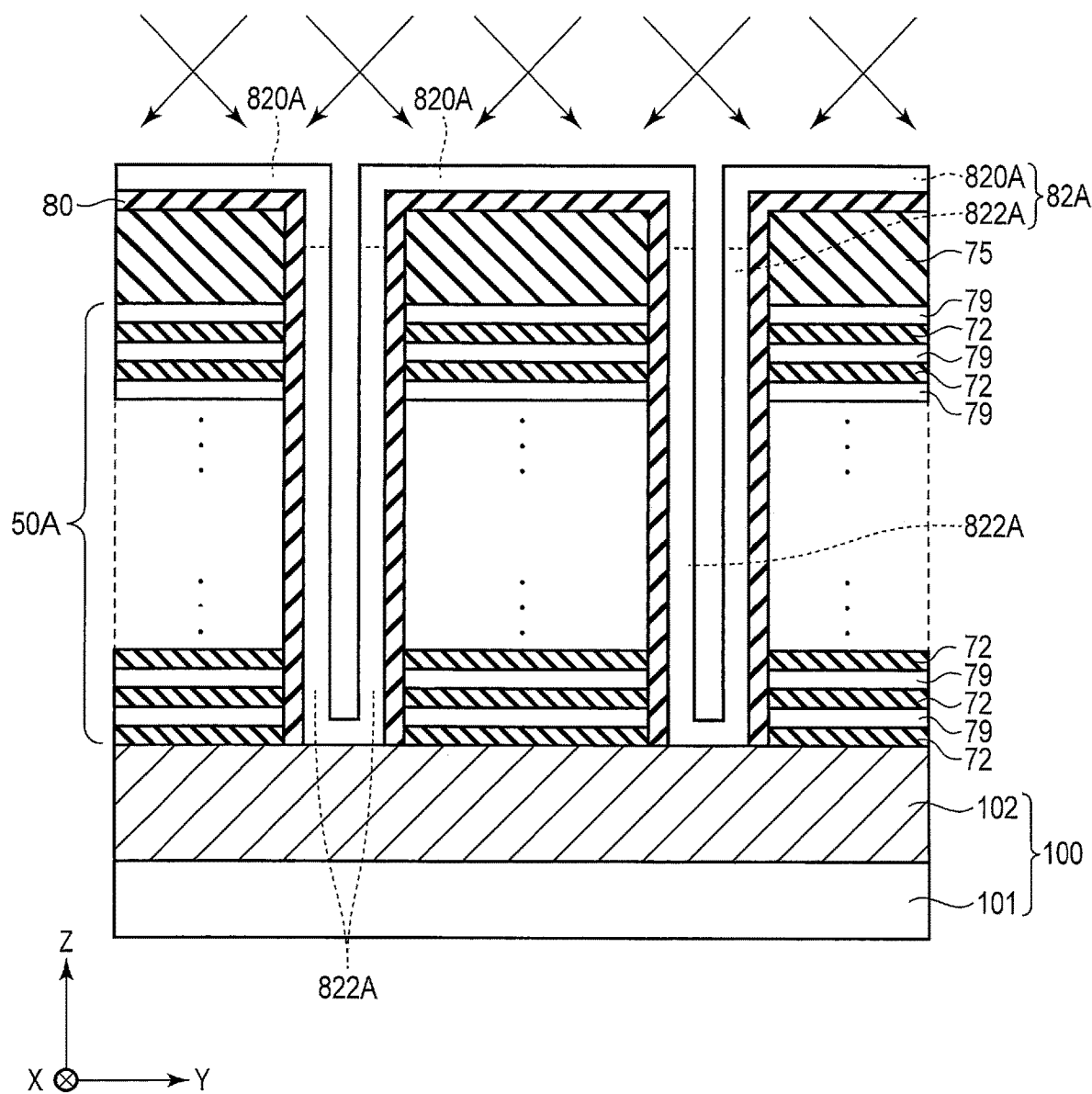
FIG. 10 is a cross-sectional process diagram showing a step of the method for manufacturing the semiconductor device according to the first embodiment.

As illustrated in FIG. 10, the process for changing to an amorphous state (hereinafter referred to as amorphization process) is executed on the silicon layer on the upper portion of the layer stack 50A.

According to the present embodiment, ion injection (ion irradiation) or plasma processing is executed as amorphization process for the upper portion of the silicon layer 82. When the silicon layer is amorphized through ion injection, at least one of boron, carbon, germanium, argon, xenon, fluorine, and $BF_2$ may be selected as an ion species for ion injection for amorphization of the upper portion (the opening side of the memory holes) of the silicon layer 82.

The dose amount of ion species for the ion injection is determined to be approximately between $10^{13}$ cm$^{-2}$ and $10^{16}$ cm$^{-2}$ ($10^{13}$/cm$^2$ to $10^{16}$/cm$^2$). For instance, for the amorphization of the silicon layer 82 on the side surface of the insulating layer 75 near the openings of the memory holes MH, the angle of ion injection may be determined so as to be inclined at a certain angle (e.g., 30° to 60°) with respect to the surface of the substrate 100.

In the portion of the silicon layer 82 into which ions are injected (added), crystal grains may be fractured by ion collision, or a chemical reaction may be caused by the silicon element and the element that constitutes the ion species, thereby amorphizing the portion.

Figure 11:
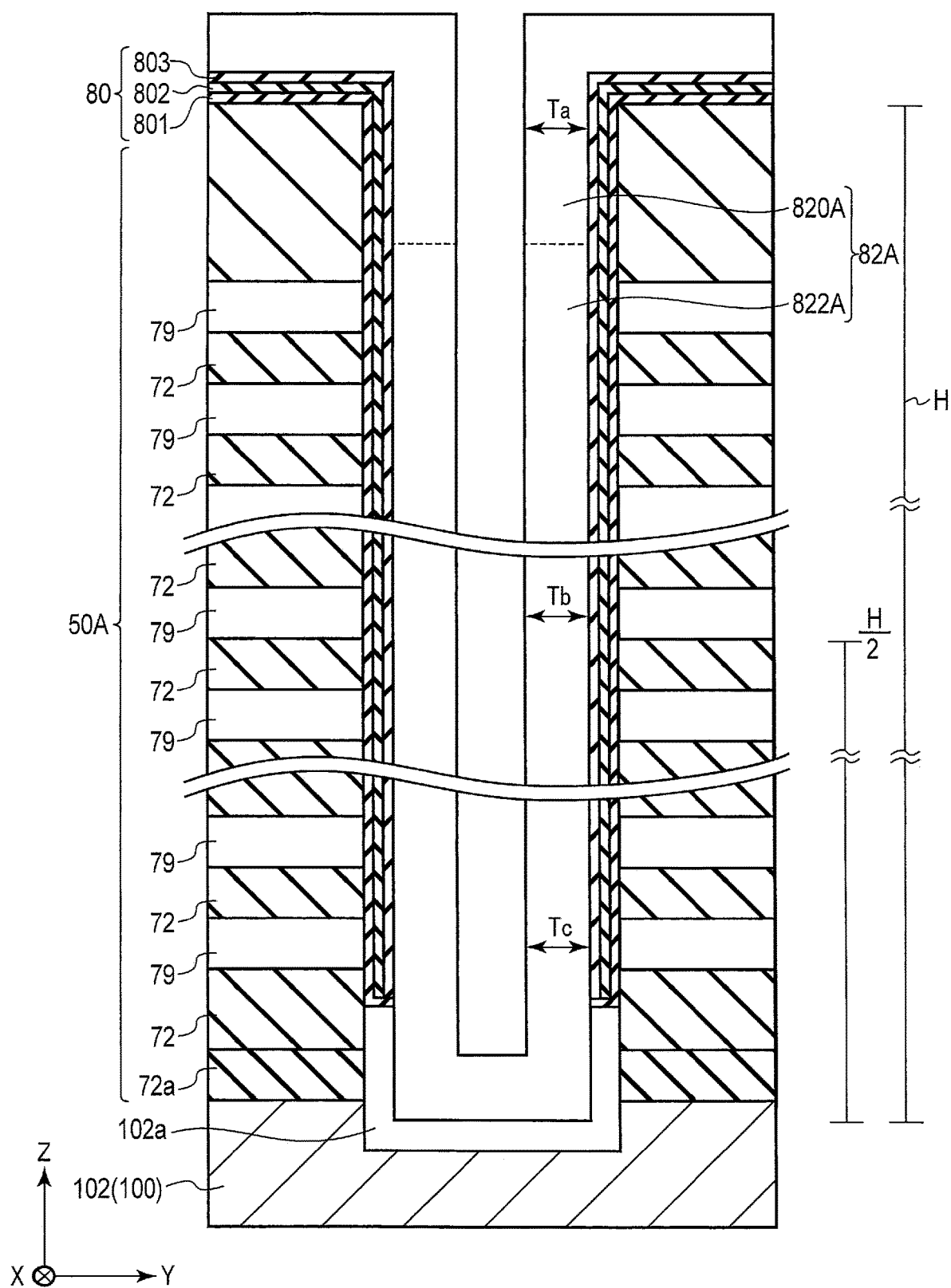
FIG. 11 is a cross-sectional process diagram showing a step of the method for manufacturing the semiconductor device according to the first embodiment.

As a result, in the silicon layer 82, the portion 820A into which ions have been injected changes through the amorphization process from a polycrystalline state to an amorphous state, as illustrated in FIG. 11. The portion 822A of the silicon layer 82, into which ion injection (irradiation) was not conducted (or the portion that was not exposed to the plasma) during the amorphization process, maintains the polycrystalline state.

The amorphous portion (amorphous silicon layer) 820A and polycrystalline portion (polysilicon layer) 822A are continuous layers.

Here, the thickness Ta of the amorphous silicon layer 820A is substantially equal to the thickness Tb of the polysilicon layer 822A. Depending on the method (deposition method) of forming the silicon layer 82A and/or the amorphization process, the thickness Ta of the upper portion of the silicon layer 82A (amorphous silicon layer 820A) may be larger than the thickness Tb of the lower portion of the silicon layer 82A (polysilicon layer 822A).

The amorphous silicon layer 820A contains, as impurities, the ion species used for the ion injection. For this reason, the impurity concentration (e.g., boron or carbon concentration) of the amorphous silicon layer 820A is higher than the impurity concentration of the polysilicon layer 822A.

If BF$_2$ is used for the ion injection, the amorphous silicon layer 820A contains boron and may also contain fluorine.

When the amorphous silicon layer 820A is formed through plasma processing, ion injection with the above-mentioned ion species (e.g., boron or carbon ion injection) may be executed upon the amorphous silicon layer 820A after the plasma processing.

Figure 12:
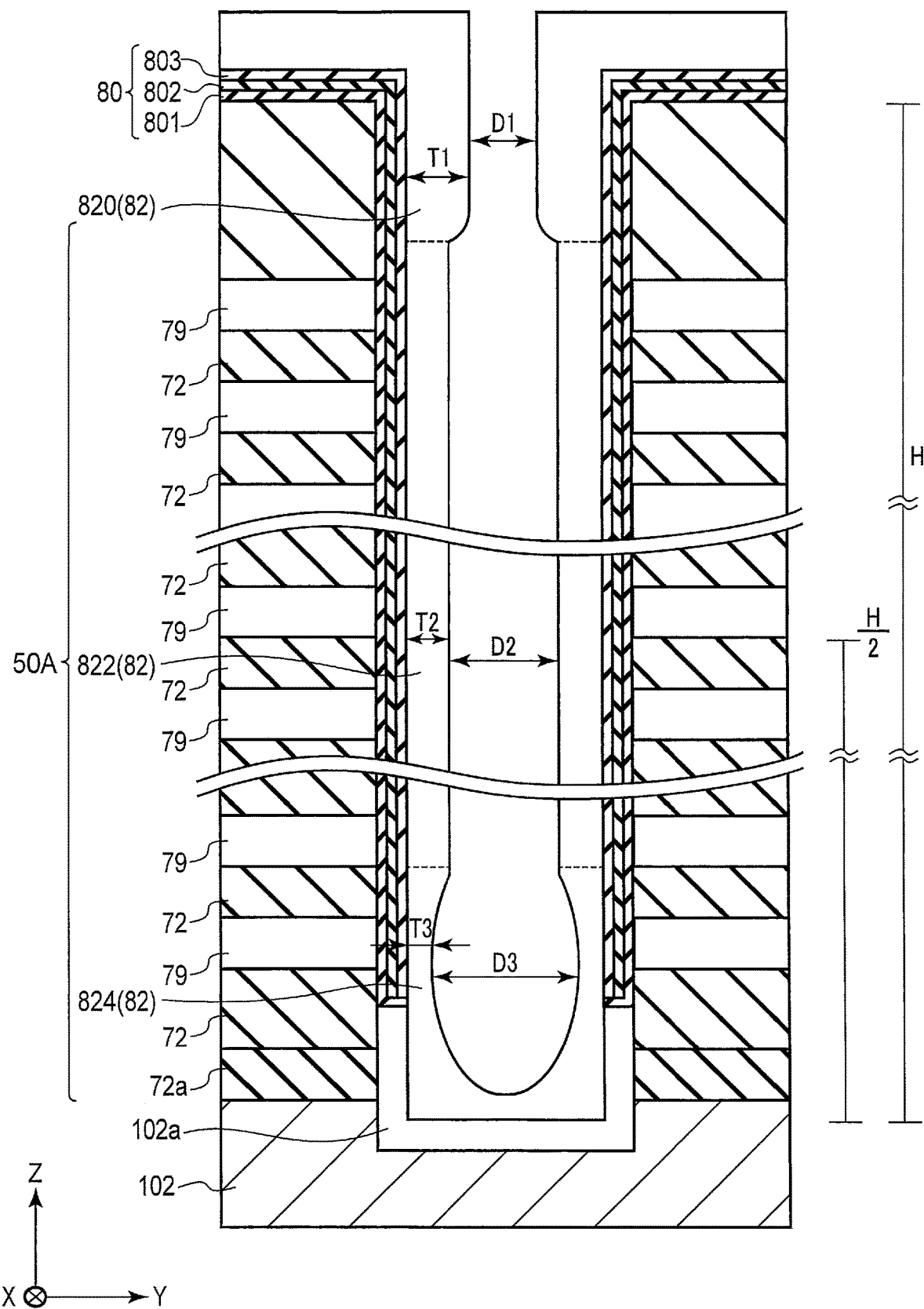
FIG. 12 is a cross-sectional process diagram showing a step of the method for manufacturing the memory device according to the first embodiment.

As illustrated in FIG. 12, after the amorphization process upon the upper portion of the silicon layer 82, slimming is executed upon the silicon layer 82. The slimming of the silicon layer 82 is executed by RIE, wet etching, gas etching or chemical dry etching (CDE). In this manner, the thickness of the silicon layer 82 is reduced.

The upper silicon layer 820 of the silicon layer 82 has a relatively flat surface. The upper silicon layer 820 is therefore etched in a relatively uniform manner.

Even under the same etching conditions, different impurity concentrations (e.g., boron or carbon) in the silicon layer 82 may create differences in the etch rate among the portions 820, 822, 824 of the silicon layer 82. For instance, the etch rate of the silicon layer 820 having a relatively high boron (or carbon) concentration as a condition of etching polysilicon is lower than the etch rate of the polysilicon layers 822 and 824 having boron concentrations lower than that of the polysilicon layer 820.

For this reason, when the upper silicon layer contains boron and/or carbon, the thickness T1 of the upper silicon layer 820 becomes larger than the thickness T2 of the middle silicon layer 822A in the silicon layer 82 through the slimming process of the silicon layer 82.

When wet etching (isotropic etching) is adopted for slimming of the silicon layer 82, the polysilicon layer 824 on the bottom side of the memory hole MH (lower side of the layer stack 50A) may be etched to a larger degree than the polysilicon layer 822 near the middle portion of the memory hole MH (near the middle portion of the layer stack 50A). If this is the case, the thickness T3 of the polysilicon layer (lower silicon layer) 824 on the bottom side of the memory hole MH is smaller than the thickness T2 of the polysilicon layer (middle silicon layer) 822 near the middle portion of the memory hole MH. The lower polysilicon layer 824 has a curved surface. The exposed surface of the lower polysilicon layer 824 becomes U-shaped.

In the opening of the memory hole MH (two adjacent layer stacks), the distance D1 between the amorphous silicon layers 820 in the Y direction (or X direction) is smaller than the distance D2 between the polysilicon layers 822 in the Y direction. Thus, in the memory hole MH, the dimension D1 of the space in the upper portion (opening) of the memory hole MH in the Y direction (or X direction) is smaller than the dimension D2 of the space in the middle portion of the memory hole MH in the Y direction. The dimension D3 of the space in the lower portion (bottom portion) of the memory hole MH in the Y direction may be larger than the dimension D2 of the space in the middle portion of the memory hole MH in the Y direction.

In the amorphized portion 820A of the silicon layer 82, differences in the etch rates associated with the crystalline surface, crystalline grains, and grain boundary of the silicon subjected to the etching can be reduced. Thus, the amorphous silicon layer 820A can be etched in a relatively uniform manner. In the upper portion of the layer stack 50A, the insulating layer 75 on the opening side of the memory hole MH is covered by the silicon layer 822 having a relatively large thickness T1.

As illustrated in FIG. 13, after slimming of the silicon layer, the core layer (e.g., silicon oxide layer) 84 is provided on the silicon layer 82. In this manner, a core layer 84 is formed in the memory hole MH.

The opening of the memory hole MH may be clogged by the core layer 84 on the amorphous silicon layer 820 before the memory hole MH is filled with the core layer 84 on the polysilicon layer 822. When this happens, an air gap 90 is generated in the memory hole MH (memory pillar MP). As a result, the memory pillar MP has a structure containing an air gap 90 inside the core layer 84.

The top end PP of the air gap 90 is positioned on the substrate 100 side with respect to the lower end of the amorphous silicon layer 820 (on the lower side of the memory pillar).

As illustrated in FIG. 14, the core layer 84 is etched (etched back). This retrogrades the position of the upper end of the core layer 84 toward the substrate 100 with respect to the upper portion of the layer stack 50A (the upper surface of the insulating layer 75).

As previously mentioned, the portion 820 of the silicon layer 82 on the upper portion side is an amorphous silicon layer 820. The upper surface (exposed surface) of the amorphous silicon layer 820 is relatively uniform (flattened). The amorphous silicon layer 820 having a relatively large thickness overlays the upper portion of the layer stack 50A.

Thus, at the time of etching, even if the core layer (silicon oxide) 84 is subjected to the silicon oxide etching, with the relatively thick amorphous silicon layer 820 overlaying the upper portion of the layer stack 50A, defects in the layer stack and memory layer (e.g., the pattern being broken and layers being etched in an unintended manner) that tend to be caused by unevenness of the upper silicon layer (e.g., defects due to a partially thinned portion of the silicon layer and/or variation in the etch rate due to variation in the crystallinity) can be suppressed.

As illustrated in FIG. 15, a silicon layer 86A is formed on the layer stack 50A and core layer 84. The silicon layer 86A is an amorphous silicon layer.

Figure 16:
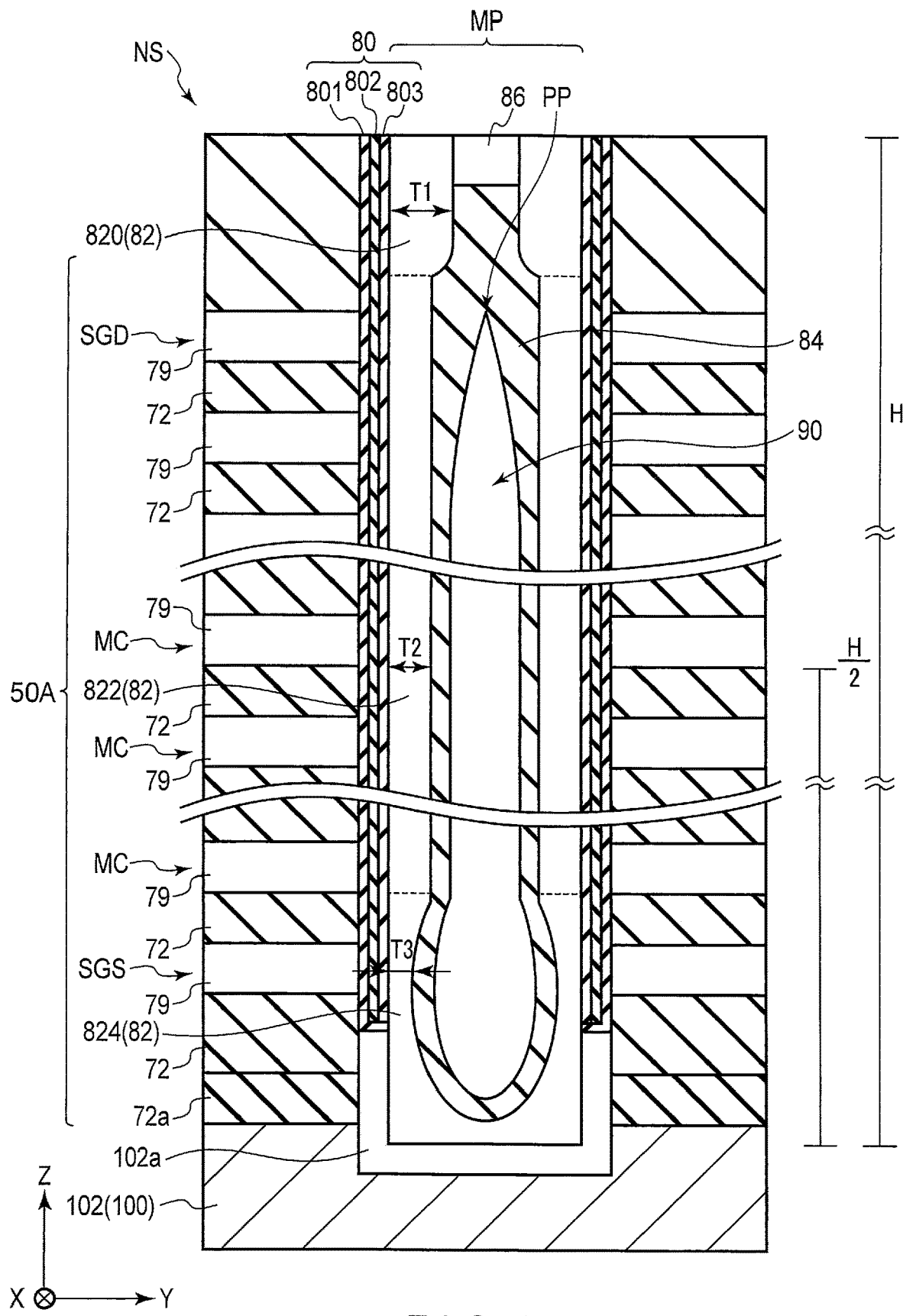
FIG. 16 is a cross-sectional process diagram showing a step of the method for manufacturing the memory device according to the first embodiment.

As illustrated in FIG. 16, the amorphous silicon layer 86, silicon layer 822, and memory layer 80 are removed from the upper surface of the layer stack 50A, for example, by RIE. As a result, the memory pillar MP and memory layer 80 are formed in the memory hole MH of the layer stack 50A.

Thereafter, slits (not shown) are formed in the boundary portions between the end portions of the layer stack and the string units. With the etching through the slits, the sacrificial layers 79 are selectively removed. Conductive layers are formed in the space between the insulating layers 72 of the layer stack. This forms word lines WL and select gate lines SGD and SGS.

As a result, memory cells MC are formed at positions where the conductive layers 70 serving as word lines WL face the memory pillar MP, as illustrated in FIG. 6. A select transistor ST1 is formed at a position where the conductive layer 70 serving as a select gate line SGD faces the memory pillar MP. A select transistor ST2 is formed at a position where the conductive layer 70 serving as a select gate line SGS faces the memory pillar MP.

After the formation of the conductive layers 70, an insulating layer (not shown) is embedded in the slit.

A plurality of contacts are formed so as to establish connections with the memory pillar and conductive layers 70. Interconnects (e.g., bit lines) are formed to be coupled to the contacts.

The amorphous silicon layer 820 in the memory pillar MP may be crystallized (micro-crystallized) with the heat applied to the silicon layer during the process of manufacturing the NAND flash memory. This transformation from the amorphous silicon layer 820 to a microcrystalline silicon layer, however, occurs only after the etching of the core layer 84. Thus, the flatness of the silicon layer 82 can be maintained at the time of etching the core layer 84.

With the heat during the manufacturing process, argon, xenon or fluorine contained in the ion species of the ion injection may be desorbed from the silicon layer 820.

With the above manufacturing method, the NAND flash memory according to the present embodiment is completed.

(c) Summary

As described above, in the NAND flash memory 1 according to the present embodiment, the silicon layer 82 in the upper portion of a memory pillar MP of a NAND string NS includes an amorphous silicon layer 820.

With the method for manufacturing the NAND flash memory according to the present embodiment, the amorphous silicon layer 820 is formed by injecting ions into the silicon layer (polysilicon layer).

The silicon layer subjected to the ion injection is amorphized, which homogenizes and flattens the surface of the silicon layer (amorphous silicon layer).

FIG. 17 is a graph showing the relationship between the dose amount of the ion injection in the silicon layer and the surface roughness of the silicon layer.

In the graph of FIG. 17, the horizontal axis (on a logarithmic scale) corresponds to the dose amount (in $cm^{-2}$), while the vertical axis corresponds to the surface roughness Rq (in nanometers) of the silicon layer.

In the experiment of FIG. 17, boron (B), argon (Ar), carbon (C), and boron fluoride ($BF_2$) are adopted as ion species for the ion injection.

For instance, the surface roughness Rp of the non-doped polysilicon layer prior to the etching (slimming) is approximately 0.6 nm. The surface roughness of the non-doped polysilicon layer after the etching is preferably about 0.2 nm.

For respective ion species, if the dose amount exceeds $1 \times 10^{14}$ $cm^{-2}$, the surface roughness Rq of the silicon layer decreases as illustrated in FIG. 17. These results demonstrate that the ion injection into the silicon layer (amorphization of the silicon layer) has homogenized and flattened the surface of the silicon layer.

In this manner, the amorphization of the silicon layer enhances the flatness of the silicon layer.

As a result, the etching of the silicon layer can be achieved in a relatively homogeneous manner.

FIG. 18 is a graph showing the relationship between the mass number of the ion species used for the ion injection and the surface roughness of the silicon layer.

In the graph of FIG. 18, the horizontal axis corresponds to the mass number of the ion species used for the ion injection, while the horizontal axis corresponds to the surface roughness Rq (in nanometers) of the silicon layer.

The dose amounts for ion injection set to $1 \times 10^{14}$ $cm^{-2}$ and to $2 \times 10^{15}$ $cm^{-2}$ are indicated in FIG. 18.

As illustrated in FIG. 18, if an ion species having a relatively small mass number, such as boron, carbon and fluorine, is adopted, the surface roughness of the silicon layer is reduced when the dose amount is set to approximately $2 \times 10^{15}$ $cm^{-2}$.

If an ion species having a relatively large mass number, such as argon and $BF_2$, is adopted, the surface roughness Rq of the silicon layer can be reduced when the dose amount is set to either $1 \times 10^{14}$ $cm^{-2}$ or $2 \times 10^{15}$ $cm^{-2}$.

FIG. 19 is a graph showing the relationship between the slimming amount of the silicon layer and the surface roughness of the silicon layer.

In the graph of FIG. 19, the horizontal axis corresponds to the slimming amount (etching amount) of the silicon layer (in a.u.), while the vertical axis corresponds to the surface roughness Rq (in nanometers) of the silicon layer. In FIG. 19, the dose amounts of respective ion species are set to $2 \times 10^{-15}$ $cm^{-2}$. When the slimming amount is 0 nm, no slimming is executed upon the silicon layer.

As illustrated in FIG. 19, the silicon layer subjected to the ion injection has a surface roughness between 0.15 nm and 0.3 nm, regardless of the slimming amount. This shows that the silicon layer amorphized by ion injection has a relatively flattened surface.

FIG. 20 is a graph showing the relationship between the dose amount of ion injection (doping) into the silicon layer and the etching amount of the silicon layer.

In the graph of FIG. 20, the horizontal axis (on a logarithmic scale) corresponds to the dose amount (in $cm^{-2}$), while the vertical axis corresponds to the etching amount (in a.u.).

The impurity concentration in the silicon layer exhibits a correlation with the dose amount of ion injection. In general, the impurity concentration in the silicon layer relating to the ion species of the ion injection increases as the dose amount of ion injection increases.

According to the present embodiment, the impurity concentrations that differ between the portions 820 and 822 of the silicon layer 82 create a difference in the etch rate between the portions 820 and 822.

As illustrated in FIG. 20, the etch rate of the silicon layer decreases as the impurity concentration of the silicon layer increases.

In the silicon layer 82 according to the present embodiment, the etch rate of the portion 820 having a higher impurity concentration is lower than the etch rate of the portion 822 having a lower impurity concentration.

For this reason, according to the present embodiment, a polysilicon layer 820 having a large thickness in comparison to the polysilicon layers 822 and 824 in the middle and lower portions of the layer stack is formed in the upper portion of the layer stack 50A.

If the silicon layer contains, for example, boron or carbon, the difference in etch rate of the silicon layer in accordance with the impurity concentration becomes pronounced.

Thus, the etch rates of the portions 820 and 822 of the polysilicon layer 82 can be controlled in accordance with the impurity concentration that varies in the polysilicon layer 82.

As a result, according to the present embodiment, the thickness T1 of the upper portion 820X of the polysilicon layer 82 can be determined to be larger than the thicknesses T2 and T3 of the middle portion 822 and lower portion 824 of the polysilicon layer 82.

As illustrated in FIGS. 17 to 19, in the flash memory according to the present embodiment, the silicon layer in the upper portion of the memory pillar is amorphized.

According to the present embodiment, the amorphized portion in the upper portion of the memory hole of the silicon layer enhances the flatness of the silicon layer (amorphous silicon layer) that overlays the upper portion of the layer stack. Thus, at the time of slimming (etching) the silicon layer, the silicon layer of the upper portion of the layer stack can be etched in a relatively homogeneous manner.

In addition, as illustrated in FIG. 20, according to the present embodiment, a desired impurity (e.g., boron or carbon) is selectively added to the silicon layer that overlays the upper portion of the layer stack. Thus, according to the present embodiment, through the slimming of the silicon layer, the silicon layer having a relatively large thickness remains on the upper portion of the layer stack.

Thus, in the flash memory according to the present embodiment, the pattern in the upper portion of the layer stack in the three-dimensionally structured memory cell array can be prevented from being collapsed. As a result, the present embodiment can suppress defects that tend to be produced in the flash memory.

Furthermore, with an ion species having a large mass number adopted for ion injection, the dose amount of ion injection for amorphization can be reduced. Thus, according to the present embodiment, the impurity concentration of the silicon layer 82 can be reduced. Furthermore, by adopting an ion species that does not act as an n-type or p-type dopant upon silicon, the amount of n-type or p-type dopant in the silicon layer will not increase in accordance with the ion injection. Preferably, an ion species inactive with respect to silicon and having a mass number larger than that of boron, such as argon and xenon, should be selected.

As a result, the NAND flash memory and its manufacturing method according to the present embodiment can suppress adverse influence (e.g., variation in the threshold voltage), which tends to be caused by the impurities in the silicon layer 82, on the transistors and memory cells.

In addition, according to the present embodiment, at the time of the etch-back processing upon the core layer, the air gap in the memory pillar (memory hole) is prevented from being exposed. As a result, according to the present embodiment, when forming a cap layer, distortion (breakage) of the pattern of the cap layer can be suppressed.

As described above, the present invention can improve yields of the memory devices.

(2) Second Embodiment

A memory device and a method for manufacturing such a memory device according to the second embodiment will be explained with reference to FIGS. 21 to 23.

(a) Structure

A structure of the memory device according to the second embodiment will be explained with reference to FIG. 21.

FIG. 21 is a schematic cross-sectional view explaining an exemplary structure of the memory device (e.g., NAND flash memory) according to the present embodiment.

As described above (see FIG. 20, for example), with the silicon layer of the upper portion of the memory pillar MP subjected to the ion injection, the surface condition and thickness of the upper silicon layer of the upper portion of the memory pillar MP can be controlled. If a silicon layer having a relatively large thickness can be provided on the upper portion of the layer stack, the silicon layer on the upper portion of the layer stack does not need to be amorphized.

In this example, a silicon layer (upper silicon layer) 820X in the upper portion of the memory pillar MP (upper portion of the layer stack or upper portion of the memory hole) is a polysilicon layer, as illustrated in FIG. 21. The upper silicon layer 820X may partially include an amorphous silicon region or microcrystalline silicon region.

According to the present embodiment, the thickness T1 of the portion (polysilicon layer) 820X of the silicon layer 82 in the upper portion of the memory pillar MP is larger than the thickness T2 of the portion (polysilicon layer) 822 of the silicon layer 82 around the middle of the memory pillar MP.

The upper silicon layer 820X may contain at least one of boron and carbon.

The impurity concentration (e.g., boron concentration) of the upper silicon layer 820X is higher than the impurity concentration of the middle/lower silicon layers 822 and 824. When the upper silicon layer 820X contains boron, the upper silicon layer 820X may also contain fluorine in addition to boron.

(b) Manufacturing Method

The method for manufacturing the memory device according to the second embodiment will be explained with reference to FIGS. 22 and 23.

Figure 22:
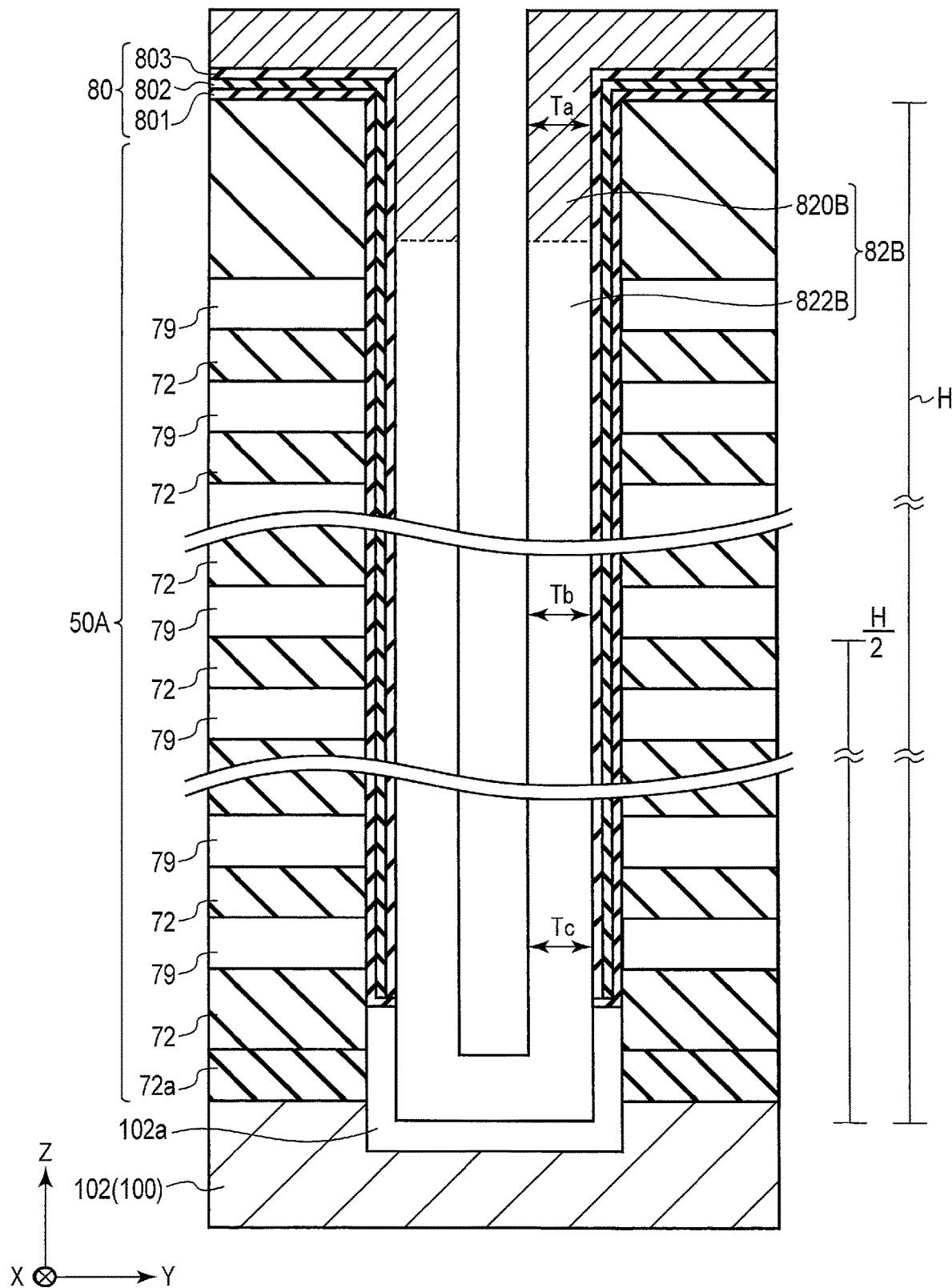
FIG. 22 is a cross-sectional process diagram showing a step of a method for manufacturing the memory device according to the second embodiment.
Figure 23:
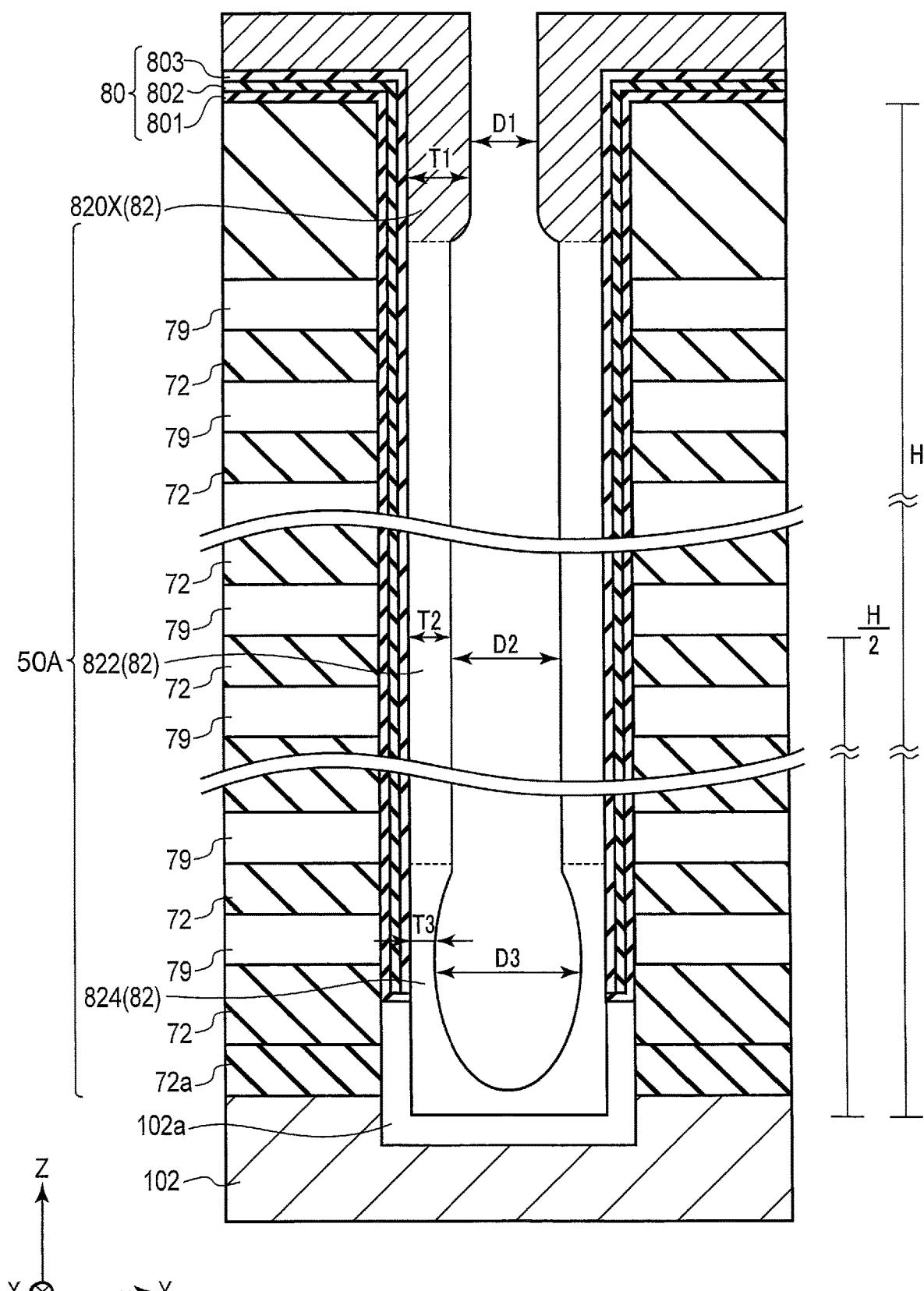
FIG. 23 is a cross-sectional process diagram showing a step of the method for manufacturing the memory device according to the second embodiment.

FIGS. 22 and 23 are schematic cross-sectional views showing the steps of the method for manufacturing the memory device (e.g., NAND flash memory) according to the present embodiment.

As illustrated in FIG. 22, a memory hole MH is formed in the layer stack 50A, in the same manner as in FIGS. 7 and 8.

After the formation of the memory hole MH, a memory layer 80 is formed on the layer stack 50A in the same manner as in the step of FIG. 9. The memory layer 80 includes a block insulating layer 801, a charge storage layer 802, and a tunnel insulating layer 803 in the same manner as in the first embodiment.

A silicon layer 82B is formed on the tunnel insulating layer 803 of the memory layer 80. The silicon layer 82B is thereby formed along the inner wall of the memory hole MH in the layer stack 50A. The silicon layer 82B is a polysilicon layer.

According to the present embodiment, after the formation of the polysilicon layer 82B, ion injection is conducted upon the polysilicon layer 82B, without undergoing amorphization. The ion species for the ion injection may contain boron and/or carbon. The dose amount of ion species containing boron or carbon is set between $10^{14}$ cm$^{-2}$ and $10^{15}$ cm$^{-2}$.

In this manner, impurities are added to the portion 820X of the polysilicon layer 82B on the upper portion of the layer stack 50A.

In accordance with the ion species for the ion injection, the impurity concentration of the portion 820X on the upper portion of the layer stack 50A is higher than the impurity concentration of the portion 822B of the polysilicon layer on the middle portion and bottom portion of the layer stack 50A.

$BF_2$ may be adopted for ion injection into the polysilicon layer 82. If this is the case, the portion 820X of the polysilicon layer 82 may contain fluorine in addition to boron. The fluorine concentration in the portion 820X is lower than the boron concentration in the portion 820X.

In the description below, of the polysilicon layer 82B that overlays the layer stack 50A, a portion 820B configured to have a relatively high impurity concentration due to the ion injection will be referred to as a high impurity concentration polysilicon layer 820B. Of the polysilicon layer 82B, a portion 822B other than the high impurity concentration polysilicon layer 820B (e.g., polysilicon layer on the middle portion and bottom portion of the layer stack 50A) will be referred to as a low impurity concentration polysilicon layer 822B.

After the ion injection into the silicon layer, etching is performed upon the polysilicon layer 82B for slimming of the polysilicon layer 82B, as illustrated in FIG. 23.

As described above, according to the present embodiment, the difference in the impurity concentrations (boron or carbon concentrations) in the silicon layer 82B creates a difference in etch rates of the portions 820B, 822B of the silicon layer 82B.

The etch rate of the high impurity concentration polysilicon layer 820B is lower than the etch rate of the low impurity concentration polysilicon layers 822B.

For this reason, the polysilicon layer 82B is deposited on the layer stack 50A (in the memory hole MH) with the thickness T1 of the high impurity concentration polysilicon layer 820B being larger than the thicknesses T2 and T3 of the low impurity concentration polysilicon layers 822B.

As a result, the dimension D1 of the space in the upper portion of the memory hole MH in the direction parallel to the surface of the substrate 100 is smaller than the dimension D2 of the space in the bottom portion of the memory hole MH in a direction parallel to the surface of the substrate 100.

In the same manner as in the first embodiment, when the slimming of the polysilicon layer 82 is executed by wet etching (isotropic etching), the thickness T3 of the portion 824 of the polysilicon layer 82 in the bottom portion of the memory hole MH may become smaller than the thickness T2 of the portion 822 of the polysilicon layer 82 around the middle portion of the memory hole MH.

Thereafter, in the same manner as in FIGS. 12 to 16, a core layer 84 is formed on the silicon layer 82. An air gap 90 may be formed in the memory pillar MP to be surrounded by the core layer 84. The top end of the air gap 90 is positioned toward the bottom portion of the memory pillar MP with respect to the lower portion of the high impurity concentration silicon layer 820X.

The etch-back processing (etching) is performed upon the core layer (silicon oxide layer) 84. Here, the upper portion of the layer stack 50A is covered by the polysilicon layer (high impurity concentration polysilicon layer) 820X having a relatively large thickness. In addition, the high impurity concentration polysilicon layer 820X has a relatively flat surface. Thus, under the conditions of etching the core layer 84, defects can be prevented from being produced in the upper portion of the layer stack 50A.

In the aforementioned manner, a cap layer (amorphous silicon layer) 86 is formed in the upper portion of the core layer 84. After the replacement of the sacrificial layers 79 with the conductive layers 70, contacts are suitably formed.

With the above manufacturing method, the NAND flash memory according to the present embodiment is completed.

(c) Summary

As described above, in the NAND flash memory 1 according to the present embodiment, the impurity concentration of the polysilicon layer 820X in the upper portion of the memory pillar MP of the NAND string NS is higher than the impurity concentrations of the polysilicon layers 822 and 824 in the lower portion of the memory pillar MP.

As a result, according to the present embodiment, after the process of etching the polysilicon layer, a polysilicon layer 820X having a relatively large thickness remains on the layer stack 50A.

In this manner, the NAND flash memory and manufacturing method thereof according to the present embodiment can suppress defects in the layer stack 50A at the time of etching the core layer.

Thus, the memory device and manufacturing method thereof according to the second embodiment can improve the yield of the memory device.

(3) Modification Examples

Memory devices according to modification examples of the present embodiment will be explained with reference to FIGS. 24 and 25.

Figure 24:
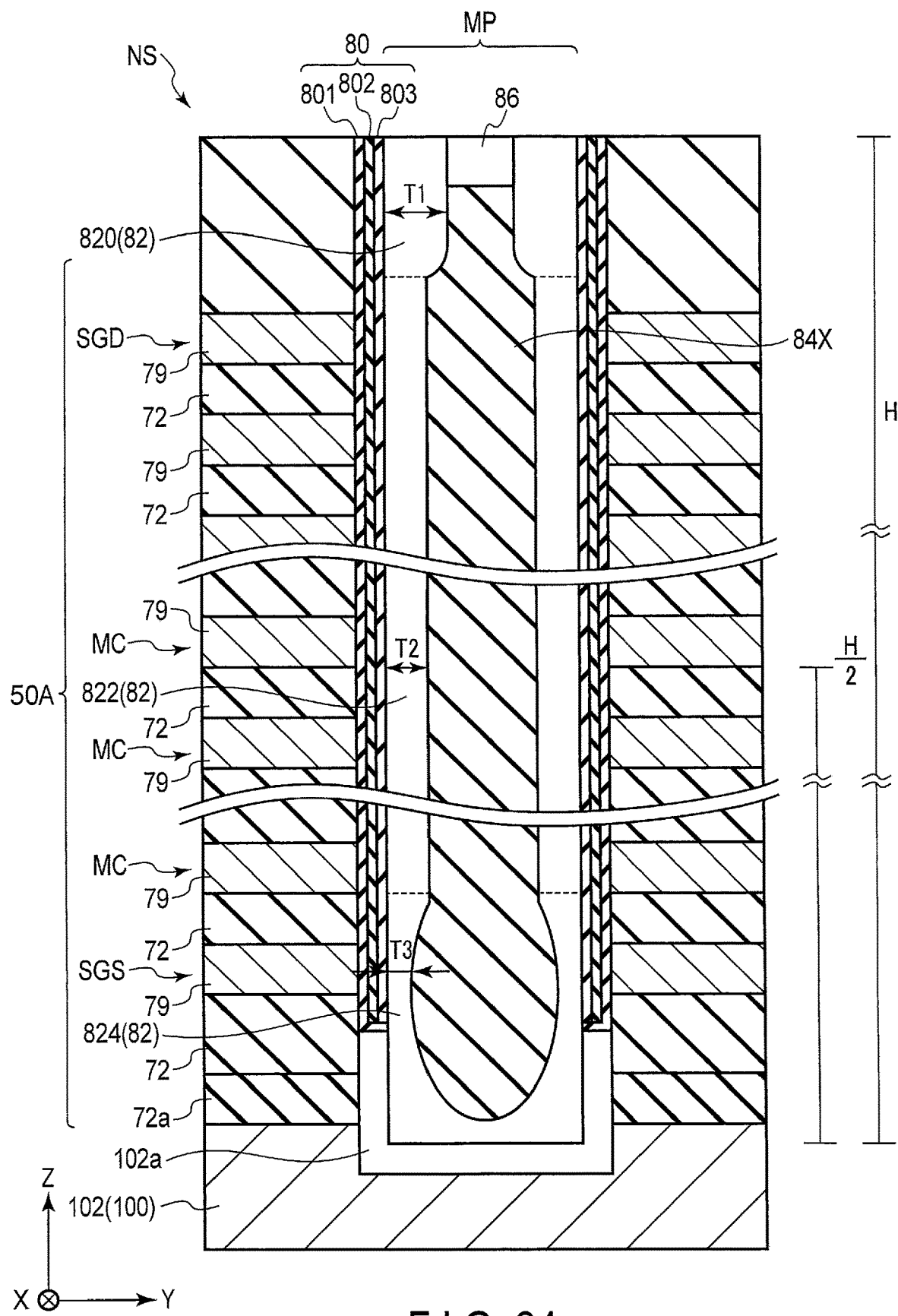
FIG. 24 is a cross-sectional view of a memory device according to a modification example of the embodiment.

FIG. 24 is a cross-sectional view of a NAND flash memory according to a modification example of the embodiment.

As illustrated in FIG. 24, an air gap does not need to be provided inside the memory pillar MP. In the memory pillar MP, the region between the silicon layers 82 is filled with a core layer (e.g., silicon oxide layer) 84X.

In the NAND flash memory of this modification example, the thickness T1 of the upper silicon layer 820 is larger than the thickness T2 of the middle silicon layer 822 in the memory pillar MP, in the same manner as in the NAND flash memories according to the first and second embodiments. The thickness T3 of the lower silicon layer 824 may be smaller than the thickness T2 of the middle silicon layer 822.

The impurity concentration of the upper silicon layer 820 may be higher than the impurity concentration of the middle silicon layer 822. The upper silicon layer 820 is an amorphous layer, a microcrystalline layer, or a polycrystalline layer.

Figure 25:
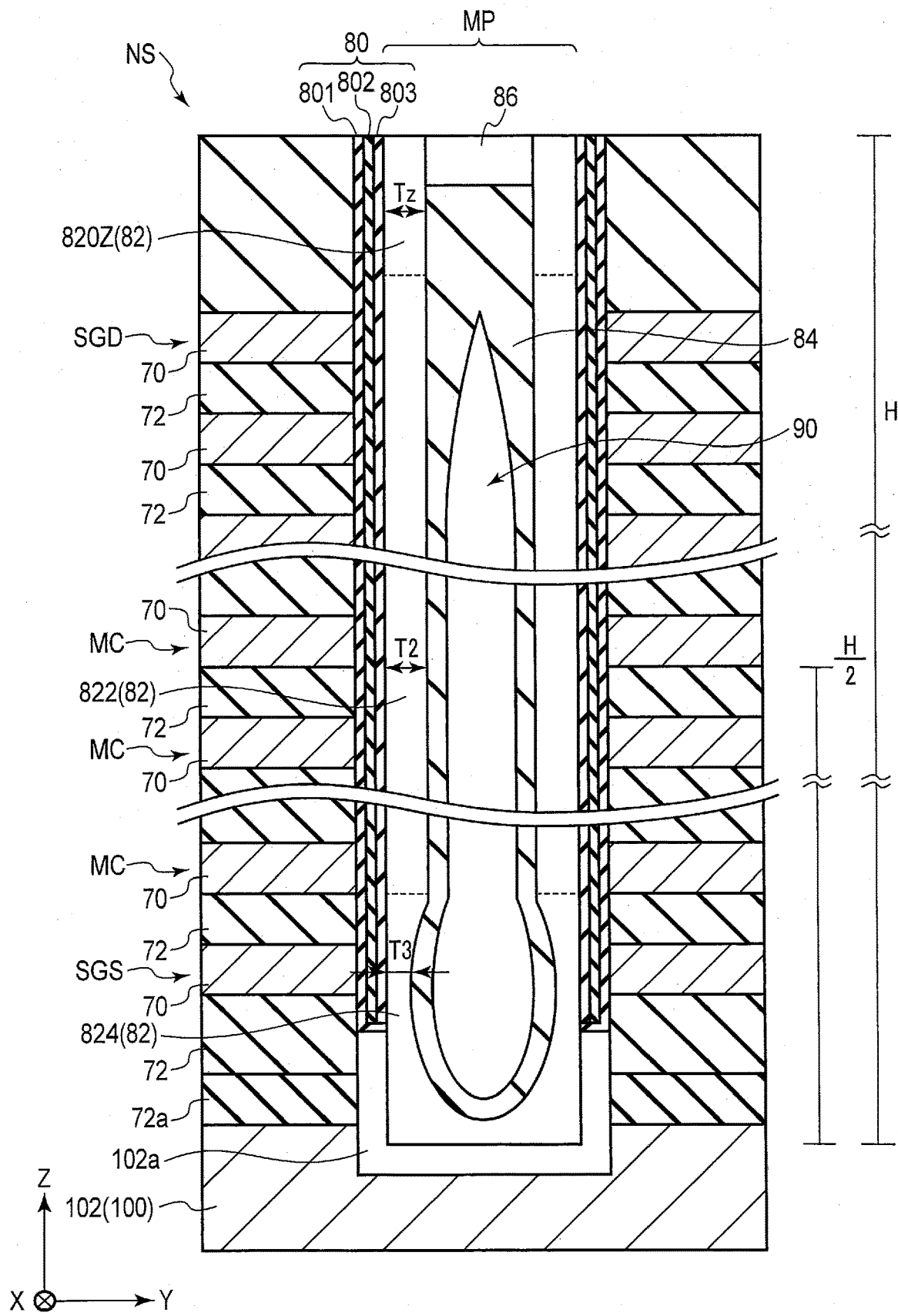
FIG. 25 is a cross-sectional view of a memory device according to a modification example of the embodiment.

FIG. 25 is a cross-sectional view of a NAND flash memory according to another modification example of the embodiment.

As illustrated in FIG. 25, the thickness Tz of the upper silicon layer 820Z may be substantially equal to the thickness T2 of the middle silicon layer 822 and the thickness T3 of the lower silicon layer 824, depending on the processing method for amorphization (e.g., plasma processing) and the ion species and dose amount of the ion injection.

In the example of FIG. 25, the upper silicon layer 820Z is an amorphous silicon layer, while the middle and lower silicon layers 822 and 824 are polysilicon layers.

The amorphous silicon layer 820Z is formed by plasma processing. In this case, the impurity concentration of the upper silicon layer 820Z may be substantially equal to the impurity concentrations of the middle and lower silicon layers 824. The amorphous silicon layer 820Z may be formed by ion injection into the polysilicon layer.

The thickness of the lower silicon layer 824 may be substantially equal to the thickness of the middle silicon layer 822 (and the thickness of the upper silicon layer 820Z), depending on the processing method for slimming the silicon layer 82.

The memory devices according to these modification examples can achieve effects similar to those of the first and second embodiments.

(4) Third Embodiment

A memory device and a method for manufacturing such a device according to the third embodiment will be explained with reference to FIGS. 26 to 31.

(a) Structure

A structure of the memory device according to the third embodiment will be explained with reference to FIG. 26.

FIG. 26 is a schematic cross-sectional view explaining an exemplary structure of the memory device according to the present embodiment.

As discussed above, the surface condition and thickness of the upper silicon layer of the memory pillar MP can be controlled through the injection of impurities into the upper silicon layer of the memory pillar MP. The silicon layer into which impurities are injected, however, is not limited to the silicon layer 82. The silicon layer into which impurities are injected may be a protective layer (silicon layer), which is formed on the memory layer 80 in order to protect the memory layer 80 on the inner wall (side surface) of the memory hole MH from being removed (or deteriorated) when removing the memory layer 80 from the bottom portion of the memory hole MH.

According to the present embodiment, the silicon layer of the upper portion of the memory pillar MP (the upper portion of the layer stack or the upper portion of the memory hole MH) includes an upper silicon layer 81 and an upper silicon layer 820Y, as illustrated in FIG. 26. The upper silicon layer 81 is a portion of the upper portion of the memory pillar MP that is formed on the memory layer 80, while the upper silicon layer 820Y is a portion that is formed on the upper silicon layer 81 in such a manner as to be in contact with the silicon layer 86 and the upper portion of the core layer 84. The upper silicon layer 820Y is a portion of the silicon layer 82 (polysilicon layer).

The upper silicon layer 81 may be a polysilicon layer in the same manner as the upper silicon layer 820Y, and may be indistinguishable from the upper silicon layer 820Y. The upper silicon layer 81 may possibly be an amorphous silicon region or a microcrystalline silicon region.

According to the present embodiment, the thickness T1b of the upper silicon layer 820Y may be approximately equal to the thickness T2 of the middle silicon layer 822. In addition, the thickness T1, which is the sum of the thickness T1a of the upper silicon layer 81 and the thickness T1b of the upper silicon layer 820Y, is larger than the thickness T2 of the portion (middle silicon layer) 822 of the silicon layer 82 around the middle of the memory pillar MP. In accordance with this, the grain sizes of the upper silicon layers 81 and 820Y are larger than the grain sizes of the middle and lower silicon layers 822 and 824.

The upper silicon layer 81 may contain as impurities at least one selected from boron, boron fluoride ($BF_2$), phosphorus, and argon. The impurity concentration (e.g., boron concentration) of the upper silicon layer 81 is higher than the impurity concentration of the middle and lower silicon layers 822 and 824.

The impurity concentration of the upper silicon layer 820Y is lower than the impurity concentration of the upper silicon layer 81. The impurity concentration of the upper silicon layer 820Y, however, may be substantially equal to the impurity concentration of the upper silicon layer 81. If the impurity concentration of the upper silicon layer 820Y is substantially equal to the impurity concentration of the upper silicon layer 81, the upper silicon layer 82 may contain at least one selected from boron, boron fluoride ($BF_2$), phosphorus, and argon, as impurities.

(b) Manufacturing Method

The method for manufacturing the memory device according to the third embodiment will be explained with reference to FIGS. 27 to 31.

Figure 27:
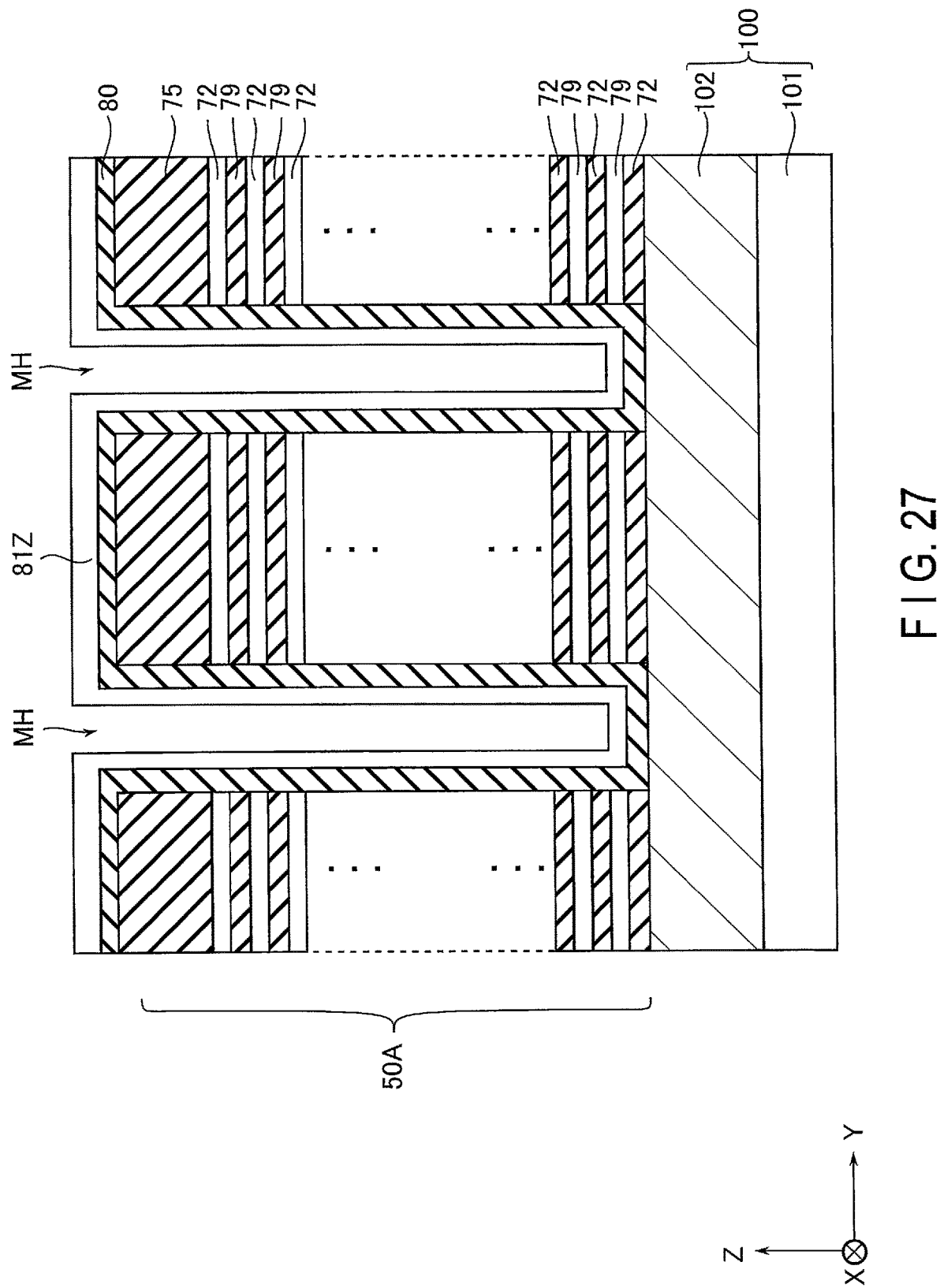
FIG. 27 is a cross-sectional process diagram showing a step of a method for manufacturing the memory device according to the third embodiment.

FIGS. 27 to 31 are schematic cross-sectional views showing the steps of the memory device being manufactured with the manufacturing method according to the present embodiment. FIG. 27 explains a step that follows the step of FIG. 8 explained in the first embodiment (where a memory hole MH is formed in the layer stack 50A).

As illustrated in FIG. 27, after the mask layer is removed, a memory layer 80 is formed on the upper surface of the layer stack 50A and the side surface of the layer stack 50A (inner walls of the memory holes MH) in the memory holes MH in the same manner as in FIG. 9.

After the formation of the memory layer 80, a silicon layer 81Z is formed on the memory layer 80 in order to remove the portion of the memory layer 80 from the bottom portion of the memory hole MH while protecting the memory layer 80 formed on the inner wall of the memory hole MH. The silicon layer 81Z is thereby formed along the inner wall of the memory hole MH in the layer stack 50A. The silicon layer 81Z may be a polysilicon layer.

Figure 28:
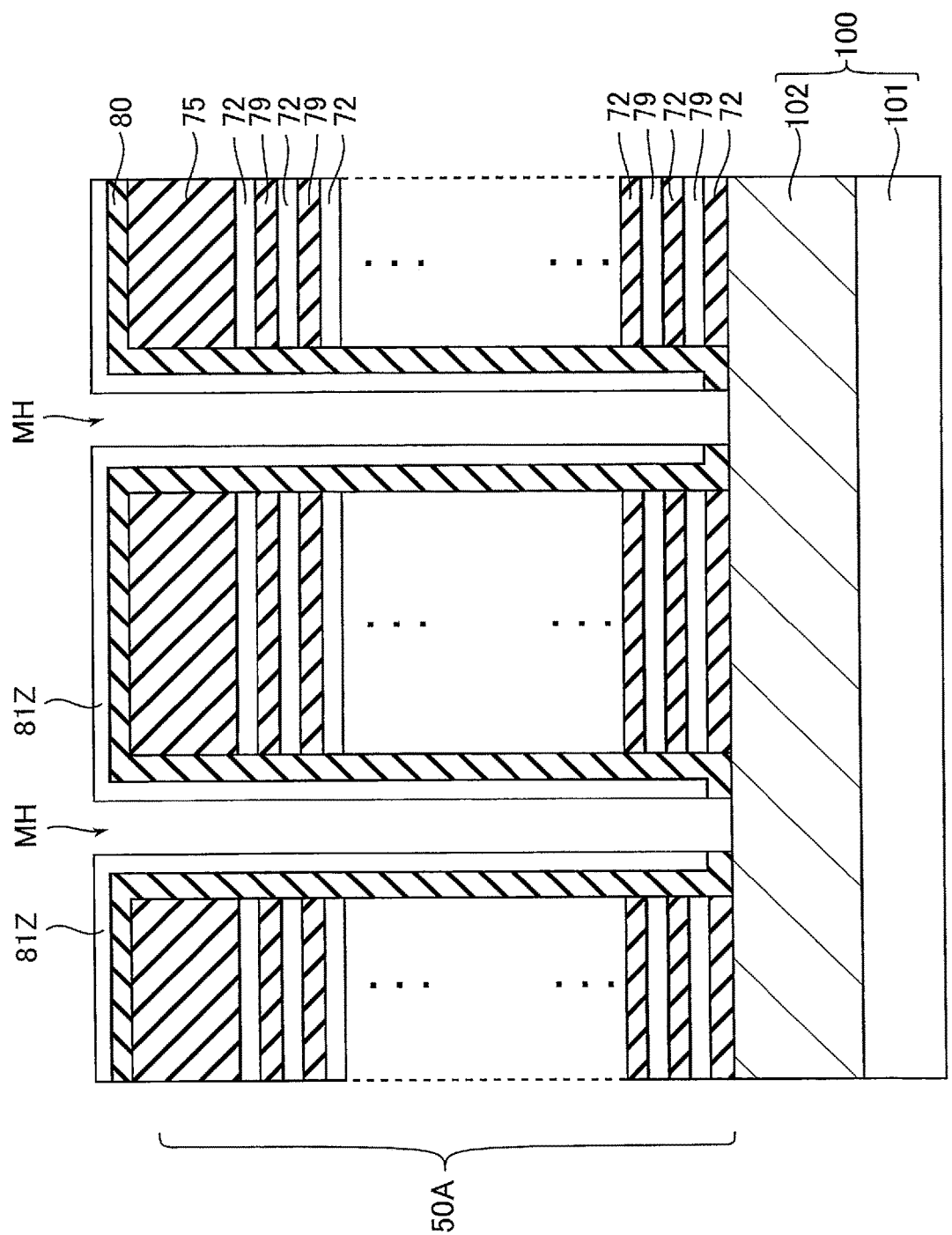
FIG. 28 is a cross-sectional process diagram showing a step of the method for manufacturing the memory device according to the third embodiment.

As illustrated in FIG. 28, the portions of the silicon layer 81Z and memory layer 80 formed in the bottom portion of the memory hole MH are selectively removed. Anisotropic etching, such as RIE, is adopted for this etching of the bottom portion of the memory hole MH. As a result, the bottom portion of the memory hole MH may reach the semiconductor layer 102.

Figure 29:
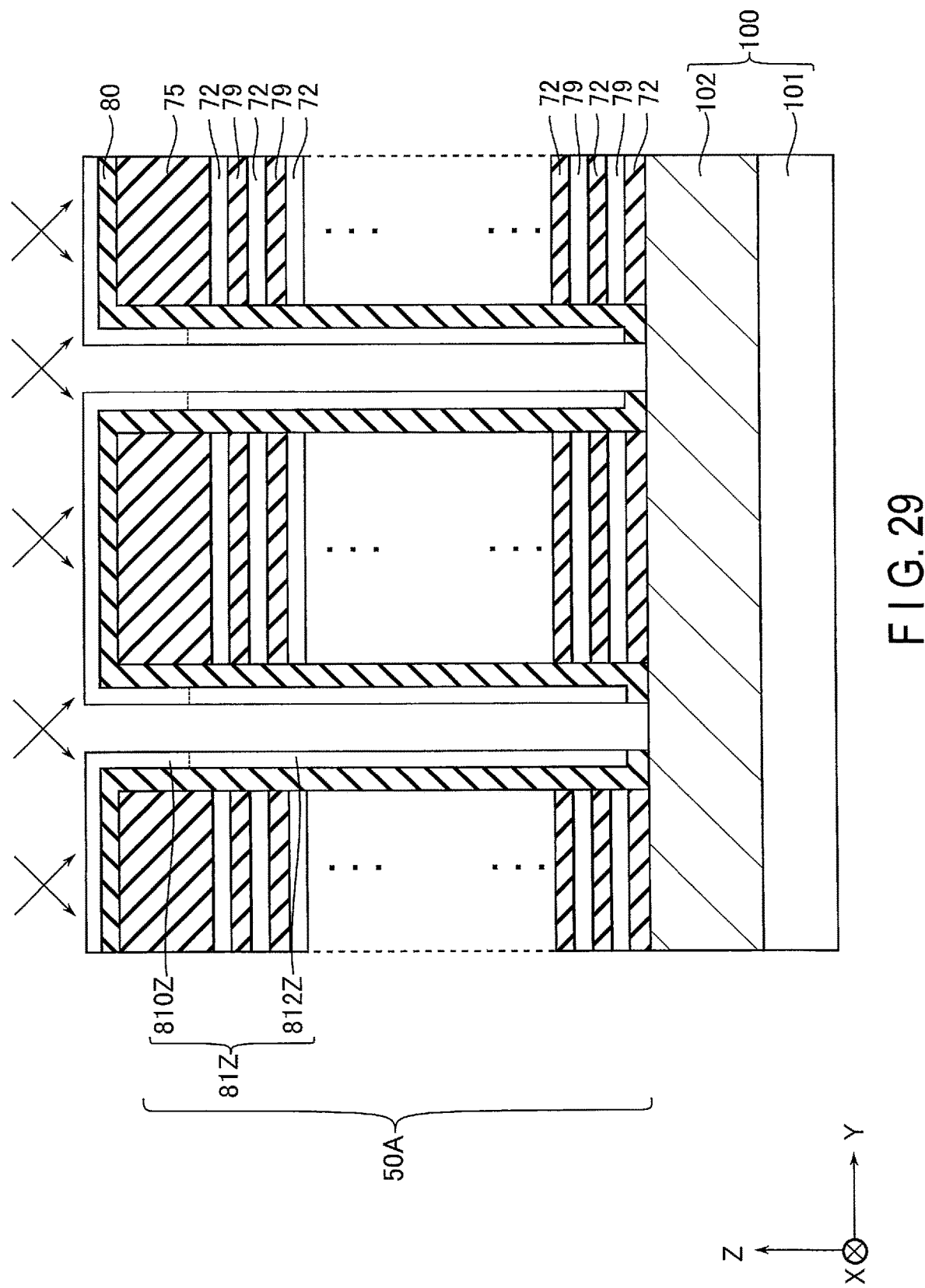
FIG. 29 is a cross-sectional process diagram showing a step of the method for manufacturing the memory device according to the third embodiment.

After the removal of the memory layer 80 from the bottom portion of the memory hole MH, impurities are injected into the silicon layer 81Z with the same method as in FIG. 10, prior to the removal of the silicon layer 81Z, as illustrated in FIG. 29. The impurities used for the impurity injection may contain at least one selected from boron, boron fluoride (BF₂), phosphorus, and argon.

In this manner, impurities are added to the portion (upper silicon layer) 810Z of the silicon layer 81Z in the upper portion of the layer stack 50A.

The impurity concentration of the upper silicon layer 8102 becomes higher than the impurity concentration of the portion 812Z of the silicon layer 81Z (the middle portion and bottom portion of the silicon layer) other than the upper silicon layer 810Z, in accordance with the impurities used for the impurity injection.

In the description below, of the silicon layer 81Z that overlays the upper surface of the layer stack 50A and the side surface of the memory hole MH, the upper silicon layer 810Z having a relatively high impurity concentration due to the impurity injection may be referred to as a high impurity concentration silicon layer 810Z. Of the silicon layer 81Z, a portion (the middle portion and bottom portion of the silicon layer) 812Z other than the high impurity concentration silicon layer 810Z may be referred to as a low impurity concentration silicon layer 8122.

Figure 30:
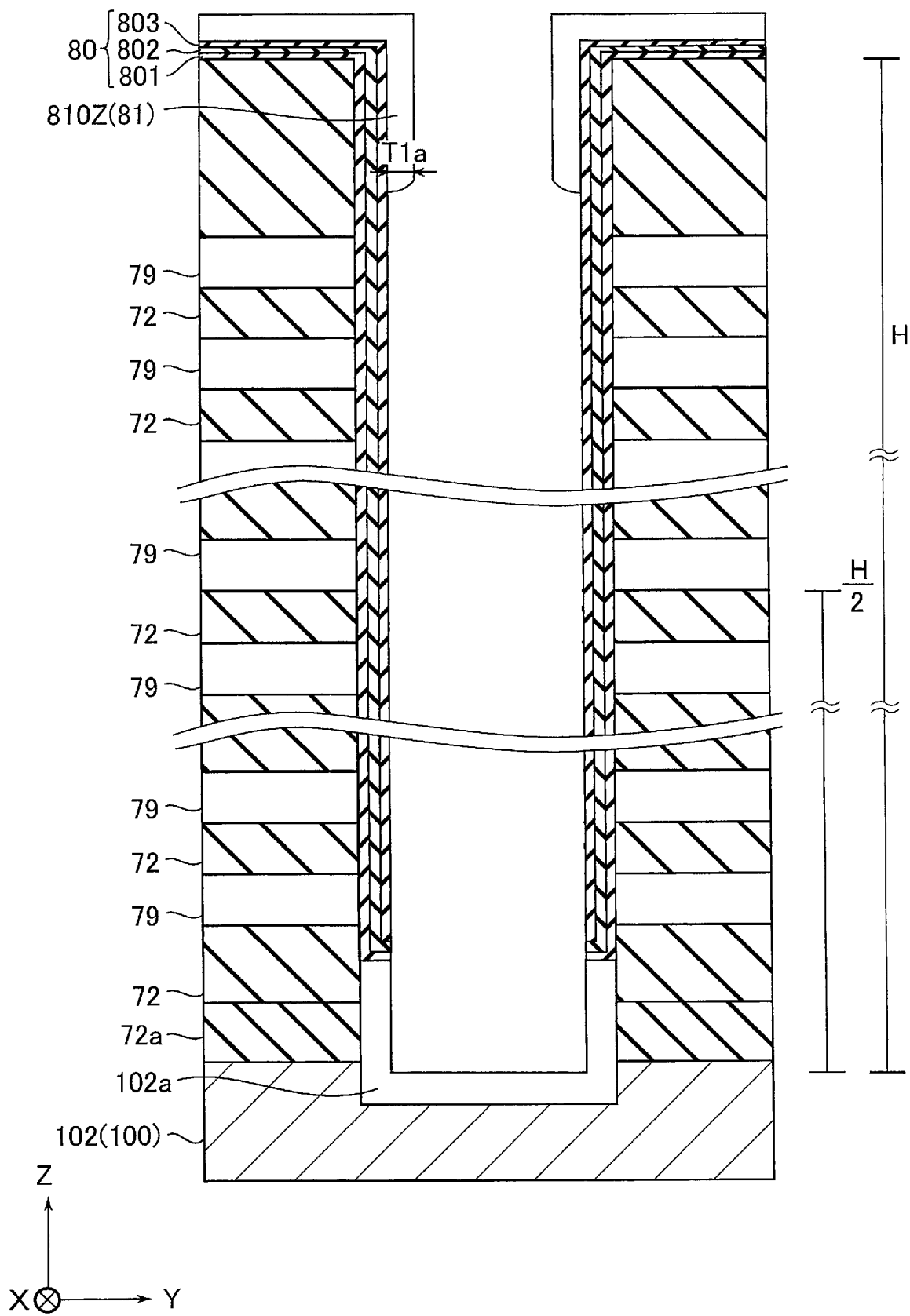
FIG. 30 is a cross-sectional process diagram showing a step of the method for manufacturing the memory device according to the third embodiment.

After the impurity injection into the upper silicon layer 8102, the silicon layer 81Z is etched to remove the low impurity concentration silicon layer 812Z, as illustrated in FIG. 30. For this etching, wet etching may be adopted.

According to the present embodiment, the wet etch rate (WER) of the silicon layer 81Z varies in accordance with the impurity concentrations in the silicon layer 81Z, between the high impurity concentration silicon layer 810Z and the low impurity concentration silicon layer 812Z. In particular, the WER of the high impurity concentration silicon layer 8102 is lower than the WER of the low impurity concentration silicon layer 812Z. As a result, when the low impurity concentration silicon layer 812Z is stripped from the memory layer 80, the high impurity concentration silicon layer 810Z (silicon layer 81) may remain on the memory layer 80 to have a thickness T1a.

It is preferable that the thickness T1a of the silicon layer 81 be made controllable. In other words it is preferable that, by setting the WER to a suitable value, the thickness T1a of the high impurity concentration silicon layer 810Z that remains after wet etching may be controlled to be set to a desired value.

For example, it is preferable that the etch rate of wet etching establish a correlation with the dose amount of impurities injected. Of boron, boron fluoride, phosphorus, and argon as the possible impurities, boron and boron fluoride establish a higher correlation between the dose amount and etch rate than phosphorus and argon. In particular, when boron or boron fluoride is injected as impurities, the thickness of the stripped silicon layer tends to be reduced (i.e. the thickness of the remaining silicon layer tends to increase) as the dose amount increases, in comparison to the case of phosphorus or argon being injected as impurities. For this reason, it is preferable that boron or boron fluoride be selected as impurities to be injected into the silicon layer 81.

Figure 31:
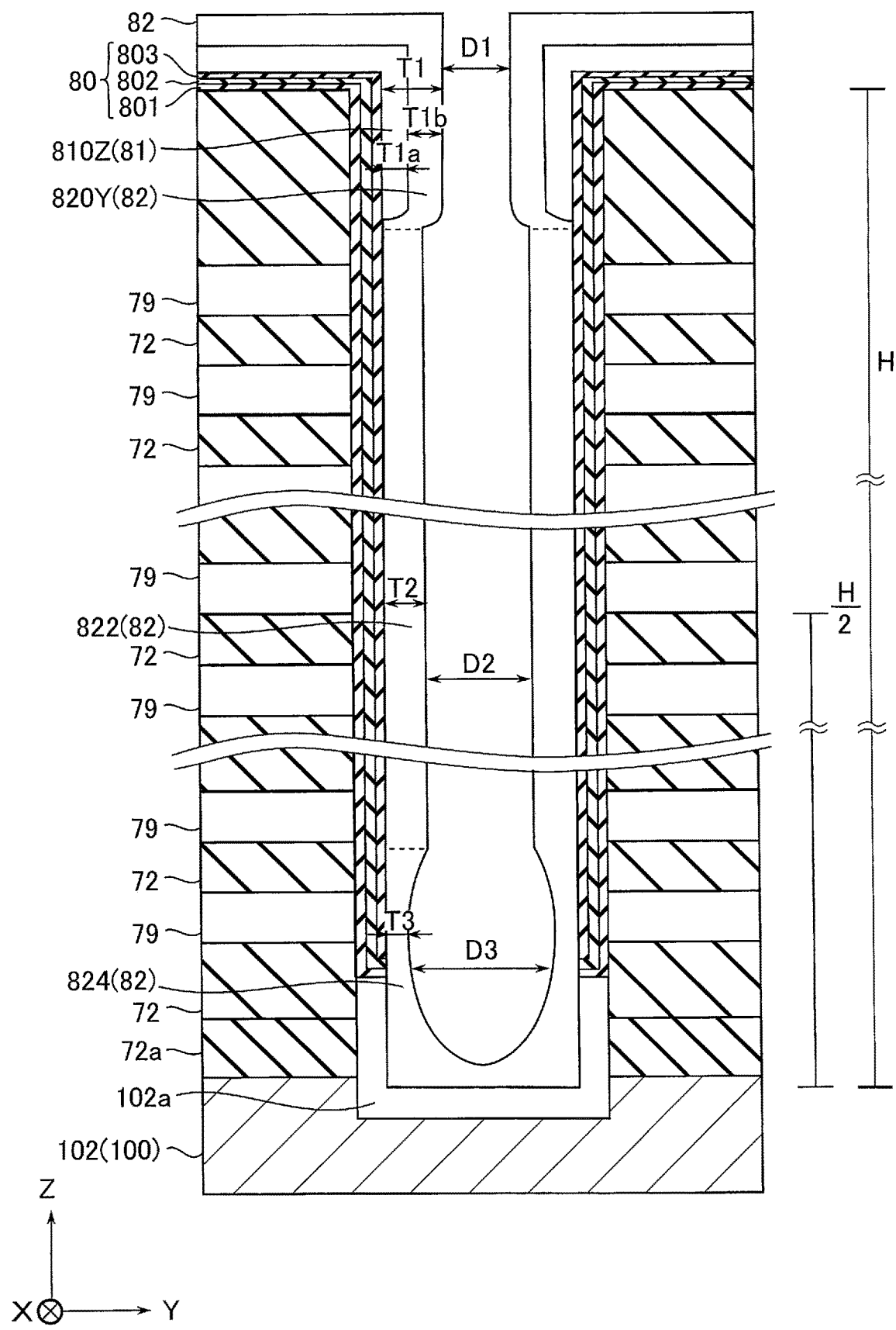
FIG. 31 is a cross-sectional process diagram showing a step of the method for manufacturing the memory device according to the third embodiment.

After the removal of the low impurity concentration silicon layer 812Z, a silicon layer 82 is formed on the upper surface of the high impurity concentration silicon layer 810Z and the side surface of the layer stack 50A in the memory hole MH (inner wall of the memory hole MH), as illustrated in FIG. 31.

Thus, the thickness of the silicon layer that is formed on the memory layer 80 in the upper portion of the memory hole MH is larger than the thickness of the silicon layer that is formed on the memory layer 80 in the middle portion and bottom portion of the memory hole MH, by a thickness T1a of the high impurity concentration silicon layer 810Z (corresponding to the upper portion silicon layer 81 of FIG. 26).

After the formation of the silicon layer 82, the silicon layer 82 is etched for slimming. The etch rate of the silicon layer 82 may be approximately equal on the upper portion side and on the middle/bottom portion side of the memory hole MH. As a result, the thickness T1b of the upper portion of the silicon layer 82 (corresponding to the upper silicon layer 820Y) after the slimming is approximately equal to the thickness T2 of the middle portion of the silicon layer 82 (corresponding to the middle silicon layer 822) after the slimming. This means that the thickness T1 is larger approximately by the thickness T1a than the thickness T2. In other words, the dimension D1 of the space in the upper portion of the memory hole MH in the direction parallel to the surface of the substrate 100 is smaller than the dimension D2 of the space in the middle portion of the memory hole MH in the direction parallel to the surface of the substrate 100.

As a result, the upper silicon layers 810Z and 820Y form a crystalline structure under the condition of a larger thickness than the middle and lower silicon layers 822 and 824. Thus, polysilicon having a larger grain size can be formed in the upper silicon layers 810Z and 820Y than in the middle and lower silicon layers 822 and 824.

If the slimming of the silicon layer 82 is executed by wet etching (isotropic etching) in the same manner as in the first embodiment, the thickness T3 of the portion 824 of the silicon layer 82 on the bottom portion side of the memory hole MH may become smaller than the thickness T2 of the portion 822 of the silicon layer 82 around the middle portion of the memory hole MH.

Thereafter, a core layer 84 is formed on the silicon layer 82 in the same manner as in the steps of FIGS. 12 to 16. An air gap 90 may be formed in the memory pillar MP to be surrounded by the core layer 84. The top end of the air gap 90 is positioned toward the bottom portion of the memory pillar MP with respect to the lower portion of the upper silicon layer 820Y.

The etch-back processing (etching) is performed upon the core layer (silicon oxide layer) 84. Here, the upper portion of the layer stack 50A is covered by the upper silicon layers 810Z and 820Y having a relatively large thickness. Thus, under the conditions of etching the core layer 84, defects can be prevented from being produced in the upper portion of the layer stack 50A.

In the aforementioned manner, a cap layer (amorphous silicon layer) 86 is formed on the upper portion of the core layer 84. After the replacement of the sacrificial layers 79 with the conductive layers 70, contacts are suitably formed.

With the above manufacturing method, the NAND flash memory according to the present embodiment is completed.

(c) Summary

As described above, in the NAND flash memory 1 according to the present embodiment, the impurity concentration of the upper silicon layer 8102 of the silicon layer 81Z formed at the step of manufacturing a memory pillar MP is higher than the impurity concentration of the middle portion and bottom portion of the silicon layer 812Z.

As a result, according to the present embodiment, the polysilicon layers 810Z and 820Y having a relatively large thickness remain on the layer stack 50A after the process of etching the polysilicon layer.

In this manner, the NAND flash memory and manufacturing method thereof according to the present embodiment can suppress defects in the layer stack 50A at the time of etching the core layer.

Thus, the memory device and manufacturing method thereof according to the third embodiment can improve the yield of the memory device.

(5) Fourth Embodiment

A memory device and a method for manufacturing such a device according to a fourth embodiment will be explained with reference to FIGS. 32 to 41.

(a) Structure

A structure of the memory device according to the fourth embodiment will be explained with reference to FIG. 32.

FIG. 32 is a schematic cross-sectional view explaining an exemplary structure of the memory device according to the present embodiment.

According to the first to third embodiments, defects in the layer stack are suppressed by controlling the thickness of the upper silicon layer in the memory pillar MP. Such defects in the layer stack, however, may be suppressed by reforming the material of the upper silicon layer of the memory pillar MP, without controlling its thickness.

According to the present embodiment, the upper portion of the memory pillar MP represents a portion above the core layer 84 in the direction perpendicular to the substrate 100, while the middle and lower portions represent the portions in which the core layer 84 extends, as illustrated in FIG. 32. The upper portion of the memory pillar MP (upper portion of the layer stack or upper portion of the memory hole MH) is formed into a reverse tapered shape. That is, the diameter of the upper portion of the memory pillar MH decreases as it ascends away from the substrate 100.

The upper portion of the memory pillar MP includes the upper portion of the silicon layer 82 (upper silicon layer 820), a cap layer 86, and a reformed silicon layer 820P. The reformed silicon layer 820P is a portion of the inner surface of the upper silicon layer 820, where the surface portion of the memory pillar MP is reformed. The reformed silicon layer 820P is formed between the inner surface of the upper silicon layer 820 and the outer surface of the cap layer 86, where the length of the reformed silicon layer 820P in a direction perpendicular to the substrate 100 is shorter than the upper silicon layer 820. In other words, the reformed silicon layer 820P is formed above the core layer 84, and has a lower end (lower surface or bottom surface) and side surface that are in contact with the upper silicon layer 820, and also has an inner surface that is in contact with the cap layer 86.

The cross section of the reformed silicon layer 820P taken along the plane parallel to the substrate 100 is shaped along the memory pillar MH. That is, when the cross section of the memory pillar MH is circular, the cross section of the reformed silicon layer 820P becomes cylindrical or annular. The reformed silicon layer 820P may contain at least one selected from nitrogen, carbon, and oxygen. In other words, the reformed silicon layer 820P contains at least one selected from a nitride, carbide and oxide of silicon.

(b) Manufacturing Method

The method for manufacturing the memory device according to the fourth embodiment will be explained with reference to FIGS. 33 to 43.

FIGS. 33 to 42 are schematic cross-sectional views showing the steps of the memory device being manufactured with the manufacturing method according to the present embodiment. FIG. 43 is a planar view of the memory pillar at the manufacturing step of FIG. 42 when viewed from above.

Figure 33:
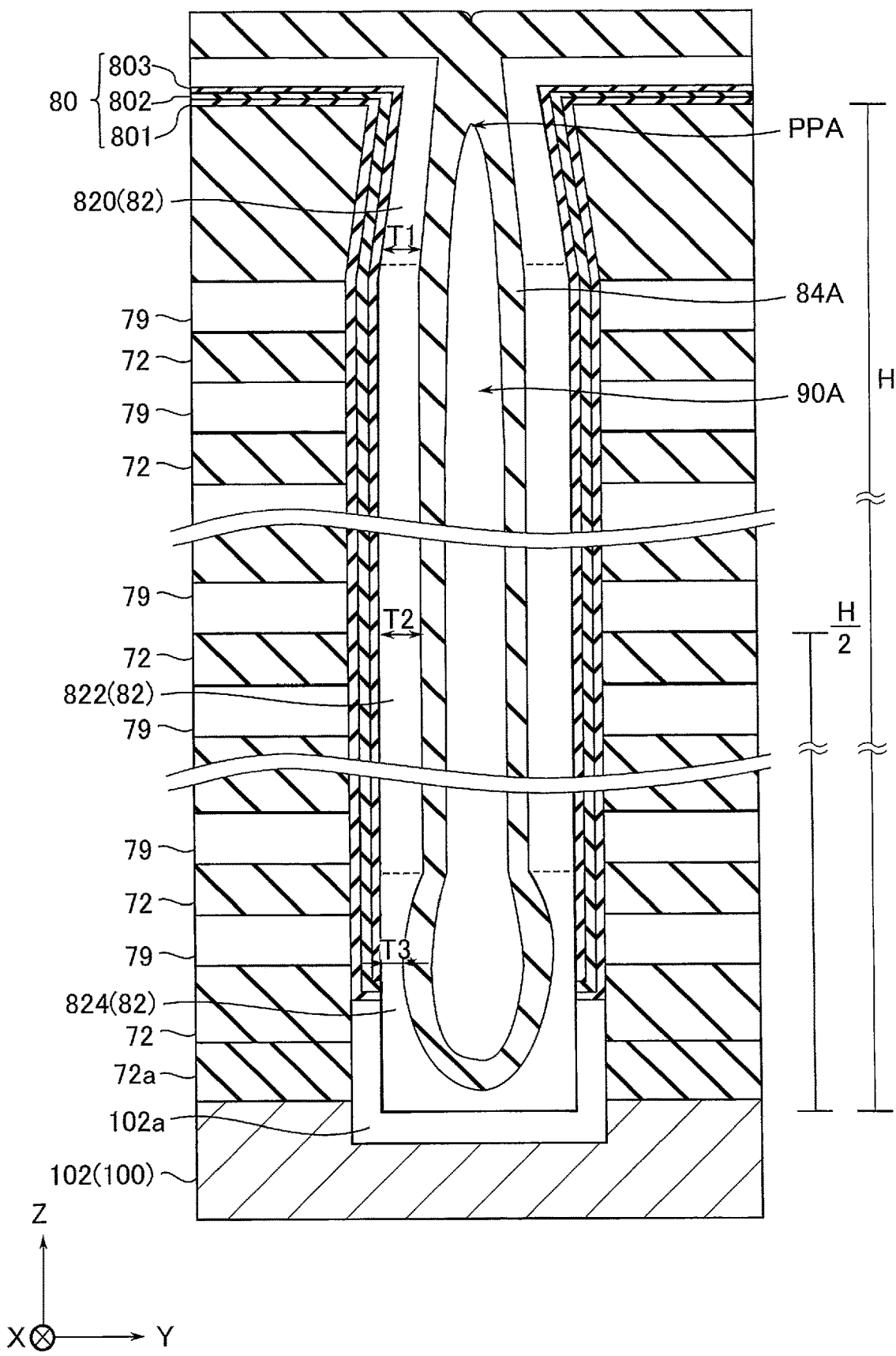
FIG. 33 is a cross-sectional process diagram showing a step of a method for manufacturing the memory device according to the fourth embodiment.

FIG. 33 explains a step that follows the step of FIG. 9 explained in the first embodiment (where the memory layer 80 and silicon layer 82 (82Z) are formed in the memory hole MH). In the following description, it is assumed that the upper portion of the memory hole MH is formed into a reverse tapered shape.

As illustrated in FIG. 33, slimming is executed upon the silicon layer 82. The slimming of the silicon layer 82 is executed by RIE, wet etching, gas etching or CDE. In this manner, the thickness of the silicon layer 82 can be reduced.

According to the present embodiment, the impurity concentration in the silicon layer 82 does not significantly vary in accordance with the height of the position in the memory hole MH. For this reason, after the slimming executed upon the silicon layer 82, the thickness T1 of the upper silicon layer 820 is approximately equal to the thickness T2 of the portion (middle silicon layer) 822 of the silicon layer 82 around the middle portion of the memory hole MH.

If the slimming of the silicon layer 82 is executed by wet etching (isotropic etching) in the same manner as in the first embodiment, the thickness T3 of the portion (lower silicon layer) 824 of the silicon layer 82 in the bottom portion of the memory hole MH may become smaller than the thickness T2 of the middle silicon layer 822.

Thereafter, a core layer 84A is formed on the silicon layer 82. In accordance with this, an air gap 90A is created in the memory pillar MP. As mentioned above, the upper portion of the memory hole MH is formed into a reverse tapered shape. The opening of the memory hole MH is therefore quickly closed by the core layer 84A before the memory hole MH is filled in with the core layer 84A, as a result of which the top end PPA of the air gap 90A may reach the upper portion of the memory hole MH.

As illustrated in FIG. 34, the etch-back processing (etching) is executed upon the core layer 84A (to form a core layer 84B). The etch-back processing of the core layer 84A is realized by CDE with high-anisotropy. As a result, the air gap 90A can extend through the core layer 84B while the expansion of the air gap 90A is suppressed so that the space above the memory hole MH can communicate with the air gap 90A.

Figure 35:
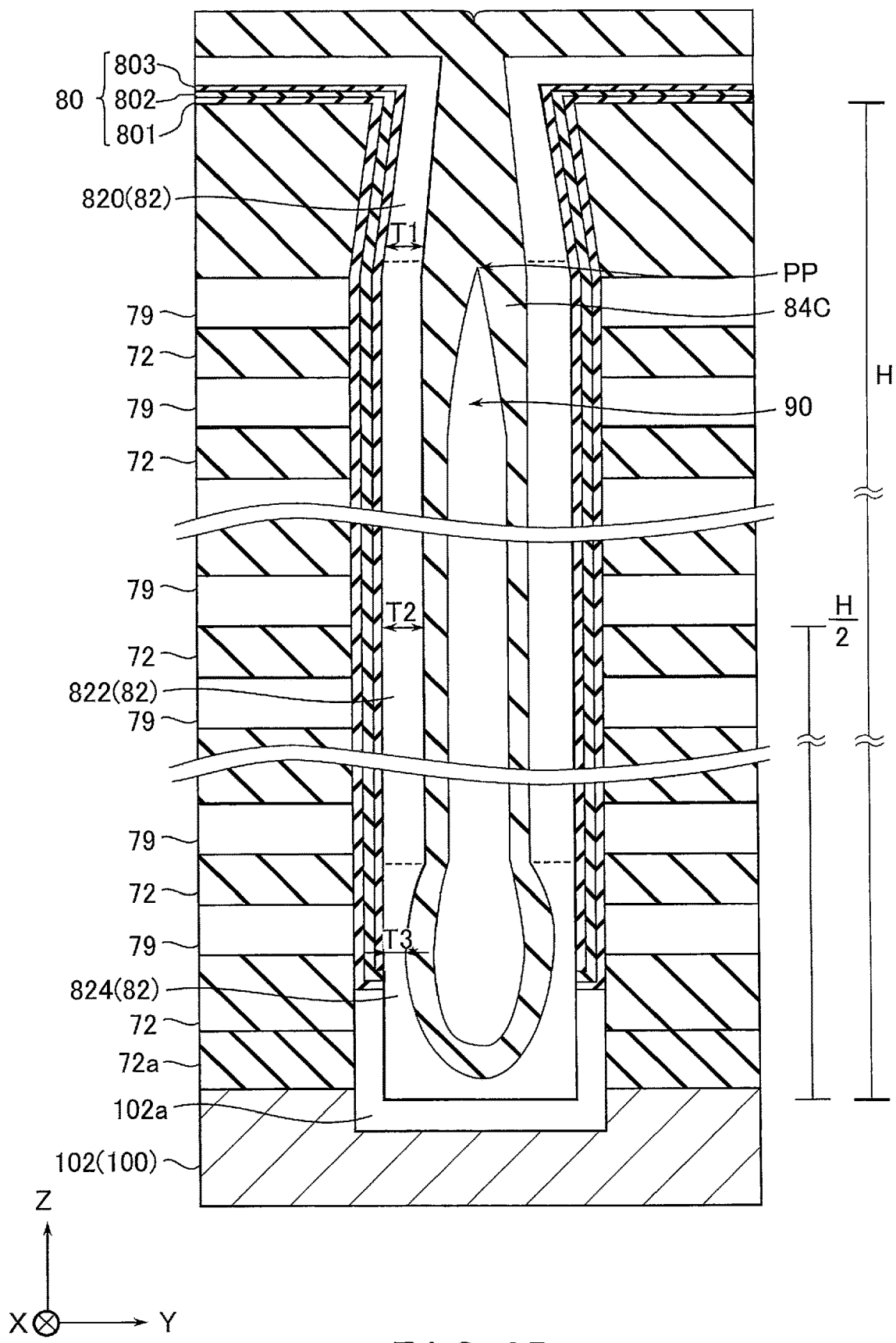
FIG. 35 is a cross-sectional process diagram showing a step of the method for manufacturing the memory device according to the fourth embodiment.

As illustrated in FIG. 35, the core layer 84B is filled back in (to form a core layer 84C on the silicon layer 82). In this manner, at least the upper portion of the memory hole MH can be closed by the core layer 84C. In the formation of the core layer 84C, an air gap 90 may be produced inside the memory pillar MP. However, the top end PP of the air gap 90 can be positioned toward the bottom portion of the memory pillar MP with respect to the lower portion of the upper silicon layer 820.

Thereafter, the etch-back processing of the core layer 84C and reform processing of the upper silicon layer 820 are cyclically executed in FIGS. 36 to 40. In particular, the first cycle of etch-back and reform processing is executed in FIGS. 36 and 37. The second cycle of etch-back and reform processing is executed in FIGS. 38 and 39. The third cycle of etch-back processing is executed in FIG. 40.

Figure 36:
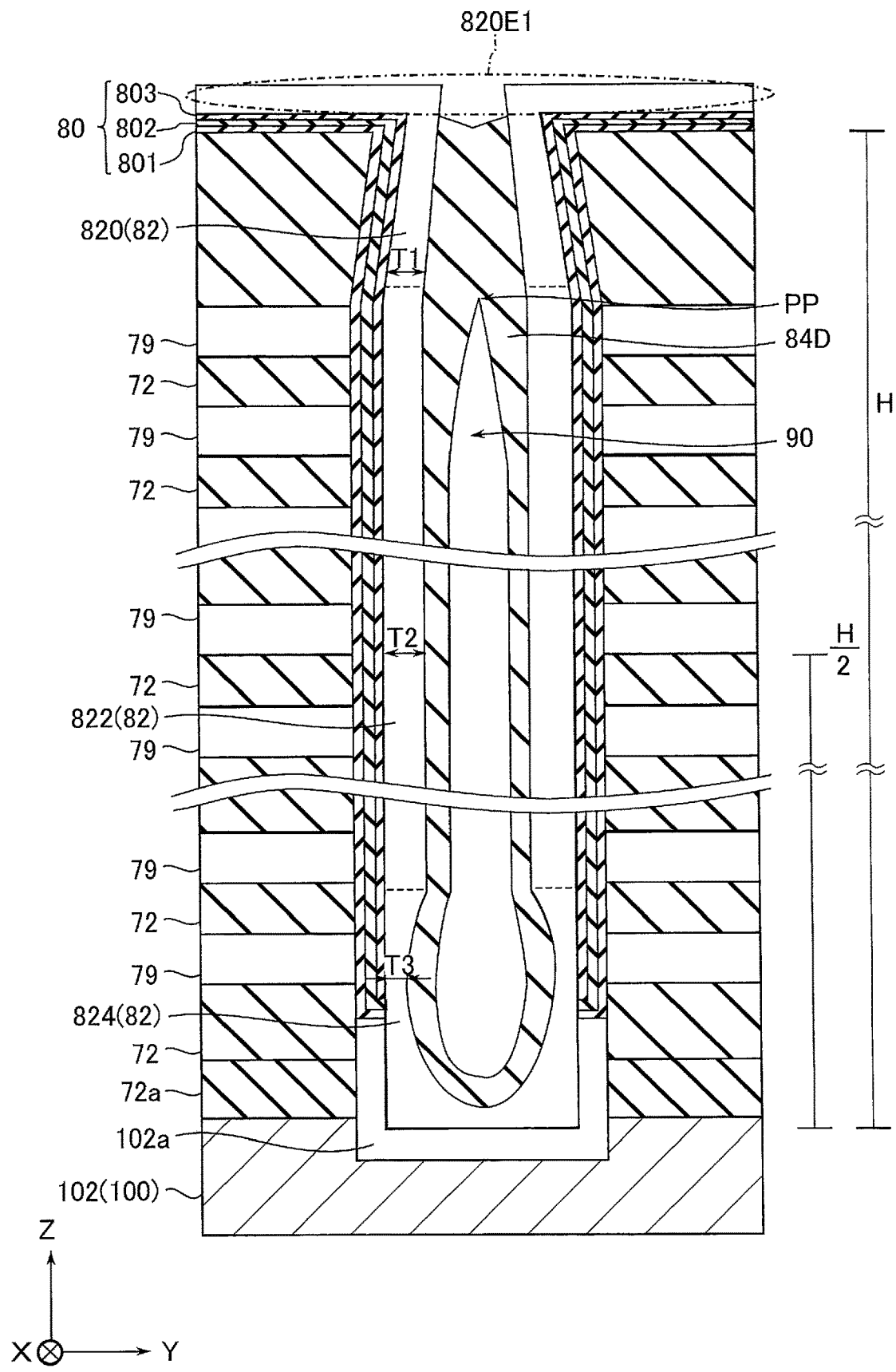
FIG. 36 is a cross-sectional process diagram showing a step of the method for manufacturing the memory device according to the fourth embodiment.

As illustrated in FIG. 36, the etch-back processing of the first cycle is executed upon the core layer 84C by the CDE to form a core layer 84D. With the CDE, the core layer 84C can be selectively etched with ammonia and hydrogen fluoride, for example, adopted as an etchant. In the etch-back processing of the first cycle, the core layer 84C is etched until the core layer is removed from the upper surface of the layer stack 50A. As a result, the portion 820E1 of the upper silicon layer 820 on the upper surface of the layer stack 50A and near the opening of the memory hole MH is exposed.

Figure 37:
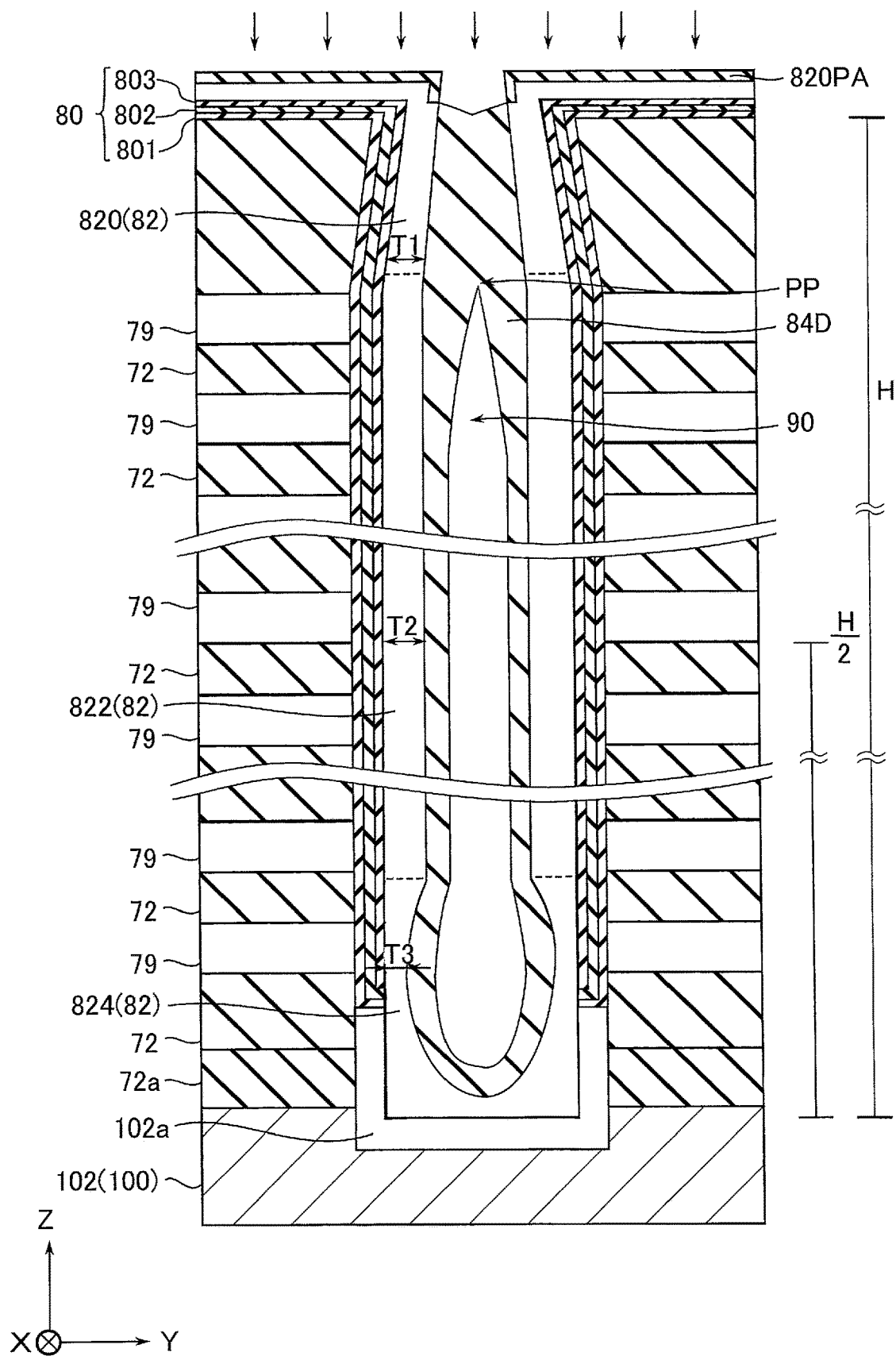
FIG. 37 is a cross-sectional process diagram showing a step of the method for manufacturing the memory device according to the fourth embodiment.

After the etch-back processing of the first cycle, the reform processing is executed upon the portion 820E1 of the upper silicon layer 820, which has been exposed by the etch-back processing of the first cycle, as illustrated in FIG. 37. Thus, with impurities added to the surface of the portion 820E1 of the upper silicon layer 820, a layer (reformed silicon layer 820PA) containing a substance that differs from that of the upper silicon layer 820 is formed. It is preferable that a substance be added to the reformed silicon layer 820PA so that the reformed silicon layer 820PA will demonstrate a high selectivity with respect to the core layer 84D (oxide) during the CDE etch-back processing (in other words, a substance that will make the reformed silicon layer 820PA difficult to be etched during the further CDE). In particular, the reformed silicon layer 820PA may contain nitrogen or carbon. If the surface of the upper silicon layer 820 is to be nitrided, the reform processing can be conducted in the same chamber as the one for CDE, by generating a nitrogen radical from the plasma source that is installed in the CDE chamber. Here, the reform processing is selectively conducted so that the surface of the core layer 84D is hardly nitrided while only the exposed surface of the upper silicon layer 820 is nitrided. For the reform processing (radical processing), conditions such as 500° C., 5 Torr, and 1500 W are adopted. In the example of FIG. 37, the reformed silicon layer 820PA is shown as an insulator (e.g., silicon nitride), but is not limited thereto. The reformed silicon layer 820PA can be a semiconductor or a conductor as long as it exhibits a high selectivity with respect to the core layer 84D.

The reformed silicon layer 820PA may contain oxygen. If this is the case, the reformed silicon layer 820PA may be etched together with the core layer 84D by further CDE, which will be described later. Even so, with the etched reformed silicon layer 820PA remaining as a by-product solid layer, the upper silicon layer 820 can be protected from direct exposure to the etchant. Thus, etching of oxides (e.g., the memory layer 80 and insulating layer 75) positioned inside the layer stack 50A with respect to the silicon layer 82 by the etchant entering minute defects (pinholes) in the thin upper silicon layer 820 can be suppressed.

Figure 38:
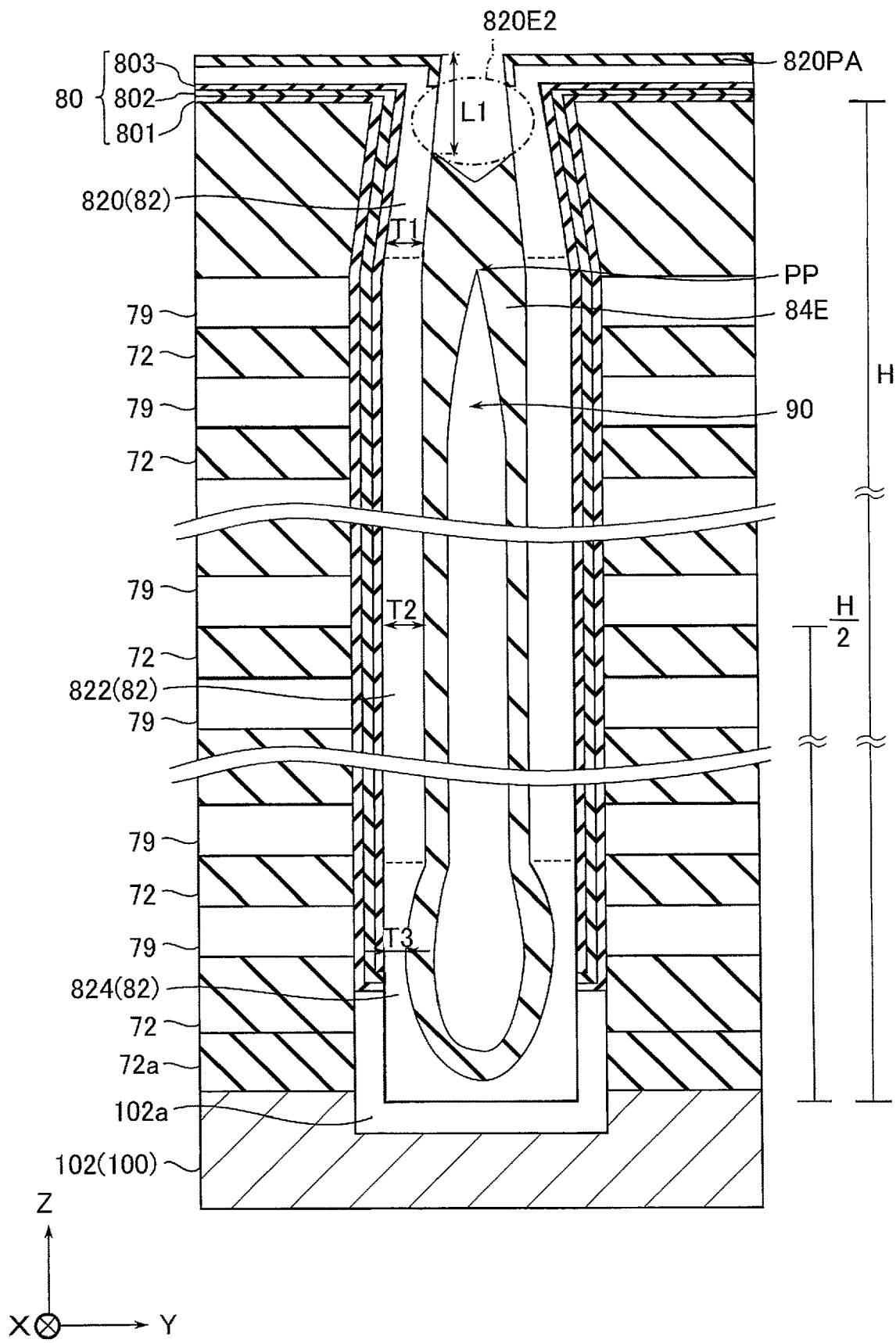
FIG. 38 is a cross-sectional process diagram showing a step of the method for manufacturing the memory device according to the fourth embodiment.

After the reform processing of the first cycle, the etch-back processing of the second cycle is executed upon the core layer 84D again by CDE to form the core layer 84E, as illustrated in FIG. 38. In the etch-back processing of the second cycle, the core layer 84D may be etched down to the middle of the upper portion of the memory pillar MP. As a result, of the inner side surface of the upper silicon layer 820, a portion (at least below the portion 820E1) 820E2 having a depth L1 from the top end of the memory pillar MP is further exposed.

Figure 39:
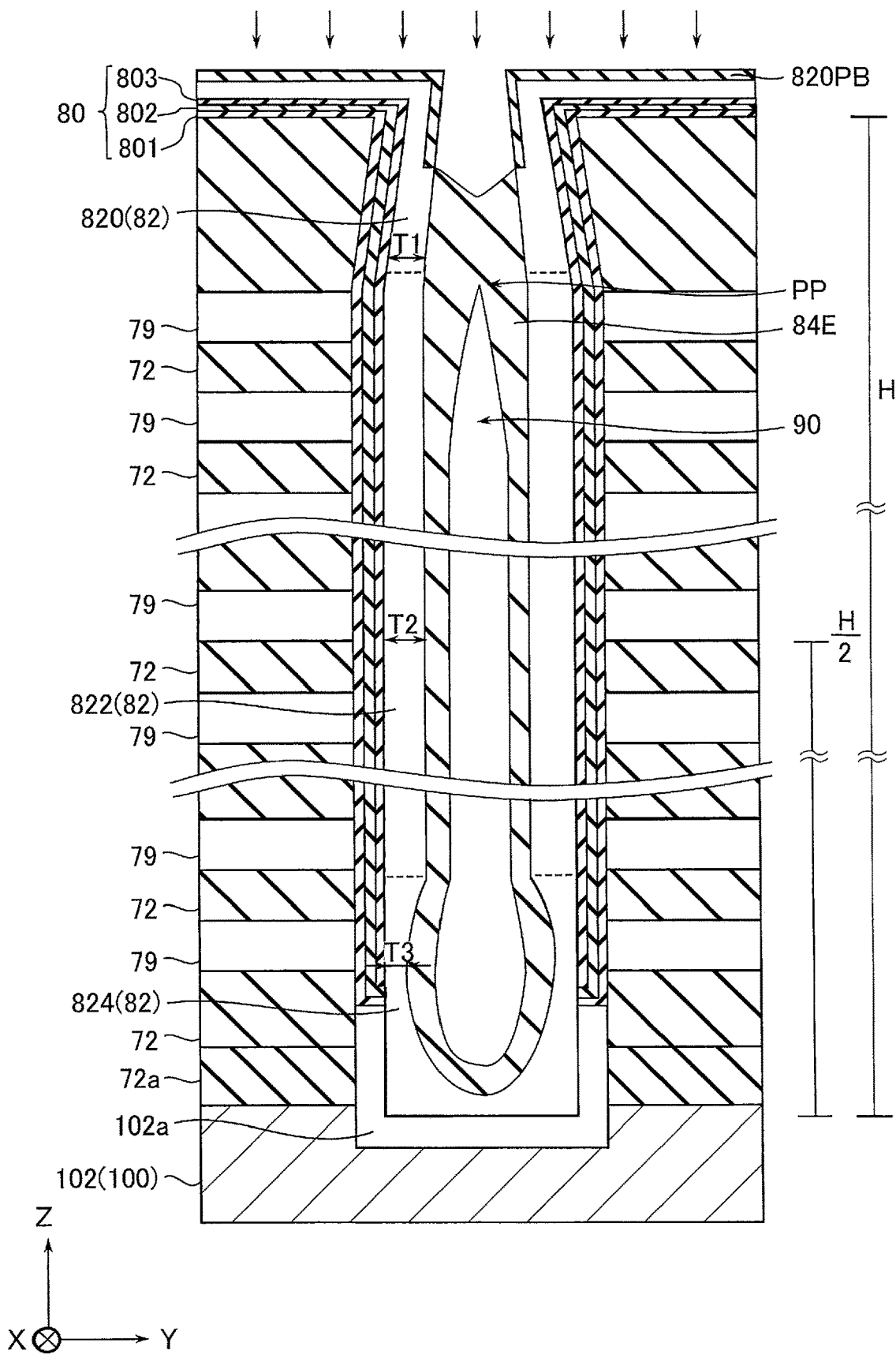
FIG. 39 is a cross-sectional process diagram showing a step of the method for manufacturing the memory device according to the fourth embodiment.

After the etch-back processing of the second cycle, the reform processing is executed upon the portion 820E2, which has been exposed by the etch-back processing of the second cycle, as illustrated in FIG. 39. This forms the surface of the portions 820E1 and 820E2 of the upper silicon layer 820 into a reformed silicon layer 820PB.

After the reform processing of the second cycle, the etch-back processing of the third cycle is executed upon the core layer 84E again by CDE to form the core layer 84, as illustrated in FIG. 40. In the etch-back processing of the third cycle, the core layer 84E may be etched toward the bottom of the upper portion of the memory pillar MP. As a result, of the inner side surface of the upper silicon layer 820, the portion (at least below the portion 820E2) 820E3 having a depth L3 from the top end of the memory pillar MP is further exposed.

After the etch-back processing of the third cycle, the cap layer (amorphous silicon layer) 86A is formed above the core layer 84, as illustrated in FIG. 41.

Figure 42:
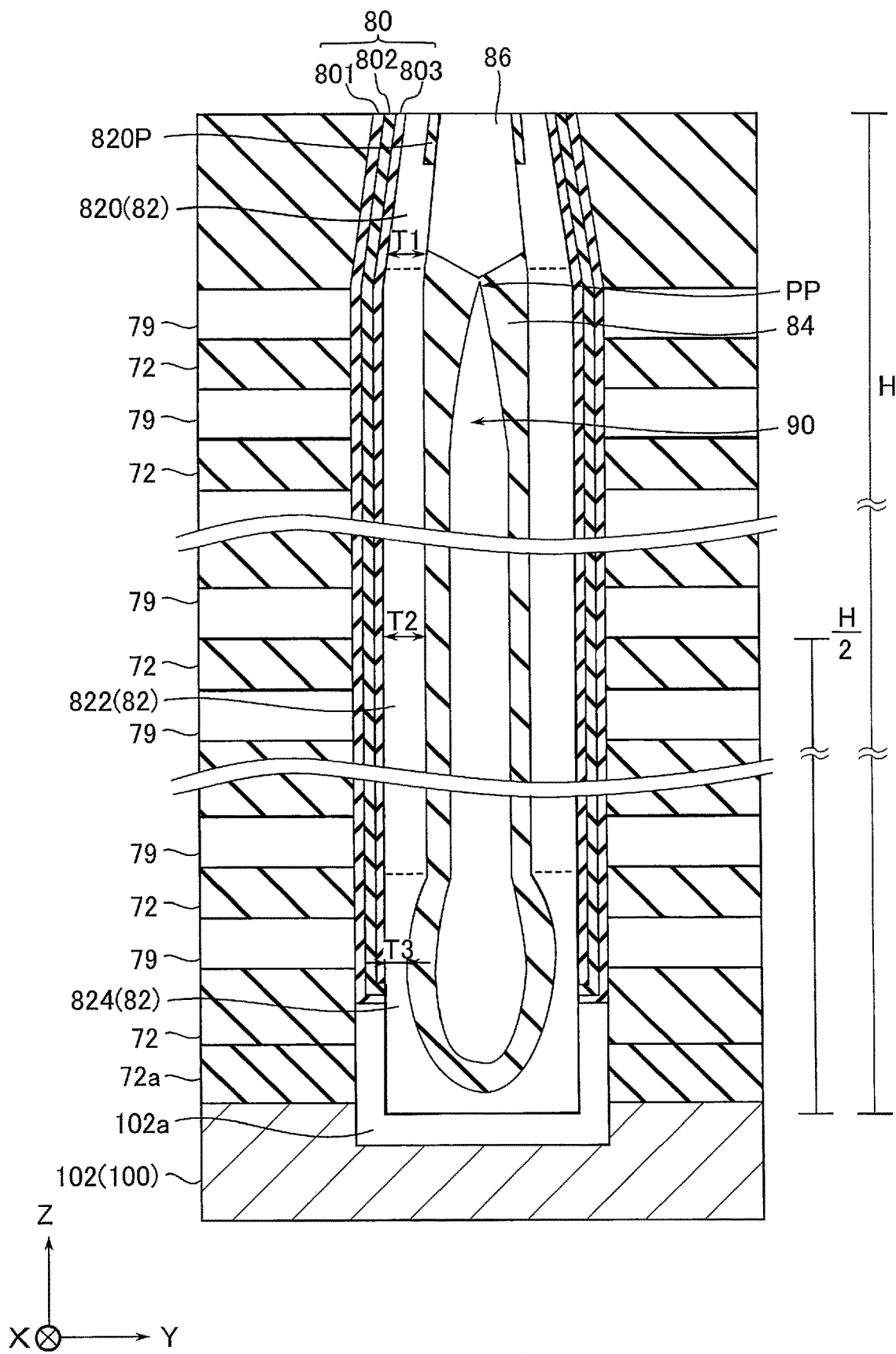
FIG. 42 is a cross-sectional process diagram showing a step of the method for manufacturing the memory device according to the fourth embodiment.
Figure 43:
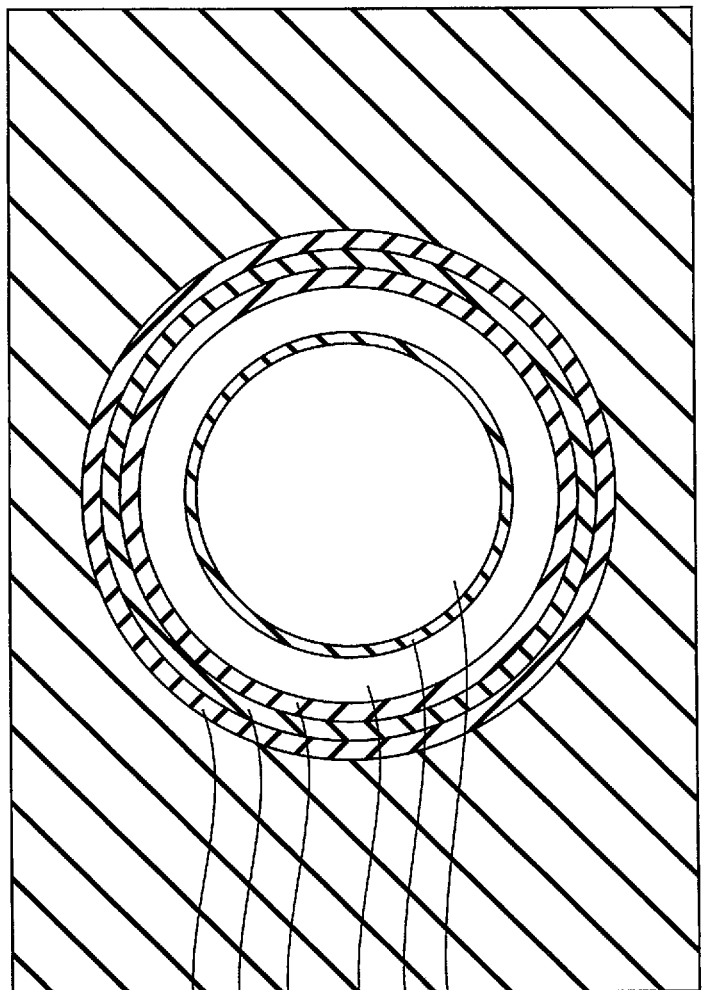
FIG. 43 is a cross-sectional process diagram showing a step of the method for manufacturing the memory device according to the fourth embodiment.

After the cap layer 86A is formed, portions of the memory layer 80, silicon layer 82, reformed silicon layer 820PB, and cap layer 86 that are formed on the top surface of the layer stack 50A are removed, as illustrated in FIG. 42. The plan view of the top end of the memory pillar MP after the removal of the layers 80, 82, 820PB and 86A from the top surface of the layer stack 50A is illustrated in FIG. 43. As illustrated in FIG. 43, the reformed silicon layer 820P is formed into a cylindrical or annular shape between the inner surface of the upper silicon layer 820 and the outer surface of the cap layer 86.

After the replacement of the sacrificial layers 79 with the conductive layers 70, contacts are suitably formed.

With the above manufacturing method, the NAND flash memory according to the present embodiment is completed.

In the above example, the etch-back processing of the core layer 84 and the reform processing of the upper silicon layer 820 are cyclically executed, which is not a limitation. For instance, if the upper silicon layer 820 is sufficiently protected through the first reform processing to suppress any defects in the layer stack 50A, the reform processing does not need to be executed multiple times. If this is the case, after the first reform processing, the etch-back processing of the core layer 84 is executed one or more times.

(c) Summary

As described above, for the NAND flash memory 1 according to the present embodiment, the etch-back processing of the core layer 84 and the reform processing of the upper silicon layer 820 are cyclically executed.

As a result, according to the present embodiment, during the etch-back processing of the core layer 84, the top and inner side surfaces of the upper silicon layer 820 are reformed into a nitride or the like that demonstrates a high selectivity with respect to the core layer 84.

Thus, the NAND flash memory and manufacturing method thereof according to the present embodiment can suppress defects in the layer stack 50A at the time of etching the core layer 84.

The memory device according to the fourth embodiment and the manufacturing method therefore can improve the yield of the memory device.

(d) Modification Examples

A modification example of the memory device according to the fourth embodiment will be explained with reference to FIG. 44.

Figure 44:
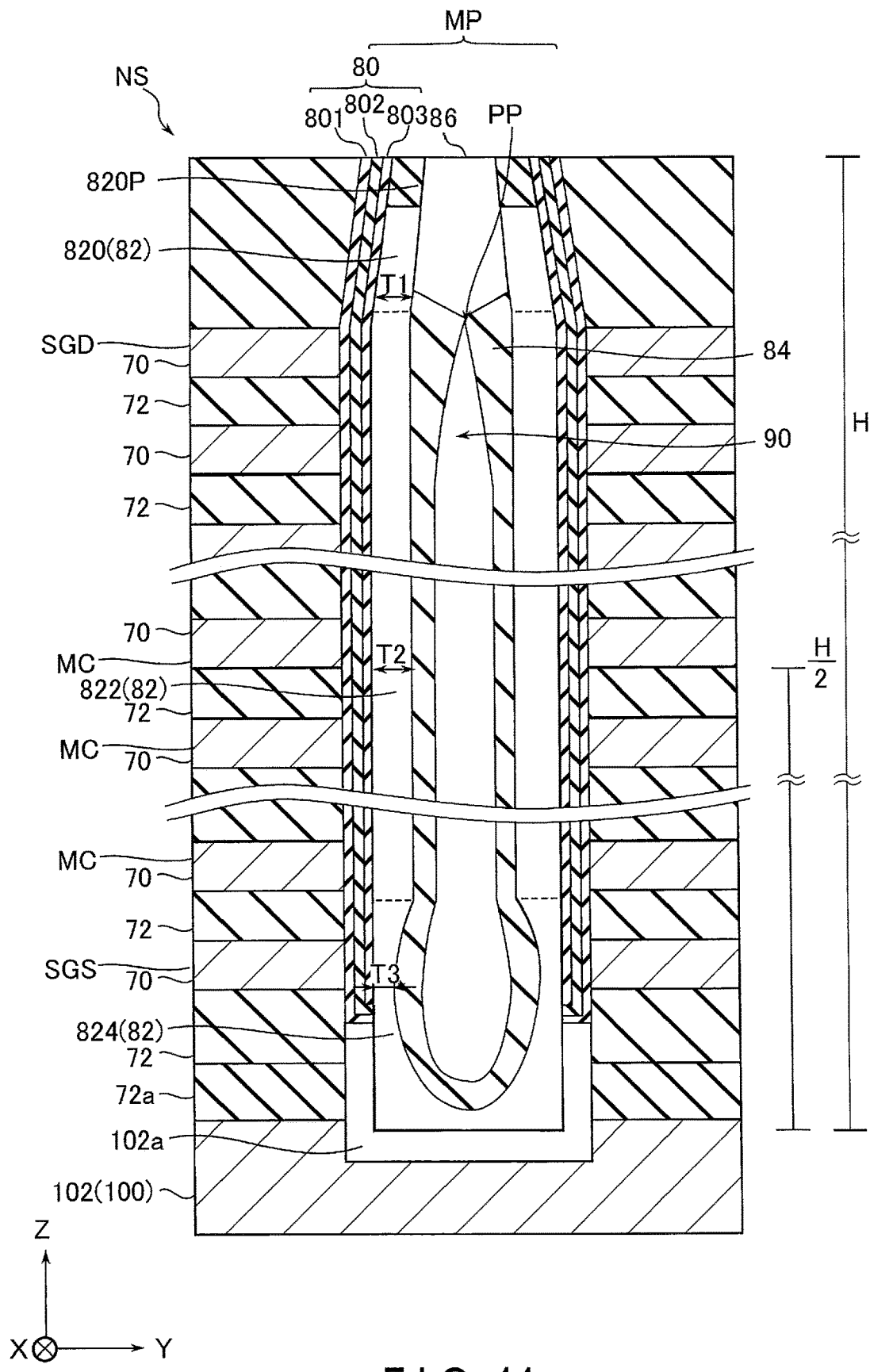
FIG. 44 is a cross-sectional view of a memory device according to a modification example of the fourth embodiment.

FIG. 44 is a cross-sectional view of a NAND flash memory according to a modification example of the fourth embodiment.

As illustrated in FIG. 44, the upper silicon layer 820 may be reformed entirely in the thickness direction. That is, the reformed silicon layer 820P may be formed on the surface of the memory pillar MP to have an inner surface in contact with the cap layer 86 and an outer surface in contact with the memory layer 80 (insulating layer 803).

In the NAND flash memory according to this modification, the reformed silicon layer 820P has a lower end in contact with the upper silicon layer 820, in the same manner as in the NAND flash memory according to the fourth embodiment.

The memory device according to this modification example can attain effects similar to those of the fourth embodiment.

(6) Other Modification Examples

In the memory device and method for manufacturing such a device according to the embodiments, the structure and shape of word lines, structure and shape of bit lines, structure and shape of source lines, structure and shape of select gate lines, and layout of the memory holes and memory pillars are not limited to the above examples, as long as the memory device is formed to have silicon layers along the inner wall (side surface of the layer stack) of the memory hole of the layer stack.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A memory device comprising:
a substrate;
a structure including a plurality of conductive layers stacked on the substrate; and
a pillar arranged inside the structure and including a core layer and a semiconductor layer that is arranged outside the core layer and extends in a direction perpendicular to a surface of the substrate,
wherein the semiconductor layer includes a first portion on a side of an upper portion of the structure, and a second portion between the first portion and the substrate,
the first portion of the semiconductor layer has a thickness larger than a thickness of the second portion of the semiconductor layer, and
an inner wall of the first portion protrudes further inward than an inner wall of the second portion.

2. The memory device according to claim 1, wherein
the semiconductor layer includes a third portion between the second portion of the semiconductor layer and the substrate, and
the third portion of the semiconductor layer has a thickness smaller than a thickness of the second portion of the semiconductor layer.

3. The memory device according to claim 2, wherein
the first portion of the semiconductor layer includes at least one selected from boron (B), carbon (C), germanium (Ge), argon (Ar), xenon (Xe), fluorine (F), and BF2.

4. The memory device according to claim 2, wherein
the first portion of the semiconductor layer has a grain size smaller than a grain size of the second portion of the semiconductor layer.

5. The memory device according to claim 1, wherein
the first portion of the semiconductor layer has an impurity concentration higher than an impurity concentration of the second portion of the semiconductor layer.

6. The memory device according to claim 1, wherein
the first portion of the semiconductor layer is an amorphous layer or a microcrystalline layer, and the second portion of the semiconductor layer is a polycrystalline layer.

7. The memory device according to claim 1, wherein
the first portion of the semiconductor layer and the second portion of the semiconductor layer are polycrystalline layers.

8. The memory device according to claim 7, wherein
the first portion of the semiconductor layer includes at least one selected from boron (B), phosphorus (P), argon (Ar), and BF2.

9. The memory device according to claim 7, wherein
the first portion of the semiconductor layer has a grain size larger than a grain size of the second portion.

10. The memory device according to claim 1, wherein
the pillar includes an air gap arranged inside the core layer, and
a top end of the air gap with respect to the direction perpendicular to the surface of the substrate is positioned on a side of the substrate with respect to the first portion of the semiconductor layer.

11. A memory device, comprising:
a substrate;
a structure including a plurality of conductive layers stacked on the substrate; and
a pillar arranged inside the structure, the pillar including:
a core layer;
a semiconductor layer extending in a direction perpendicular to a surface of the substrate and including a first portion on a side of an upper portion of the structure, and a second portion in contact with an outer surface of the core layer between the first portion of the semiconductor layer and the substrate; and
a reformed layer having a lower end in contact with the first portion of the semiconductor layer.

12. The memory device according to claim 11, wherein
the reformed layer includes at least one selected from a nitride, oxide, and carbide of silicon.

13. The memory device according to claim 11, wherein
the first portion of the semiconductor layer includes a third portion below the reformed layer and a fourth portion above the third portion of the semiconductor layer, and
the reformed layer includes an inner side surface in contact with the fourth portion of the semiconductor layer.

14. The memory device according to claim 11, wherein
the reformed layer includes an outer side surface in contact with the first portion of the semiconductor layer.

15. The memory device according to claim 11, wherein
the pillar further includes a memory layer extending in the direction perpendicular to the surface of the substrate, and
the reformed layer includes an outer side surface in contact with the memory layer.

16. The memory device according to claim 11, wherein
the reformed layer has a cylindrical or annular shape.

17. The memory device according to claim 11, wherein
the pillar at an upper end of the first portion of the semiconductor layer has a diameter smaller than a diameter of the pillar at a lower end of the first portion of the semiconductor layer.

18. The memory device according to claim 11, wherein the first portion of the semiconductor layer has a reverse tapered shape.

19. The memory device according to claim 11, wherein the pillar includes an air gap arranged inside the core layer, and
a top end of the air gap in the direction perpendicular to the surface of the substrate is positioned on a side of the substrate with respect to the first portion of the semiconductor layer.

* * * * *